United States Patent
Jinbo et al.

(10) Patent No.: US 10,228,807 B2
(45) Date of Patent: *Mar. 12, 2019

(54) FUNCTIONAL PANEL, LIGHT-EMITTING PANEL, DISPLAY PANEL, AND SENSOR PANEL

(71) Applicant: Semiconductor Energy Laboratory Co., Ltd., Atsugi-shi, Kanagawa-ken (JP)

(72) Inventors: Yasuhiro Jinbo, Isehara (JP); Kenichi Okazaki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/698,901

(22) Filed: Sep. 8, 2017

(65) Prior Publication Data

US 2018/0011569 A1   Jan. 11, 2018

Related U.S. Application Data

(63) Continuation of application No. 14/978,357, filed on Dec. 22, 2015, now Pat. No. 9,766,763.

(30) Foreign Application Priority Data

Dec. 26, 2014   (JP) .................................. 2014-265107

(51) Int. Cl.
*G06F 3/044*   (2006.01)
*H01L 27/32*   (2006.01)
(Continued)

(52) U.S. Cl.
CPC .............. *G06F 3/044* (2013.01); *G06F 3/012* (2013.01); *G06F 3/013* (2013.01);
(Continued)

(58) Field of Classification Search
CPC . H01L 24/16; H01L 21/4846; H01L 25/0657; H01L 24/81; H01L 23/291
(Continued)

(56) References Cited

U.S. PATENT DOCUMENTS

| | | |
|---|---|---|
| 6,528,824 B2 | 3/2003 | Yamagata et al. |
| 6,596,571 B2 | 7/2003 | Arao et al. |

(Continued)

FOREIGN PATENT DOCUMENTS

| | | |
|---|---|---|
| CN | 001311522 A | 9/2001 |
| CN | 001395323 A | 2/2003 |

(Continued)

OTHER PUBLICATIONS

Jablansky.A et al., "Selective Atomic Layer Deposition of TiO2 on Silicon/Copper-patterned Substrates", Journal of Undergraduate Research, 2012, vol. 5, No. 1, pp. 1-4.

(Continued)

*Primary Examiner* — Anthony Ho
(74) *Attorney, Agent, or Firm* — Robinson Intellectual Property Law Office; Eric J. Robinson

(57) ABSTRACT

A functional panel is provided. The functional panel includes a first substrate, a second substrate, a bonding layer, a functional element, a protective layer, and a terminal. The bonding layer is positioned between the first and second substrates. The functional element is surrounded by the first substrate, the second substrate, and the bonding layer. The terminal is electrically connected to the functional element and provided not to overlap with one of the first and second substrates. The protective layer is provided to be in contact with side surfaces of the first and second substrates and an exposed surface of the bonding layer. A surface of the terminal is partly exposed without being covered with the protective layer. The surface of the terminal partly includes (Continued)

a material having a lower ionization tendency than hydrogen.

22 Claims, 23 Drawing Sheets

(51) Int. Cl.
| | |
|---|---|
| H01L 51/52 | (2006.01) |
| H01L 31/0203 | (2014.01) |
| H01L 31/02 | (2006.01) |
| H01L 31/042 | (2014.01) |
| G06F 3/01 | (2006.01) |
| H01L 51/00 | (2006.01) |

(52) U.S. Cl.
CPC ...... *H01L 27/3251* (2013.01); *H01L 27/3276* (2013.01); *H01L 31/0203* (2013.01); *H01L 31/02005* (2013.01); *H01L 31/042* (2013.01); *H01L 51/0096* (2013.01); *H01L 51/5203* (2013.01); *H01L 51/524* (2013.01); *H01L 51/5253* (2013.01); *G06F 2203/04112* (2013.01); *H01L 27/323* (2013.01); *H01L 2251/301* (2013.01); *H01L 2251/303* (2013.01); *H01L 2251/5338* (2013.01); *H01L 2924/0002* (2013.01); *Y02E 10/549* (2013.01)

(58) Field of Classification Search
USPC ....................................................... 257/777
See application file for complete search history.

(56) References Cited

U.S. PATENT DOCUMENTS

| | | | |
|---|---|---|---|
| 6,707,614 | B2 | 3/2004 | Tanaka |
| 6,770,518 | B2 | 8/2004 | Yamazaki et al. |
| 6,822,629 | B2 | 11/2004 | Yamazaki et al. |
| 6,955,956 | B2 | 10/2005 | Tanaka et al. |
| 7,151,016 | B2 | 12/2006 | Kajiwara et al. |
| 7,169,710 | B2 | 1/2007 | Yamazaki et al. |
| 7,633,471 | B2 | 12/2009 | Yamazaki et al. |
| 7,638,378 | B2 | 12/2009 | Miyairi et al. |
| 8,911,653 | B2 | 12/2014 | Yamazaki et al. |
| 9,766,763 | B2 * | 9/2017 | Jinbo ............... G06F 3/044 |
| 2001/0017372 | A1 | 8/2001 | Koyama |
| 2001/0052752 | A1 | 12/2001 | Ghosh et al. |
| 2002/0024096 | A1 | 2/2002 | Yamazaki et al. |
| 2002/0030440 | A1 | 3/2002 | Yamazaki |
| 2003/0027369 | A1 | 2/2003 | Yamazaki |
| 2007/0170854 | A1 | 7/2007 | Kwak |
| 2007/0275181 | A1 | 11/2007 | Carcia et al. |
| 2008/0182101 | A1 | 7/2008 | Carcia et al. |
| 2009/0178831 | A1 | 7/2009 | Yokota et al. |
| 2010/0293782 | A1 | 11/2010 | Yamazaki et al. |
| 2012/0286262 | A1 | 11/2012 | Koyama et al. |
| 2012/0287027 | A1 | 11/2012 | Koyama |
| 2013/0127335 | A1 | 5/2013 | Chang et al. |
| 2014/0152921 | A1 | 6/2014 | Yashiro et al. |
| 2014/0321074 | A1 | 10/2014 | Chida et al. |
| 2015/0050421 | A1 | 2/2015 | Jang et al. |
| 2015/0325812 | A1 | 11/2015 | Yamazaki et al. |
| 2016/0155984 | A1 | 6/2016 | Yamazaki et al. |

FOREIGN PATENT DOCUMENTS

| | | |
|---|---|---|
| EP | 1130566 A | 9/2001 |
| JP | 04-220622 A | 8/1992 |
| JP | 2001-318624 A | 11/2001 |
| JP | 2002-093576 A | 3/2002 |
| JP | 2002-151253 A | 5/2002 |
| JP | 2003-086359 A | 3/2003 |
| JP | 2013-029568 A | 2/2013 |
| JP | 2014-151571 A | 8/2014 |
| JP | 2014-197522 A | 10/2014 |
| JP | 2014-225011 A | 12/2014 |
| KR | 2001-0085718 A | 9/2001 |
| KR | 2003-0004128 A | 1/2003 |
| TW | 507258 | 10/2002 |
| TW | 546857 | 8/2003 |
| TW | 201311070 | 3/2013 |
| TW | 201314528 | 4/2013 |
| TW | 201447542 | 12/2014 |
| WO | WO-2006/014591 | 2/2006 |
| WO | WO-2013/015141 | 1/2013 |
| WO | WO-2013/018591 | 2/2013 |
| WO | WO-2014/175296 | 10/2014 |

OTHER PUBLICATIONS

Romm.D et al., "Evaluation of Nickel/Palladium/Gold-Finished Surface-Mount Integrated Circuits", Texas Instruments Application Report, 2001, pp. 1-24.

International Search Report (Application No. PCT/IB2015/058831) dated Mar. 8, 2016.

Written Opinion (Application No. PCT/IB2015/058831) dated Mar. 8, 2016.

* cited by examiner

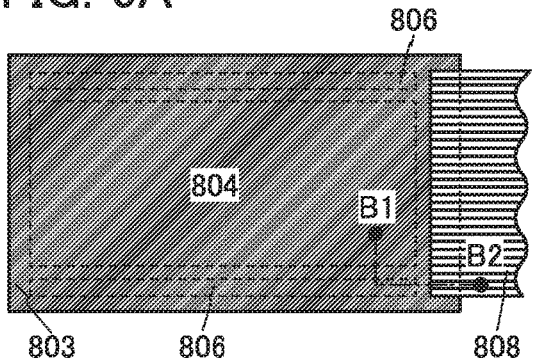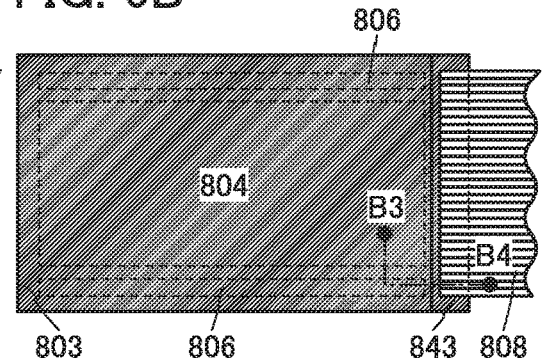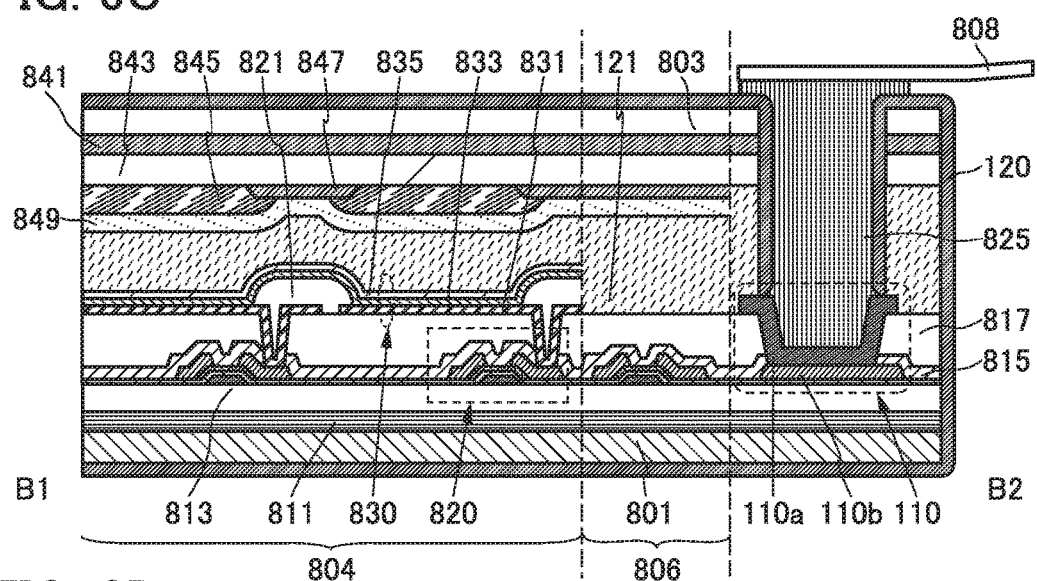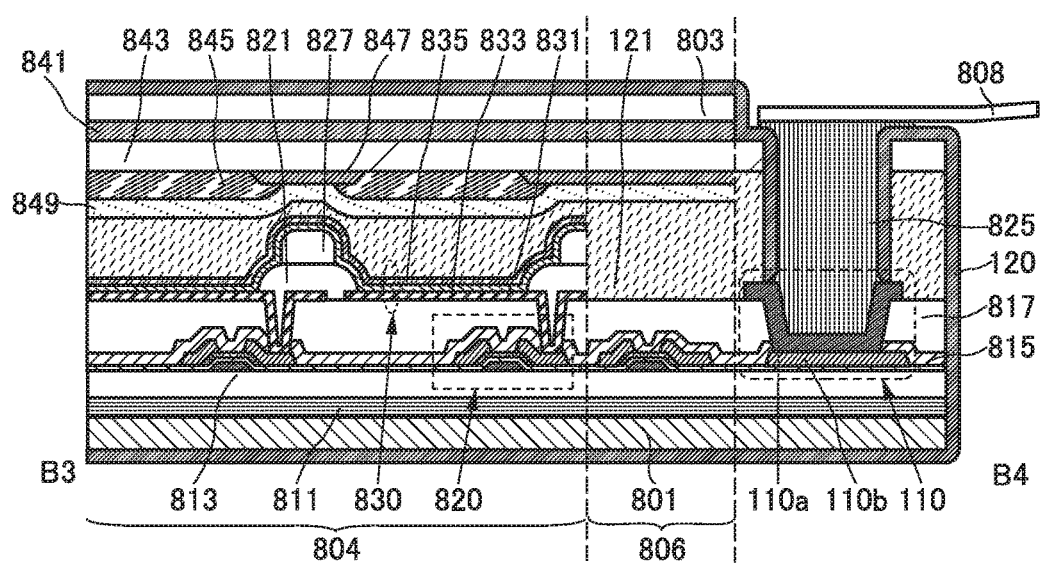

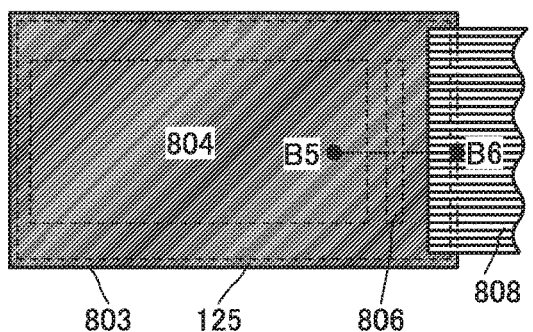
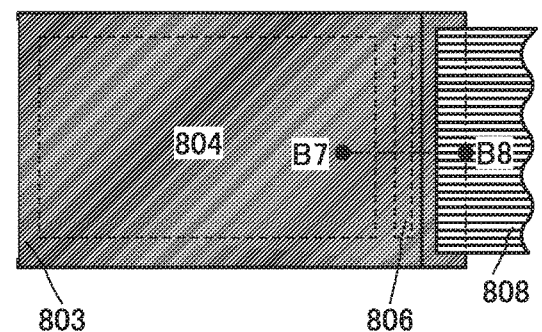
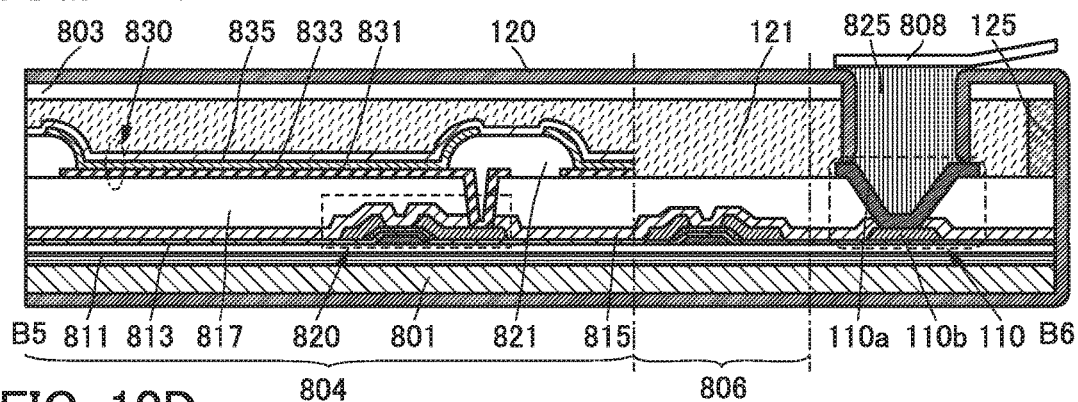
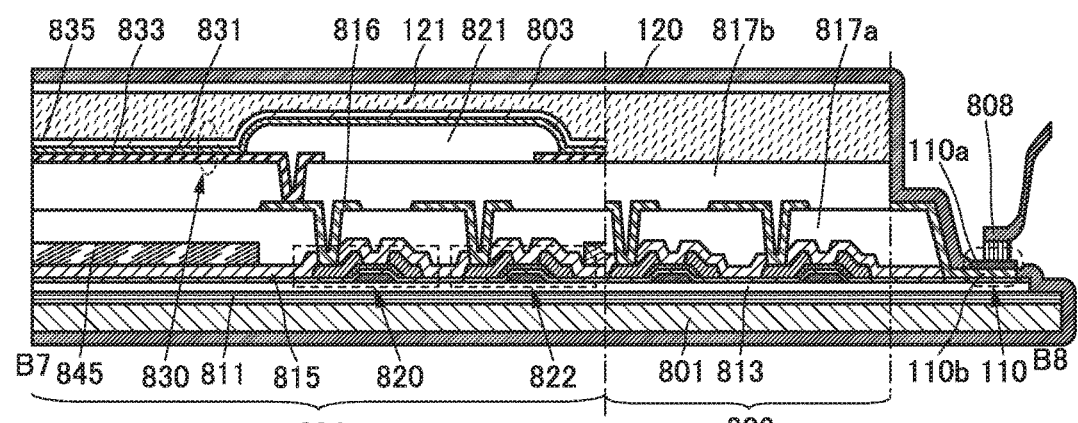
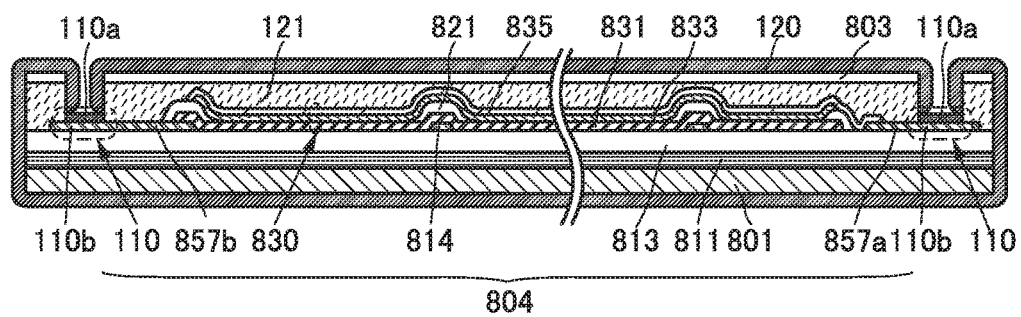

FIG. 20A
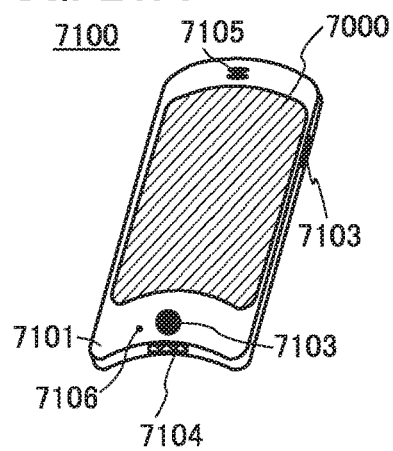
FIG. 20B
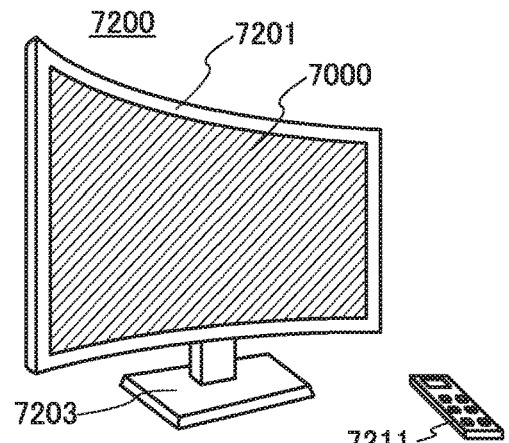
FIG. 20C1
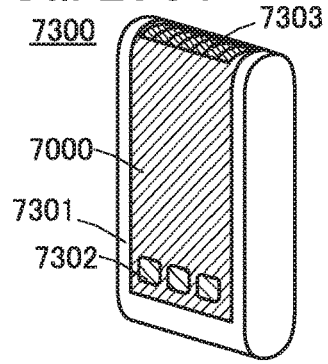
FIG. 20D
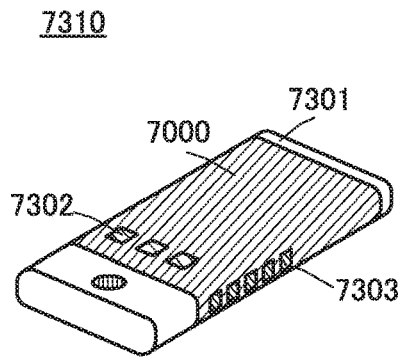
FIG. 20E
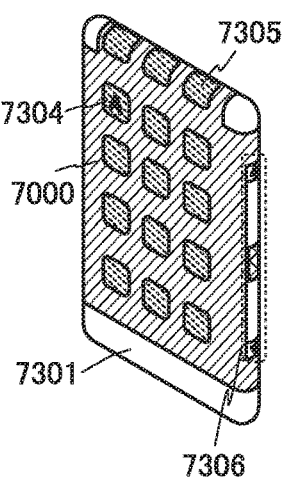
FIG. 20C2
FIG. 20F
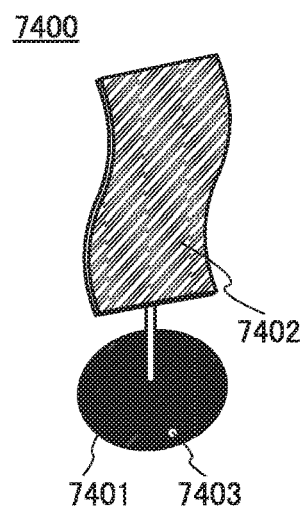
FIG. 20G
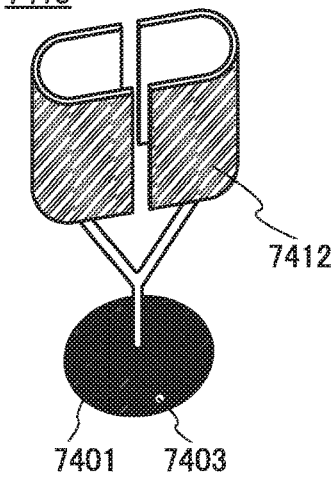
FIG. 20H
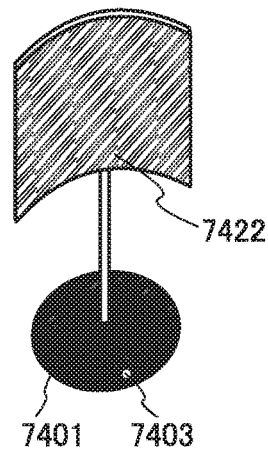

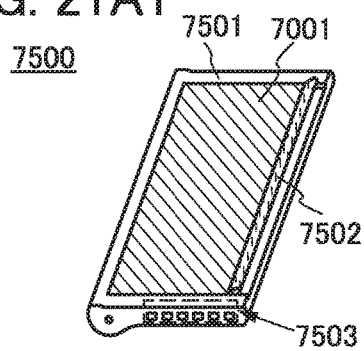
FIG. 21A1
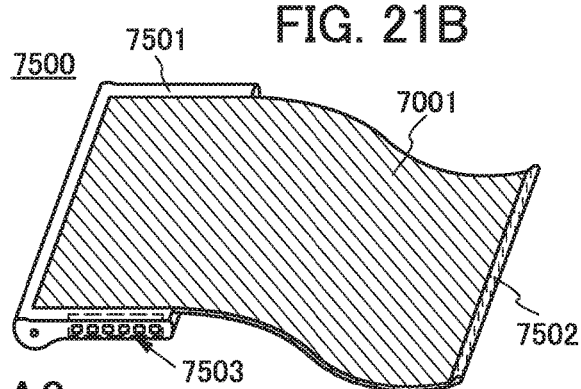
FIG. 21B
FIG. 21A2
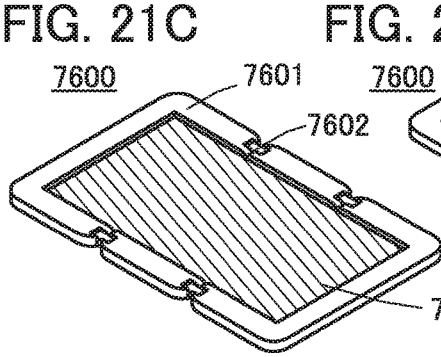
FIG. 21C
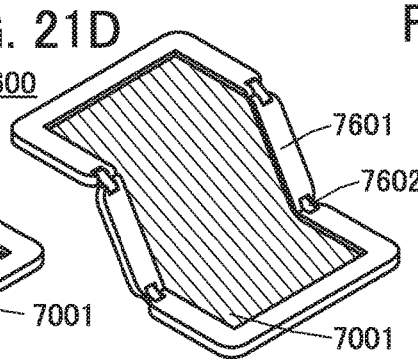
FIG. 21D
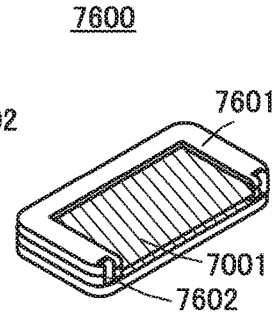
FIG. 21E
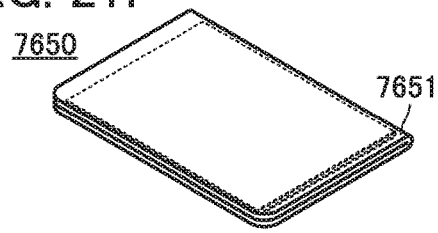
FIG. 21F
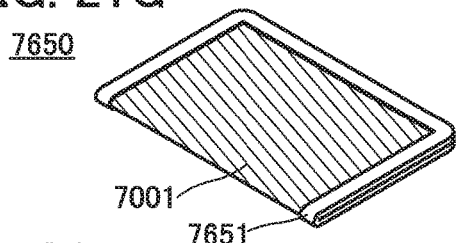
FIG. 21G
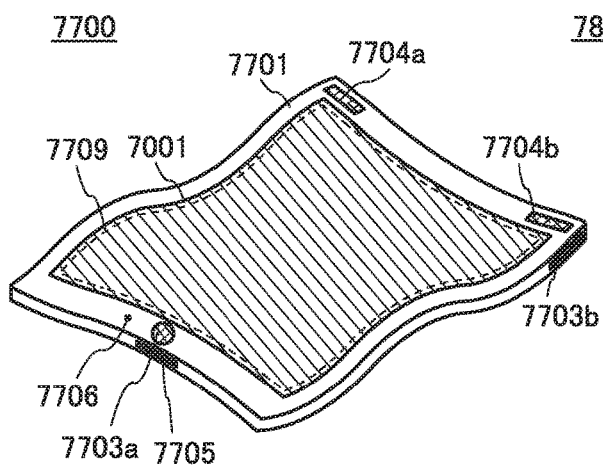
FIG. 21H
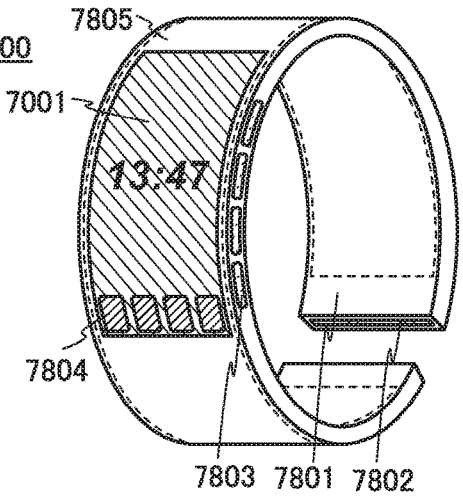
FIG. 21I

FUNCTIONAL PANEL, LIGHT-EMITTING PANEL, DISPLAY PANEL, AND SENSOR PANEL

BACKGROUND OF THE INVENTION

1. Field of the Invention

One embodiment of the present invention relates to a functional panel including a functional element having a variety of functions. In particular, one embodiment of the present invention relates to a light-emitting panel, a display panel, and a sensor panel.

Note that one embodiment of the present invention is not limited to the above technical field. Examples of the technical field of one embodiment of the present invention include a semiconductor device, a display device, a light-emitting device, a power storage device, a storage device, an electronic device, a lighting device, an input device, an input/output device, a driving method thereof, and a manufacturing method thereof.

In this specification and the like, a semiconductor device means all types of devices that can function by utilizing semiconductor characteristics; a transistor, a semiconductor circuit, an arithmetic unit, a memory device, an imaging device, an electro-optical device, a power generation device (e.g., a thin film solar cell and an organic thin film solar cell), an electronic device, and the like are each an embodiment of the semiconductor device.

2. Description of the Related Art

A display device in which a liquid crystal element is used is known. In addition, examples of the display device include a light-emitting device including a light-emitting element such as an organic electroluminescent (EL) element or a light-emitting diode (LED), and an electronic paper performing display by an electrophoretic method or the like.

For example, in a basic structure of an organic EL element, a layer containing a light-emitting organic compound is provided between a pair of electrodes. By voltage application to this element, the light-emitting organic compound can emit light. A display device including such an organic EL element can be thin and lightweight and have high contrast and low power consumption.

Patent Document 1 discloses a flexible light-emitting device in which an organic EL element is used.

Patent Document

[Patent Document 1] Japanese Published Patent Application No. 2014-197522

SUMMARY OF THE INVENTION

An object of one embodiment of the present invention is to provide a functional panel such as a display panel, a light-emitting panel, a sensor panel, or a touch panel with high reliability. Alternatively, an object of one embodiment of the present invention is to provide a functional panel in which deterioration due to impurities such as water is suppressed. Alternatively, an object of one embodiment of the present invention is to provide a functional panel in which an electrical failure at a terminal portion is suppressed. Alternatively, an object of one embodiment of the present invention is to provide a novel functional panel, a novel light-emitting panel, a novel display panel, a novel sensor panel, a novel touch panel, a novel electronic device, or the like.

Note that the descriptions of these objects do not disturb the existence of other objects. Note that in one embodiment of the present invention, there is no need to achieve all the objects. Objects other than the above objects can be derived from the description of the specification and like.

One embodiment of the present invention is a functional panel including a first substrate, a second substrate, a bonding layer, a functional element, a protective layer, and a terminal. The bonding layer is positioned between the first substrate and the second substrate. The functional element is surrounded by the first substrate, the second substrate, and the bonding layer. The terminal is electrically connected to the functional element, and is provided not to overlap with one of the first substrate and the second substrate. The protective layer is provided to be in contact with side surfaces of the first substrate and the second substrate and an exposed surface of the bonding layer. Part of a surface of the terminal is exposed without being covered with the protective layer.

In the above structure, part of the exposed surface of the terminal preferably includes a material having a lower ionization tendency than hydrogen. In that case, the material is preferably palladium, iridium, gold, or platinum.

In the above structure, the protective layer preferably includes at least one of aluminum oxide, hafnium oxide, zirconium oxide, titanium oxide, zinc oxide, indium oxide, tin oxide, indium tin oxide, tantalum oxide, silicon oxide, manganese oxide, nickel oxide, erbium oxide, cobalt oxide, tellurium oxide, barium titanate, titanium nitride, tantalum nitride, aluminum nitride, tungsten nitride, cobalt nitride, manganese nitride, and hafnium nitride.

In the above structure, the terminal preferably has a stacked structure in which a second layer is stacked over a first layer. In that case, it is preferable that part of a surface of the second layer be exposed and the second layer include a material having a lower ionization tendency than a material included in the first layer. Furthermore, at this time, the second layer preferably includes palladium, iridium, gold, or platinum.

In the above structure, the first substrate and the second substrate preferably have flexibility.

It is preferable that the above functional panel further include an FPC electrically connected to the terminal.

Another embodiment of the present invention is a light-emitting panel including the functional panel, in which the functional element includes a light-emitting element. Another embodiment of the present invention is a display panel including the functional panel, in which the functional element includes a display element. Another embodiment of the present invention is a display panel including the functional panel, in which the functional element includes a display element and a transistor. Another embodiment of the present invention is a sensor panel including the functional panel, in which the functional element includes a sensor element.

According to one embodiment of the present invention, a highly reliable functional panel can be provided. Alternatively, a functional panel in which deterioration due to impurities such as water is suppressed can be provided. Alternatively, a functional panel in which an electrical failure at a terminal portion is suppressed can be provided. Alternatively, a novel functional panel, a novel light-emitting panel, a novel display panel, a novel sensor panel, a novel touch panel, a novel electronic device, or the like can be provided.

BRIEF DESCRIPTION OF THE DRAWINGS

In the accompanying drawings:

FIGS. 6A to 6D illustrate examples of a light-emitting panel of Embodiment;

FIGS. 10A to 10E illustrate examples of a light-emitting panel of Embodiment;

FIGS. 20A, 20B, 20C1, 20C2, 20D, 20E, 20F, 20G, and 20H illustrate examples of an electronic device and a lighting device of Embodiment;

FIGS. 21A1, 21A2, 21B, 21C, 21D, 21E, 21F, 21G, 21H, and 21I illustrate examples of an electronic device of Embodiment;

DETAILED DESCRIPTION OF THE INVENTION

Figure 1A:
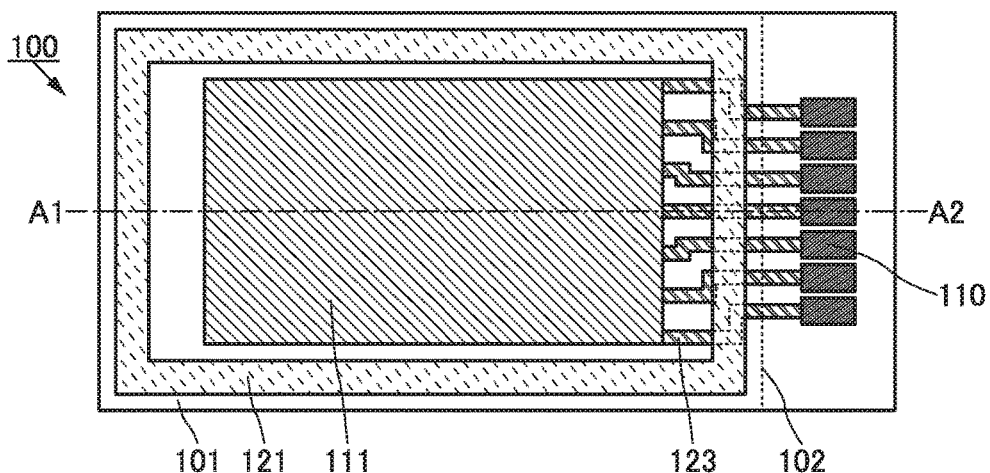
FIGS. 1A to 1D illustrate structure examples of a functional panel of one Embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Embodiment 1

A functional panel of one embodiment of the present invention is described below.

The functional panel of one embodiment of the present invention has a structure in which a functional element is sandwiched between a pair of substrates. The pair of substrates are bonded to each other with a bonding layer. The functional element is sealed by being surrounded by the pair of substrates and the bounding layer. Furthermore, a terminal electrically connected to the functional element is provided for one of the pair of substrates.

A protective layer is provided to be in contact with at least an exposed surface of the bonding layer. The protective layer is provided to cover the bonding layer; furthermore, the protective layer may be provided to partially or entirely cover surfaces of the pair of substrates. The protective layer can be formed using a material having low moisture permeability. The protective layer is positioned between the bonding layer and the outside air, and has a function of preventing impurities such as moisture included in the outside air from diffusing into the bonding layer. Such a protective layer can prevent impurities such as water from diffusing into the functional element through the bonding layer.

The protective layer is provided to cover at least an exposed side portion of the bonding layer and part of the substrates around the exposed side portion of the bonding layer. The protective layer is preferably formed using a deposition method with favorable step coverage. As one of the methods, an atomic layer deposition (ALD) method can be given.

As the protective layer, for example, a material containing aluminum oxide, hafnium oxide, zirconium oxide, titanium oxide, zinc oxide, indium oxide, tin oxide, indium tin oxide, tantalum oxide, silicon oxide, manganese oxide, nickel oxide, erbium oxide, cobalt oxide, tellurium oxide, barium titanate, titanium nitride, tantalum nitride, aluminum nitride, tungsten nitride, cobalt nitride, manganese nitride, hafnium nitride, or the like can be used. Specifically, a material containing at least one of these materials as a main component is preferably used. The film containing any of the above materials as a main component has high moisture resistance and thus can be favorably used as a barrier film against water and the like.

A "main component" in this specification refers to a component whose content is the highest in all components. Alternatively, it refers to a component whose content is greater than or equal to 50 vol % and less than 100 vol %, or greater than or equal to 50 wt % and less than 100 wt %. A film contains a plurality of materials as main components in some cases when the film includes a mixture of three or more materials (including the case where the film includes three or more constituent elements), for example. In that case, the film contains the plurality of materials as the main components at greater than or equal to 1 vol % and less than 100 vol %, or at greater than or equal to 1 wt % and less than 100 wt %.

A material that can be formed by an ALD method is preferably used for the protective layer, for example. By an ALD method, a dense protective layer in which defects such as cracks or pinholes are reduced or a protective layer with uniform thickness can be formed. Furthermore, damage caused to the vicinity of a surface of a sample in forming the protective layer can be reduced.

When an ALD method is employed, the protective layer with few defects, which is uniform in thickness, can be formed on a surface with complex unevenness, and the top, side, and rear surfaces of the functional panel.

Here, a conductive material that is not easily oxidized is preferably used for at least part of an exposed surface of the terminal. In other words, a material that is less likely to be ionized is preferably used. The material that is less likely to be ionized is, in other words, a material whose standard oxidation-reduction potential (also referred to as standard electrode potential) is high. Even in the case where the surface of the material is subjected to the air containing water and oxygen, an oxide film is not formed on the surface, or the thickness of a formed oxide film is extremely small. Thus, contact resistance of the terminal can be reduced.

Furthermore, when the protective layer is formed by an ALD method, a thin film is not, or not easily formed on a surface of the material that is not easily oxidized. That is, in the case of using a terminal including such a material on its surface, forming a portion on the terminal in a self-aligned manner in which the protective layer is not formed is performed, even without performing masking or the like over the terminal, and the terminal can have an exposed surface.

Specifically, in an ALD method, a thin film can be formed on the surface of the sample by repeatedly supplying a gas containing a precursor and a gas containing an oxidizing material to the surface of the sample. At this time, a conductive material the surface of which is not, or not easily oxidized by an oxidizing gas is used for the surface of the terminal, whereby the thin film is not formed on the surface of the terminal, or formation of the thin film can be prevented.

In an ALD method, when water ($H_2O$) is used as the oxidizing material, a material having a lower ionization tendency than hydrogen ($H_2$), that is, a conductive material having a higher standard oxidation-reduction potential than hydrogen (0 V) is preferably used because the conductive material is not oxidized. Examples of such a material include copper, mercury, silver, iridium, palladium, gold, and platinum.

When a material (e.g., ozone ($O_3$)) having higher oxidation properties than water is used as the oxidizing material in an ALD method, iridium, palladium, gold, platinum, or the like with an extremely lower ionization tendency is preferably used.

The terminal preferably has a stacked structure. In that case, the above-described metal that is not easily oxidized, an alloy containing the metal, or the like is preferably used as the material used for a surface side of the terminal. As the material used for a portion other than the surface side of the terminal, a material having a higher ionization tendency than the material used for the surface side of the terminal, that is, a material having a lower standard oxidation-reduction potential than the material used for the surface side of the terminal is preferably used. Because the above-described material that is not easily oxidized is relatively expensive, the use of the material only in a surface portion of the terminal allows cost reduction.

More specific structure examples and examples of a manufacturing method are described below with reference to drawings.

Structure Example

[Functional Panel]

Figure 1B:
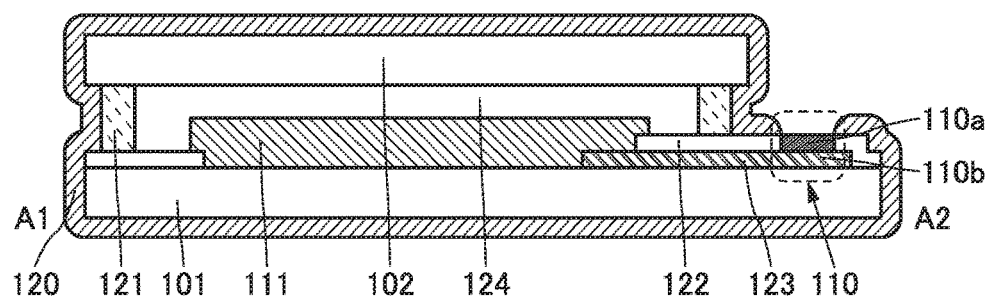

FIG. 1A is a schematic top view of a functional panel 100 of one embodiment of the present invention. FIG. 1B is a schematic cross-sectional view taken along the line A1-A2 in FIG. 1A. Note that some components (e.g., a protective layer 120) are not illustrated in FIG. 1A for simplicity.

The functional panel 100 includes a substrate 101, a substrate 102, a functional element 111, a plurality of terminals 110, a bonding layer 121, an insulating layer 122, wirings 123, and the like.

The functional element 111 is formed over the substrate 101. The functional element 111 is sealed by being surrounded by the substrate 101, the substrate 102, and the bonding layer 121.

FIGS. 1A and 1B illustrate an example in which the bonding layer 121 is provided to surround the functional element 111. In FIG. 1B, a space 124 is provided in the area surrounded by the bonding layer 121, the substrate 101, and the substrate 102.

The protective layer 120 is provided in contact with exposed surfaces (also referred to as side surfaces or end surfaces) of the bonding layer 121. The protective layer 120 is preferably provided also in a region where the bonding layer 121 and the substrate 101 (or a structure formed over the substrate 101) are in contact with each other and a region where the bonding layer 121 and the substrate 102 (or a structure formed over the substrate 102) are in contact with each other. With such a structure, a gap formed between the bonding layer 121 and the substrate 101 or the substrate 102 can be effectively filled, and impurities can be prevented from diffusing into the functional element 111.

FIG. 1B illustrates an example in which the protective layer 120 is provided to cover a top surface and side surfaces of the substrate 101, a bottom surface and side surfaces of the substrate 102, and the side surfaces of the bonding layer 121.

The functional element 111 and the terminal 110 are electrically connected by the wiring 123. The terminal 110 can be used as a terminal with which a connector such as an FPC, an integrated circuit such as an IC, and the like are mounted on the substrate 101. Alternatively, the terminal 110 may be used for the contact with a measurement probe, a test probe, or the like.

In FIG. 1B, the terminal 110 has a stacked structure in which a conductive layer 110*a* is stacked over a conductive layer 110*b*. Here, part of the wiring 123 functions as the conductive layer 110*b*.

The conductive layer 110*a* of the terminal 110 is provided so that part of the surface thereof is exposed. Furthermore, the protective layer 120 has an opening overlapping with part of the surface of the terminal 110.

The conductive layer 110*a* includes the above conductive material that is not easily oxidized. With such a structure, contact resistance of the terminal 110 can be reduced.

As shown in FIG. 1B, it is preferable that the terminal 110 have a stacked structure in which two or more conductive layers are stacked and the above conductive material that is not easily oxidized be used only for the conductive layer 110a positioned as an upper layer of the stacked structure because cost reduction can be achieved. At this time, as the conductive layer 110a, a material having a lower ionization tendency than the conductive layer 110b, that is, a material having a higher standard oxidation-reduction potential than the conductive layer 110b is preferably used.

The insulating layer 122 is provided to cover the wiring 123. The insulating layer 122 has a function of protecting the wiring 123. For example, the insulating layer 122 may have a function of suppressing oxidation of the surface of the wiring 123. Note that the insulating layer 122 is not necessarily provided. The insulating layer 122 may be provided only in a portion overlapping with the bonding layer 121 and on the outer side of the bonding layer 121. Although FIG. 1B shows the case where the insulating layer 122 is provided to cover the wiring 123, the insulating layer 122 may be provided to cover both the functional element 111 and the wiring 123, or the insulating layer 122 may include two or more insulating layers, one of which covers the wiring 123 and another of which covers the functional element 111.

The protective layer 120 is provided to be in contact with a surface of the insulating layer 122 in the region outside the bonding layer 121. Such a structure can effectively suppress diffusion of impurities from the outside through the insulating layer 122.

Figure 1C:
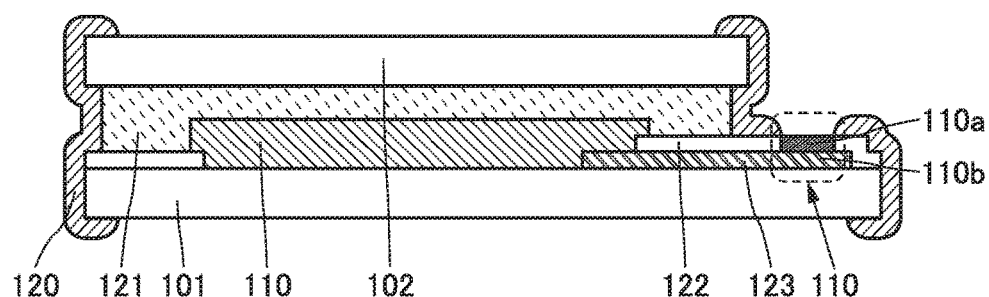
Figure 1D:
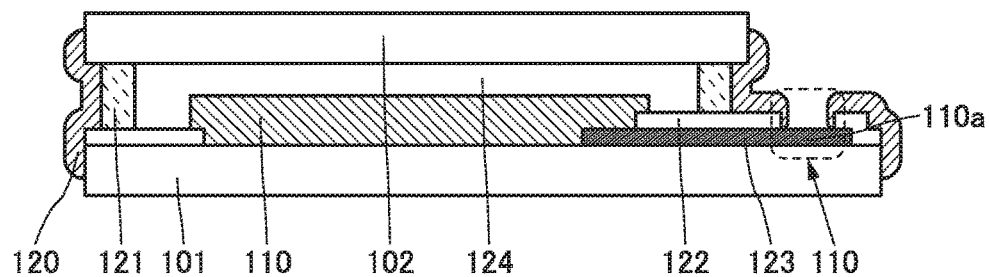

FIGS. 1C and 1D each illustrate a structure example which is partly different from that shown in FIG. 1B.

FIG. 1C shows the case where the protective layer 120 is not provided on part of the top surface of the substrate 102 and part of the bottom surface of the substrate 101. The protective layer 120 is provided to be in contact with the side surfaces and part of the bottom surface of the substrate 101, the side surfaces and part of the top surface of the substrate 102, and the side surfaces of the bonding layer 121.

FIG. 1C illustrates an example in which a space between the substrates 101 and 102 is filled with the bonding layer 121. That is, the bonding layer 121 is provided to fill the space 124 in FIG. 1B and to partly overlap with the functional element 111.

FIG. 1D illustrates an example in which the protective layer 120 is not provided on the top surface of the substrate 102 and the bottom surface of the substrate 101. The protective layer 120 is provided to be in contact with part of the side surfaces of the substrate 101, part of the side surfaces of the substrate 102, and the side surfaces of the bonding layer 121.

Furthermore, in the example illustrated in FIG. 1D, the terminal 110 is formed using part of the wiring 123. At this time, the wiring 123 is formed using the above-described conductive material that is not easily oxidized. That is, the wiring 123 and the conductive layer 110a may be formed using the same material.

[Functional Element]

As the functional element 111, an element having any of functions such as an optical element, a sensor element, an electrical element, a semiconductor element, and a memory element can be used.

As the optical element, a display element, a light-emitting element, a light-receiving element, or the like can be used. For example, a liquid crystal element, an organic EL element, an inorganic EL element, an LED element, a photoelectric conversion element, or the like can be used. Alternatively, an element whose contrast, reflectivity, transmittivity, or the like is changed by an electromagnetic action may be used. The use of a display element, a light-emitting element, or the like enables the functional panel to function as a display panel. Alternatively, the functional panel may function as a lighting panel using a light-emitting element. Alternatively, the functional panel may function as a solar cell panel using a light-receiving element.

Examples of the display element and the light-emitting element include an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator (IMOD) element, a MEMS shutter display element, an optical-interference-type MEMS display element, an electrowetting element, a piezoelectric ceramic display, a display element including a carbon nanotube, and the like.

As the sensor element, a sensor that has a function of measuring, for example, force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays can be used. For example, a sensor element using MEMS, a photoelectric conversion element, a semiconductor circuit can be used.

Examples of the electrical element and the semiconductor element include a resistor, a capacitor, a transistor, a circuit element, a coil, an inductor, a diode, and a switch.

Examples of the memory element include non-volatile memory elements such as a flash memory, a magnetoresistive random access memory (MRAM), a phase change RAM (PRAM), a resistance RAM (ReRAM), and a ferroelectric RAM (FeRAM), and volatile memory elements such as a dynamic RAM (DRAM) and an static RAM (SRAM).

[Example of Manufacturing Method]

An example of a method for manufacturing a functional panel of one embodiment of the present invention is described below.

Note that films included in the functional panel (i.e., an insulating film, a semiconductor film, a conductive film, and the like) can be formed by a deposition method such as a sputtering method, a chemical vapor deposition (CVD) method, a vacuum evaporation method, a pulsed laser deposition (PLD) method, or an ALD method. Alternatively, a deposition method such as a plating method (including electroplating or electroless plating), a coating method, or a printing method may be used. Typical deposition methods are a sputtering method and a plasma-enhanced chemical vapor deposition (PECVD) method; however, a thermal CVD method such as a metal organic chemical vapor deposition (MOCVD) method may be used.

When the thin films included in the functional panel are processed, a photolithography method or the like can be employed. Alternatively, island-shaped thin films may be formed by a film formation method using a blocking mask. Alternatively, the thin films may be processed by a nanoimprinting method, a sandblasting method, a lift-off method, or the like.

As light used to form the resist mask by a photolithography method, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of the thin film, dry etching, wet etching, a sandblast method, or the like can be used.

Figure 2A:
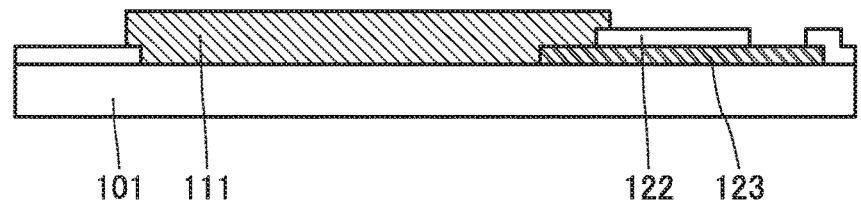
FIGS. 2A to 2D illustrate an example of a method for manufacturing a functional panel of Embodiment.

First, the wiring 123, the insulating layer 122, the functional element 111, and the like are formed over the substrate 101 (FIG. 2A).

There is no particular limitation on the properties of a material and the like of the substrate 101 and the substrate 102 as long as the material has heat resistance enough to withstand at least heat treatment to be performed later. For example, a glass substrate, a ceramic substrate, a quartz substrate, a sapphire substrate, or the like may be used as the substrate 101 and the substrate 102. Alternatively, a single crystal semiconductor substrate or a polycrystalline semiconductor substrate such as a silicon substrate or a silicon carbide substrate, a compound semiconductor substrate such as a silicon germanium substrate, an SOI substrate, or the like may be used as the substrate 101 and the substrate 102. Furthermore, any of these substrates further provided with a semiconductor element may be used as the substrate 101 and the substrate 102.

When flexible substrates are used as the substrate 101 and the substrate 102, the functional panel 100 can be flexible. At this time, the functional element 111 and the like may be directly formed over the flexible substrate 101. Alternatively, the structure may be employed in which the functional element 111 is formed with a separation layer provided between a separate base and the functional element 111 and then separated from the separate base to be transferred to the substrate 101. At this time, as the substrate 101 to which the functional element 111 and the like are transferred, a substrate having relatively low heat resistance or a flexible substrate can be used.

For the wiring 123, a material having a higher ionization tendency than the conductive layer 110a to be formed later can be used. For example, the wiring 123 can be formed using a metal selected from chromium, copper, aluminum, gold, silver, zinc, molybdenum, tantalum, titanium, tungsten, manganese, nickel, iron, cobalt, yttrium, and zirconium; an alloy containing any of these metals as its component; or an alloy containing a combination of any of these metals. Alternatively, a nitride of the metal or the alloy may be used.

The wiring 123 may have a single layer structure or a stacked structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

The wiring 123 can be formed using an oxide conductive material or a nitride conductive material. The wiring 123 can also be formed using indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The insulating layer 122 can be formed using an inorganic insulating material, an organic insulating material, or the like. For example, an inorganic insulating material such as silicon oxide, silicon oxynitride, silicon nitride, silicon nitride oxide, aluminum nitride, aluminum nitride oxide, aluminum oxide, aluminum oxynitride, gallium oxide, gallium oxynitride, yttrium oxide, yttrium oxynitride, hafnium oxide, or hafnium oxynitride can be used. Alternatively, an organic insulating material such as acrylic, epoxy, polyimide, or siloxane can be used.

The insulating layer 122 is preferably formed so that an opening is provided in a portion over the wiring 123 to be the terminal 110 later.

The functional element 111 is formed by a method that is suitable for an element used as the functional element 111.

Figure 2B:
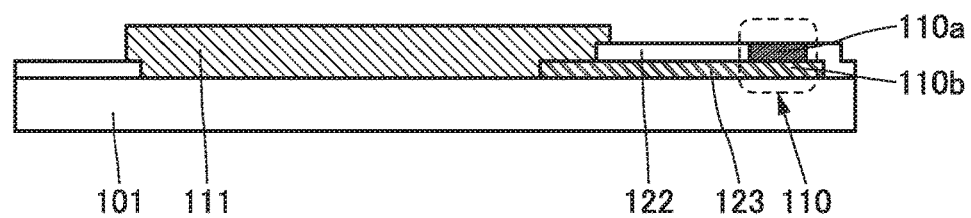

Next, the conductive layer 110a is formed over the wiring 123 (FIG. 2B). Here, description is made on the case where the conductive layer 110a is formed by a plating method.

In a portion of the wiring 123 to be the conductive layer 110b, a material that functions as a seed layer for plating is used. Alternatively, a thin film that functions as the seed layer is formed over the conductive layer 110b. As a material that functions as the seed layer, a metal or an alloy suitable for the formation of the conductive layer 110a is selected as appropriate; for example, nickel, an alloy of nickel and chromium, an alloy of nickel, chromium, and palladium, or the like can be used. Alternatively, a thin film formed using the same material as the conductive layer 110a may be formed. When the wiring 123 functions as the seed layer, the step for forming the thin film is not necessary.

Next, the conductive layer 110a is formed by a plating method. Although the conductive layer 110a may be formed by electroplating, it is preferable that the conductive layer 110a be formed by electroless plating. Since the insulating layer 122 is formed to cover portions other than the portion to be the terminal 110, the conductive layer 110a can be selectively formed only on a material that functions as the seed layer. At this time, the insulating layer 122 is preferably provided to also cover a surface of the functional element 111. Furthermore, in the case where a thin film is formed in the portions other than the portion to be the terminal 110 by plating, the thin film may be etched or left as it is.

As described above, the terminal 110 can be formed. The terminal 110 has a stacked structure in which the conductive layer 110a is stacked over the conductive layer 110b.

Figure 2C:
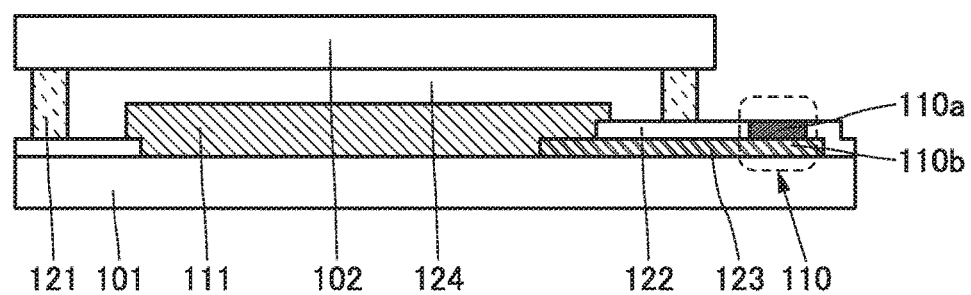

Then, the substrate 101 and the substrate 102 are bonded to each other with the bonding layer 121 (FIG. 2C).

As the bonding layer 121, a resin and the like which can bond the substrate 101 and the substrate 102 can be used. For example, a variety of curable resins such as a reactive curable resin, a thermosetting resin, an anaerobic curable resin, and a photo-curable resin (e.g., an ultraviolet curable resin) can be used. Examples of such resins include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferable. Alternatively, a two-component-mixture-type resin may be used. Further alternatively, an adhesive sheet or the like may be used.

Figure 2D:
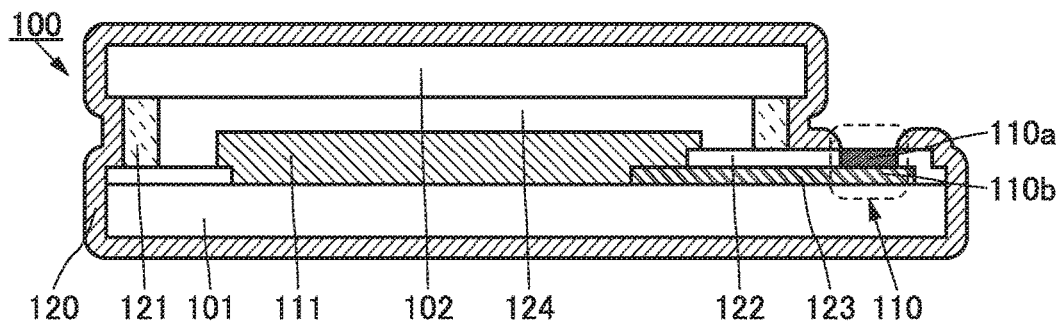

Next, the protective layer 120 is formed (FIG. 2D).

The protective layer 120 can be formed by the above-described deposition method. The protective layer 120 is preferably formed by an ALD method.

Figure 3A:
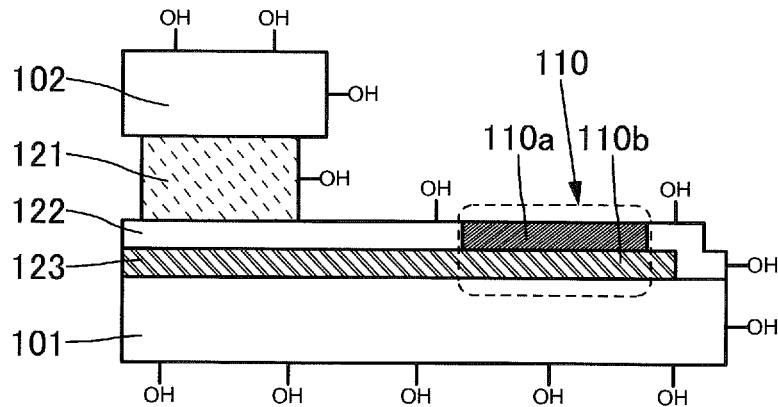
FIGS. 3A to 3C illustrate an example of a method for manufacturing a functional panel of Embodiment.
Figure 3B:
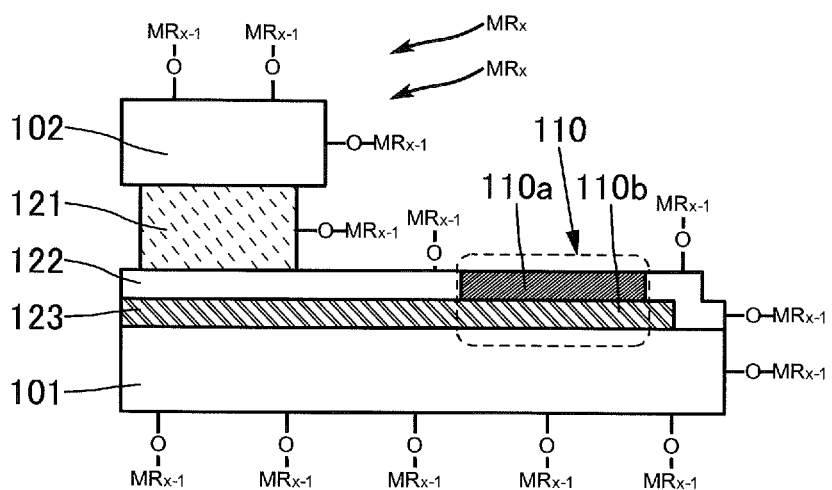
Figure 3C:
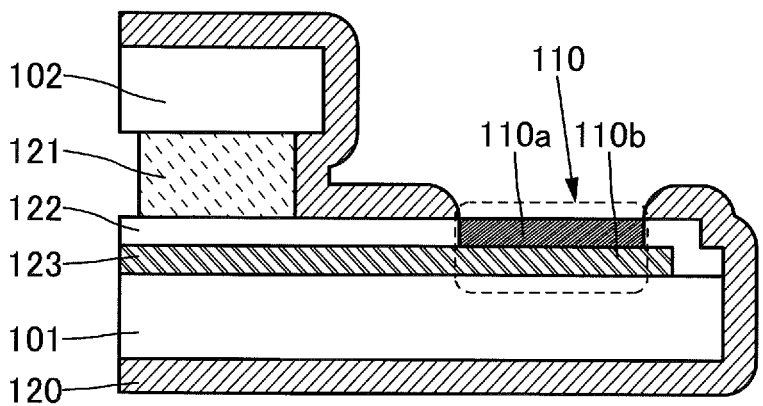

Formation of the protective layer 120 by an ALD method is described with reference to FIGS. 3A to 3C. FIGS. 3A to 3C are enlarged schematic views of the vicinity of the terminal 110.

FIG. 3A shows the state before the deposition. As shown in FIG. 3A, hydroxyl groups (OH) are adsorbed on the surfaces of the substrate 101, the substrate 102, the insulating layer 122, the bonding layer 121, and the like. In other words, these surfaces are covered with the hydroxyl groups.

In contrast, the conductive layer 110a is a material that is not easily oxidized; thus, the hydroxyl groups (OH) are hardly adsorbed on the surface of the conductive layer 110a.

FIG. 3B shows the state at the early stage of the deposition in which a precursor ($MR_x$) including a metal M and x ligands R are used. When a gas containing the precursor is supplied, the precursor reacts with the hydroxyl groups on the surfaces of the substrate 101 and the like, and $MR_{x-1}$ in the precursor is substituted for the hydrogen in the hydroxyl groups. At this time, a molecule (HR) containing the ligand R and the hydrogen, and the like are generated and are exhausted (not shown). As a result, as shown in FIG. 3B, the surfaces of the substrate 101 and the like are covered with $MR_{x-1}$ including the metal M and the ligand R.

Next, when a gas containing an oxidizing material is supplied, hydroxyl groups are substituted for the ligand R in the $MR_{x-1}$ (not shown). As a result, the outermost surfaces of the substrate 101 and the like are covered with the hydroxyl groups. At that time, adjacent hydroxyl groups may generate a M-O-M bond by a dehydration condensation reaction.

By repetition of the above process, the protective layer 120 containing an oxide of metal M as its main component can be formed.

Here, hydroxyl groups do not exist on the surface of the conductive layer 110a at the early stage as described above; thus, a reaction between the precursor and the hydroxyl groups is not generated on the surface of the conductive layer 110a. Furthermore, when the gas containing the oxidizing material after that is supplied, the surface of the conductive layer 110a is not oxidized since the conductive layer 110a is formed of a material that is not easily oxidized. Even after the step of supplying the oxidizing material, the hydroxyl groups do not exist on the conductive layer 110a. Thus, reaction with the subsequently supplied precursor is not generated. Consequently, as shown in FIG. 3C, the protective layer 120 is not formed on the conductive layer 110a, and is formed to cover the surfaces other than the surface of the conductive layer 110a. That is, the surface of the terminal 110 can be exposed without a special step such as masking treatment that is performed so that a portion is not covered with the protective layer 120.

Through the above steps, the functional panel 100 that is covered with the protective layer 120, with the surface of the terminal 110 exposed, can be manufactured (FIG. 2D).

Although an example in which the protective layer 120 is formed by an ALD method is described here, the deposition method is not limited to this. For example, the protective layer 120 can be formed by the above-described deposition method other than an ALD method. In that case, when the protective layer 120 is formed on the terminal 110 in the deposition, the protective layer 120 is processed so that an opening is formed in a portion to be the terminal 110 in a later step.

Modification Example 1

In the above example of the manufacturing method, the conductive layer 110a that is positioned on the surface side of the terminal 110 is formed by a plating method; however, the conductive layer 110a can be formed by a method different from a plating method. Examples of a functional panel that is formed by a manufacturing method partly different from the above method are described below.

Figure 4A:
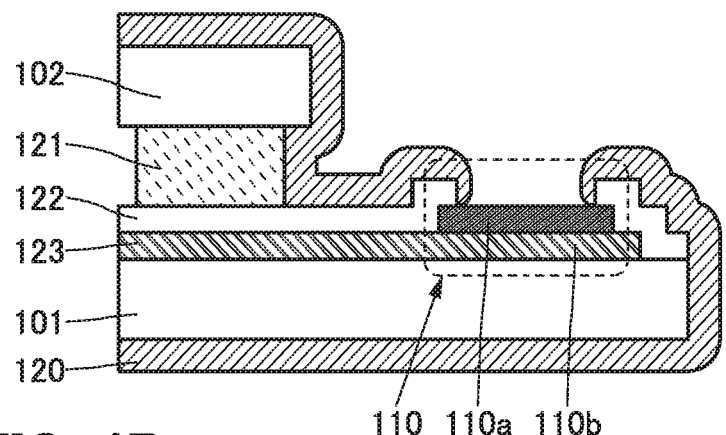
FIGS. 4A to 4C each illustrate a structure example of a functional panel of Embodiment.

FIG. 4A shows an example in which the insulating layer 122 is provided to cover part of the conductive layer 110a of the terminal 110. With such a structure, end portions of the conductive layer 110a can be protected.

The functional panel 100 having the structure shown in FIG. 4A can be formed by the following method, for example. In the above example of the manufacturing method, after the formation of the wiring 123, a conductive film to be the conductive layer 110a is formed to cover the wiring 123; then, part of the conductive film is etched to be removed, whereby the conductive layer 110a can be formed over the wiring 123. After that, an insulating film to be the insulating layer 122 is formed; then, part of the insulating film is etched to be removed, whereby the insulating layer 122 having an opening over the conductive layer 110a can be formed. After that, the substrate 101 and the substrate 102 are bonded to each other with the bonding layer 121 and the protective layer 120 is formed, whereby the functional panel 100 having the structure shown in FIG. 4A can be formed.

Part of the wiring 123 is etched in some cases in processing of the conductive layer 110a. Thus, in processing of the conductive layer 110a, it is preferable that etching conditions be adjusted or the materials of the conductive layer 110a and wiring 123 be optimally selected so that the wiring 123 is not removed.

Figure 4B:
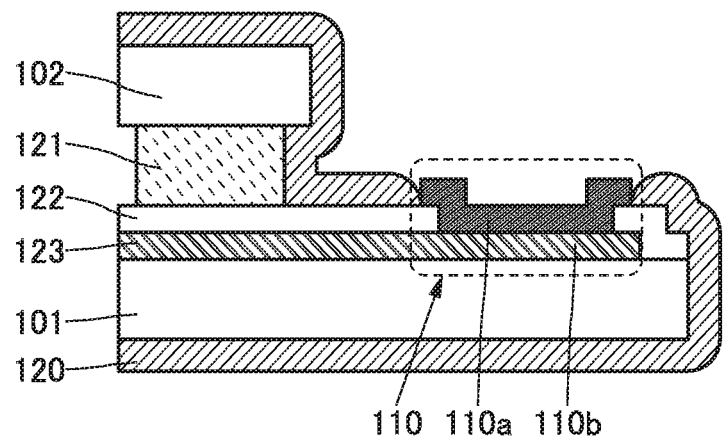

FIG. 4B shows an example in which the conductive layer 110a of the terminal 110 is provided to cover edges of the opening of the insulating layer 122. With such a structure, the surface area of the terminal 110 can be larger than the area of the opening of the insulating layer 122. As a result, the FPC or the like and the terminal can be easily aligned, and resistance can be decreased by an increase in the contact area between a terminal of the FPC or the like and the terminal 110, for example.

The functional panel 100 having the structure shown in FIG. 4B can be formed by the following method, for example. In the above example of the manufacturing method, the conductive film to be the conductive layer 110a is formed after the formation of the insulating layer 122; then, part of the conductive film is etched to be removed, whereby the conductive layer 110a can be formed. After that, the substrate 101 and the substrate 102 are bonded to each other with the bonding layer 121, and the protective layer 120 is formed, whereby the functional panel 100 having the structure shown in FIG. 4B can be formed.

In such a manufacturing method, in processing of the conductive layer 110a, the insulating layer 122 is provided under the portion to be etched of the conductive film to be the conductive layer 110a. Thus, a problem in that part of the wiring 123 is etched by etching of the conductive film can be suppressed.

Figure 4C:
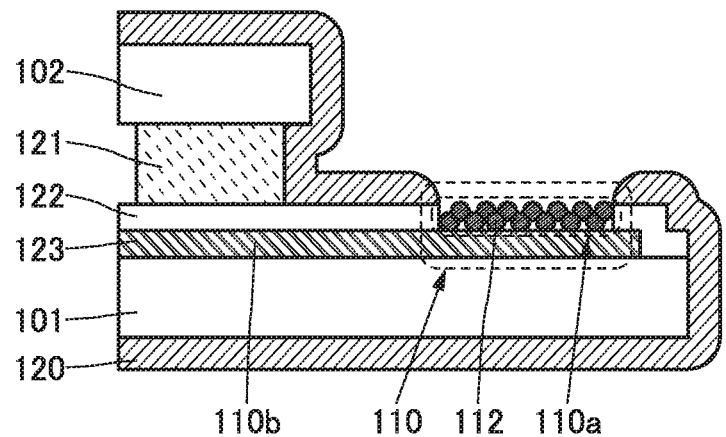

FIG. 4C shows an example in which the conductive layer 110a has conductive particles 112. The conductive particles 112 include the above-described conductive material that is not easily oxidized. As the conductive particles 112, nanoparticles can be used, for example. Furthermore, the conductive particles 112 may form a stacked structure of two or more layers; in that case, the above-described conductive material that is not easily oxidized is used in a layer positioned closest to the surface side.

The functional panel 100 having the structure shown in FIG. 4C can be manufactured, in the above example of manufacturing method, by forming the conductive layer 110a including the conductive particles 112 after the formation of the insulating layer 122 and before forming the protective layer 120. For example, the conductive layer 110a including the conductive particles 112 can be formed by selectively discharging paste or ink containing the conductive particles 112 by a dispensing method, an ink jet method, or the like, and removing a solvent or a binder. The formation of the conductive layer 110a may be performed before bonding the substrate 101 and the substrate 102, or after bonding the substrate 101 and the substrate 102.

The protective layer 120 is not formed on the surfaces of the conductive particles 112. Thus, after the formation of the protective layer 120, the terminal 110 with the surfaces of the conductive particles 112 exposed is formed. At this time, the protective layer 120 may be formed on part of the wiring 123 depending on the deposition conditions of the protective layer 120 and the materials to be used in the surface of the wiring 123. Even in that case, the protective layer 120 is not formed in a portion where the conductive particles 112 are in contact with each other or a portion where the conductive particles 112 are in contact with the wiring 123; thus, electrical connection between the conductive particles 112 positioned in the vicinity of the surface of the terminal 110 and the wiring 123 can be kept.

The above is the description of the modification examples.

Modification Example 2

A material which can be used for the protective layer 120 can suppress diffusion of impurities such as water. A layer containing such a material is provided between the functional element 111 and the bonding layer 121, so that diffusion of impurities into the functional element 111 can be effectively suppressed.

Figure 5:
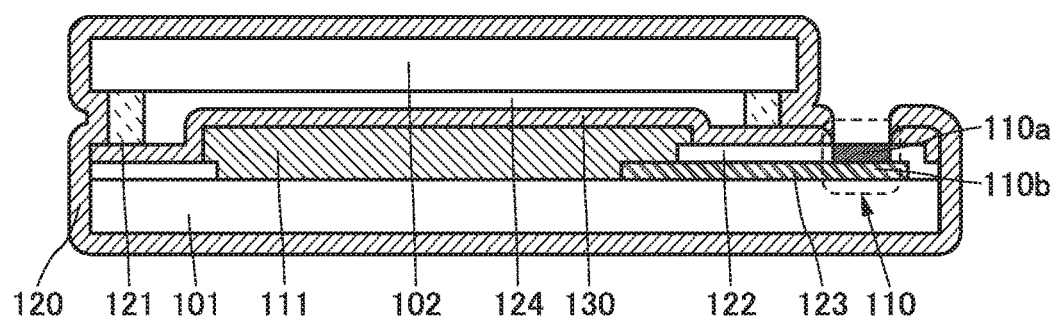
FIG. 5 illustrates a structure example of a functional panel of Embodiment.

FIG. 5 shows a schematic cross-sectional view in which a protective layer 130 covering the functional element 111 is provided.

For the protective layer 130, a material that can be used for the protective layer 120 can be used. Furthermore, it is preferable that the protective layer 120 and the protective layer 130 be formed using the same material and the same deposition apparatus, in which case cost can be reduced.

The protective layer 130 can be formed by a method similar to that used for the protective layer 120. In particular, an ALD method is preferably employed. In an ALD method, a dense film can be formed at a low temperature, and damage to a layer positioned under a film to be deposited (a surface on which the film is formed) in deposition is extremely small since plasma or the like is not used. Thus, the influence on the functional element 111 can be extremely small by the deposition using an ALD method. For example, in the case of using an organic EL element as the functional element 111, the protective layer 130 is formed by an ALD method so as to cover an upper electrode, so that damage to the organic EL element can be minimized.

The protective layer 130 is formed at the stage after forming the functional element 111 and before bonding the substrate 101 and the substrate 102. At this time, the protective layer 130 is formed by an ALD method or the like, whereby the protective layer 130 is not formed on the terminal 110 and an opening of the protective layer 130 is formed on the terminal 110 in a self-aligned manner as shown in FIG. 5.

As shown in FIG. 5, the protective layer 120 covering the exposed surface of the bonding layer 121 is preferably provided. With such a structure, the functional element 111 can be surrounded by the protective layer 120 and the protective layer 130; thus, an extremely reliable functional panel can be obtained.

The functional panel of one embodiment of the present invention is an extremely reliable functional panel in which diffusion of impurities is suppressed by the protective layer. Since the protective layer is formed on a portion other than the surface of the terminal in a self-aligned manner, the terminal surface with low resistance can be exposed without a special step, so that a functional panel in which the terminal is favorably connected to the FPC and the like can be manufactured at a low cost.

At least part of this embodiment can be implemented in combination with any of the embodiments described in this specification as appropriate.

Embodiment 2

In this embodiment, description is made on structure examples of a light-emitting panel and a display panel as examples of a functional panel of one embodiment of the present invention.

In this specification and the like, a light-emitting panel means the one including at least a light-emitting element and having a panel-shaped structure in which light emission can be extracted from the light-emitting element. A display panel means the one including at least a display element, having a panel-shaped structure, and having a function of displaying an image and the like. The display panel may include an electrical element or a semiconductor element such as a transistor, a capacitor, or a resistor. Here, in the case of using a light-emitting element as a display element of the display panel, it can also be said that the display panel is one mode of the light-emitting panel.

The light-emitting panel and the display panel of embodiments of the present invention each have a structure in which a light-emitting element or a display element provided between a pair of substrates is sealed with a sealing layer. Furthermore, the light-emitting panel and the display panel of embodiments of the present invention each have a structure in which a protective layer is formed to cover an exposed portion of the sealing layer.

For example, in the case of using an organic EL element as the display element or the light-emitting element, degradation is caused by diffusion of impurities such as water into the organic EL element. In the case of using a liquid crystal element as the display element, the resistance of liquid crystal is changed by the influence of the impurities. In the case of a transistor, specifically a transistor including an oxide semiconductor in a semiconductor layer, electrical characteristics of the transistor might be changed by diffusion of impurities such as water into the semiconductor.

By the use of the protective layer for the light-emitting panel or the display panel, diffusion of impurities such as water from the outside into the panel can be suppressed. Thus, diffusion of the impurities into a light-emitting element, a display element (an organic EL element, a liquid crystal element, or the like), a transistor, a circuit, a wiring, an electrode, and the like can be suppressed. As a result, an extremely reliable light-emitting panel or display panel can be obtained.

A terminal electrically connected to the display element or the light-emitting element is provided for one of the substrates. The terminal is provided not to overlap with the other substrate, so that electrical connection between the terminal and a connector such as an FPC can be easily achieved. A conductive material that is not easily oxidized is used in the surface of the terminal. Since the contact resistance with the connector or the like is reduced, delay or attenuation of an input signal can be suppressed, and problems such as disconnection or poor connection due to heat generation at a contact point are less likely to occur.

Specifically, the following structure can be employed for example.

Specific Example 1

FIG. 6A is a plan view of a light-emitting panel, and FIG. 6C is an example of a cross-sectional view taken along dashed-dotted line B1-B2 in FIG. 6A. The light-emitting panel in Specific Example 1 is a top-emission light-emitting panel (also referred to as a top-emission display panel) using a color filter method. In this embodiment, the light-emitting panel can have, for example, a structure in which sub-pixels of three colors of red (R), green (G), and blue (B) express one color, or a structure in which sub-pixels of four colors of red (R), green (G), blue (B), and white (W) or sub-pixels of four colors of red (R), green (G), blue (B), and yellow (Y) express one color. The color element is not particularly limited and colors other than R, G, B, and W may be used. For example, yellow, cyan, magenta, and the like may be used.

The light-emitting panel illustrated in FIG. 6A includes a light-emitting portion 804, a driver circuit portion 806, and a flexible printed circuit (FPC) 808. Light-emitting elements and transistors in the light-emitting portion 804 and the driver circuit portion 806 are sealed with a substrate 801, a substrate 803, and the bonding layer 121.

The light-emitting panel illustrated in FIG. 6C includes the substrate 801, an adhesive layer 811, an insulating layer 813, a plurality of transistors 820, the terminal 110 (the conductive layer 110a and the conductive layer 110b), an insulating layer 815, an insulating layer 817, a plurality of light-emitting elements 830, an insulating layer 821, the bonding layer 121, an overcoat 849, a coloring layer 845, a light-blocking layer 847, an insulating layer 843, an adhesive layer 841, the substrate 803, and the protective layer 120. The bonding layer 121, the overcoat 849, the insulating layer 843, the adhesive layer 841, the substrate 803, and the protective layer 120 transmit visible light.

The light-emitting portion 804 includes the transistors 820 and the light-emitting elements 830 over the substrate 801 with the adhesive layer 811 and the insulating layer 813 provided therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

The light-emitting portion 804 also includes the coloring layer 845 overlapping with the light-emitting element 830 and the light-blocking layer 847 overlapping with the insulating layer 821. The coloring layer 845 and the light-blocking layer 847 are covered with the overcoat 849. The space between the light-emitting element 830 and the overcoat 849 is filled with the bonding layer 121.

The insulating layer 815 has an effect of suppressing diffusion of impurities into a semiconductor included in the transistor. As the insulating layer 817, an insulating layer having a planarization function is preferably selected in order to reduce surface unevenness due to the transistor.

The driver circuit portion 806 includes a plurality of transistors over the substrate 801 with the bonding layer 811 and the insulating layer 813 provided therebetween. FIG. 6C illustrates one of the transistors included in the driver circuit portion 806.

The insulating layer 813 and the substrate 801 are attached to each other with the adhesive layer 811. The insulating layer 843 and the substrate 803 are attached to each other with the adhesive layer 841. It is preferable to use films with low water permeability for the insulating layers 813 and 843, in which case an impurity such as water can be prevented from entering the light-emitting element 830 or the transistor 820, leading to improved reliability of the light-emitting panel.

The terminal 110 is electrically connected to an external input terminal through which a signal (e.g., a video signal, a clock signal, a start signal, and a reset signal) or a potential from the outside is transmitted to the driver circuit portion 806. Here, an example is described in which an FPC 808 is provided as the external input terminal. To prevent an increase in the number of fabricating steps, the conductive layer 110b included in the terminal 110 is preferably formed using the same material and the same step(s) as those of the electrode or the wiring in the light-emitting portion or the driver circuit portion. Here, an example is described in which the conductive layer 110b is formed using the same material and the same step as the electrodes (the source electrode and the drain electrode) of the transistor 820.

FIG. 6C shows an example in which the terminal 110 has a stacked structure in which the conductive layer 110a is stacked over the conductive layer 110b. The conductive layer 110a includes the conductive material described in Embodiment 1 that is not easily oxidized. The conductive layer 110a is provided over the insulating layer 817 and is electrically connected to the conductive layer 110b through an opening provided in the insulating layer 817 and the insulating layer 815.

For the conductive layer 110a, a conductive material having a lower ionization tendency than hydrogen ($H_2$), or a conductive material having a lower ionization tendency than the conductive layer 110b can be used. For example, a metal selected from chromium, copper, aluminum, gold, silver, zinc, molybdenum, tantalum, titanium, tungsten, manganese, nickel, iron, cobalt, yttrium, and zirconium; an alloy containing any of these metal elements as its component; an alloy containing a combination of any of these metal elements; or a nitride of any of the above metals or the above alloy may be used for the conductive layer 110b. A material having a lower ionization tendency than any of the above-described materials is used for the conductive layer 110a; for example, copper, mercury, silver, iridium, palladium, gold, or platinum can be used. Specifically, iridium, palladium, gold, platinum, or the like is preferably used for the conductive layer 110a, in which case oxide is not formed on the surface of the conductive layer 110a even in a moist environment.

In the light-emitting panel illustrated in FIG. 6C, a connector 825 is positioned over the substrate 803. The connector 825 is connected to the terminal 110 through the opening provided in the substrate 803, the adhesive layer 841, the insulating layer 843, the bonding layer 121. The connector 825 is connected to the FPC 808. The FPC 808 is electrically connected to the terminal 110 through the connector 825. When the terminal 110 and the substrate 803 overlap with each other, an opening formed in the substrate 803 (or the use of a substrate with an opening) allows the terminal 110, the connector 825, and the FPC 808 to be electrically connected to each other.

The light-emitting panel in Specific Example 1 can be manufactured in the following manner: the insulating layer 813, the transistor 820, and the light-emitting element 830 are formed over a formation substrate with high heat resistance; the formation substrate is separated; and the insulating layer 813, the transistor 820, and the light-emitting element 830 are transferred to the substrate 801 and attached thereto with the adhesive layer 811. The light-emitting panel in Specific Example 1 can be manufactured in the following manner: the insulating layer 843, the coloring layer 845, and the light-blocking layer 847 are formed over a formation substrate with high heat resistance; the formation substrate is separated; and the insulating layer 843, the coloring layer 845, and the light-blocking layer 847 are transferred to the substrate 803 and attached thereto with the adhesive layer 841.

In the case where a material with low heat resistance (e.g., resin) is used for a substrate, it is difficult to expose the substrate to high temperatures in the manufacturing process. Thus, there is a limitation on conditions for forming a transistor and an insulating layer over the substrate. In the case of using a material with high water permeability (e.g., a resin), it is preferable to form a film at high temperatures to have low water permeability. In the manufacturing method of this embodiment, a transistor and the like can be formed over a formation substrate with high heat resistance; thus, a highly reliable transistor and a film with sufficiently low water permeability can be formed at high temperatures. Then, the transistor and the film are transferred to the substrate 801 and the substrate 803, whereby a highly reliable light-emitting panel can be manufactured. Thus, according to one embodiment of the present invention, a thin and/or lightweight and highly reliable light-emitting panel can be provided. Details of the manufacturing method will be described later.

In FIG. 6C, the protective layer 120 is provided to cover an exposed portion of the light-emitting panel. Specifically, the protective layer 120 is provided to partially or entirely cover the exposed portions of the substrate 803, the adhesive layer 841, the insulating layer 843, the bonding layer 121, the insulating layer 817, the insulating layer 815, the insulating layer 813, the adhesive layer 811, the substrate 801, and the like.

As shown in FIG. 6C, an opening is preferably provided in part of the protective layer 120 so that part of the top surface of the terminal 110 electrically connected to the FPC 808 is exposed. Thus, electrical connection between the FPC 808 and the terminal 110 can be easily made.

That is, the structure in which the protective layer 120 is provided to cover a region other than the connection portion (terminal portion) to which the FPC 808 or the like is electrically connected is preferable because diffusion of impurities from the outside can be effectively suppressed.

As shown in FIG. 6C, the protective layer 120 is preferably provided on an inner wall of the opening in which the connector 825 is provided, in which case diffusion of impurities can be suppressed more effectively. For example, by forming the protective layer 120 after the formation of the opening, the protective layer 120 is not formed over the conductive layer 110a, and the protective layer 120 can be formed to cover the inner wall of the opening.

Figure 7A:
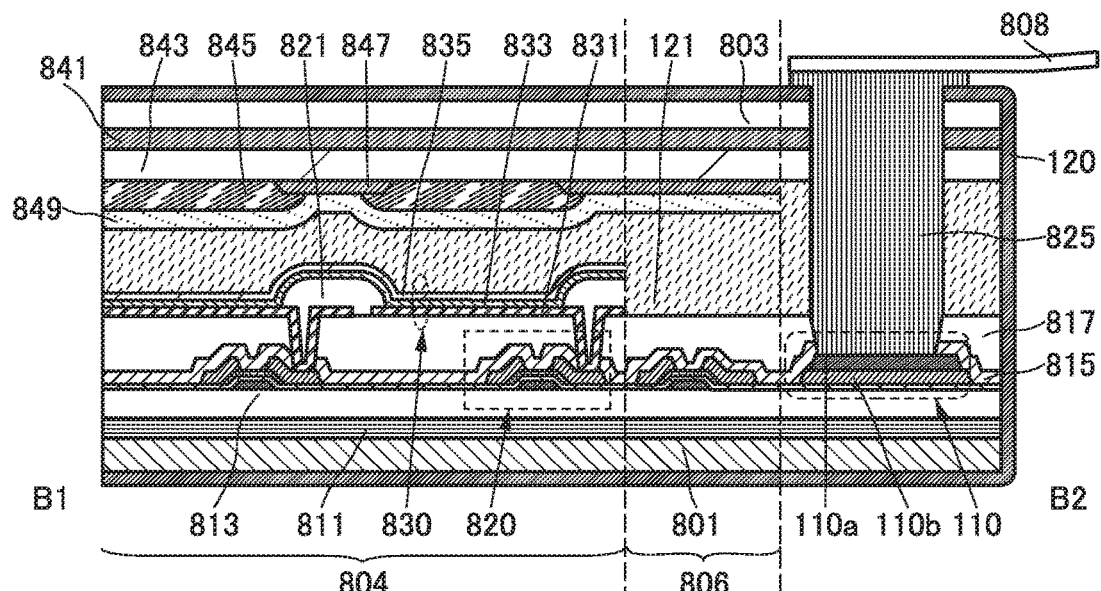
FIGS. 7A and 7B each illustrate an example of a light-emitting panel of Embodiment.
Figure 7B:
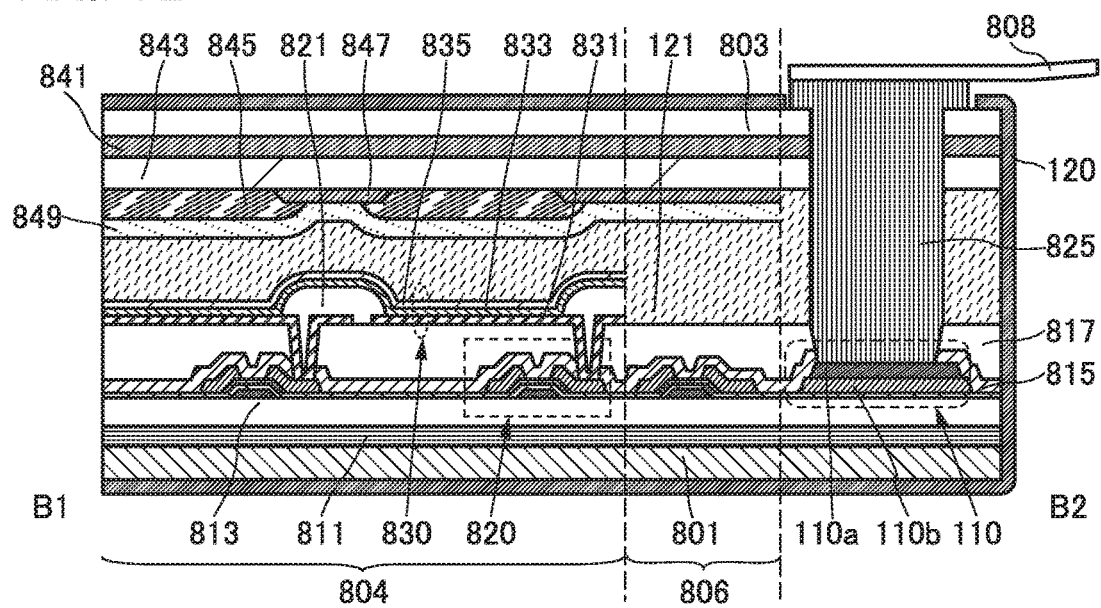
Figure 8:
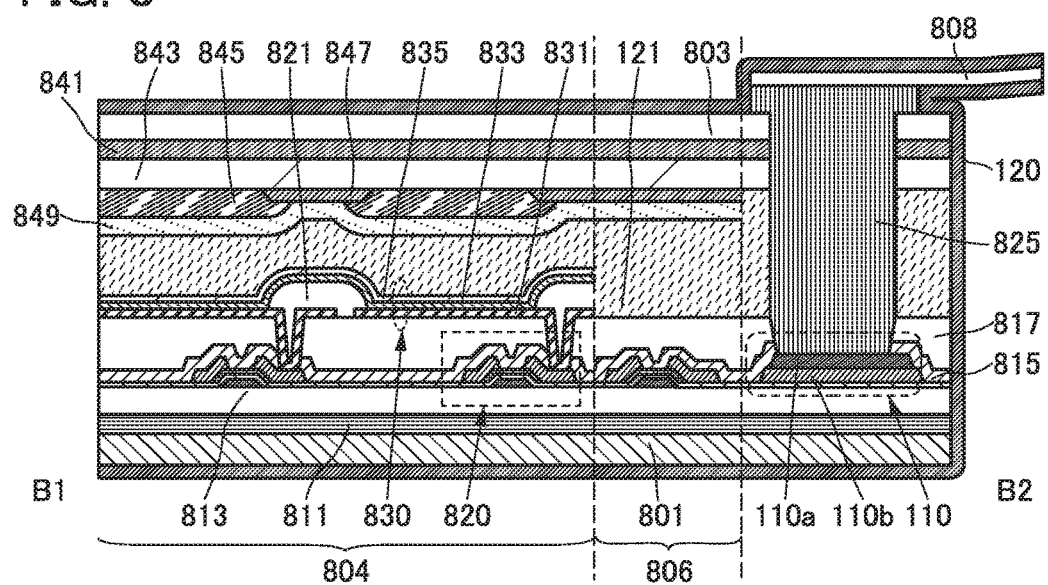
FIG. 8 illustrates an example of a light-emitting panel of Embodiment.

Note that the protective layer 120 is not necessarily provided on the inner wall of the opening. FIG. 7A shows an example in which the protective layer 120 is formed before formation of the opening described later. FIG. 7B shows an example in which the protective layer 120 is not formed in the vicinity of the opening. FIG. 8 shows an example in which the protective layer 120 is formed after attachment of the FPC 808.

FIGS. 7A and 7B and FIG. 8 each show an example in which the conductive layer 110a is positioned closer to the conductive layer 110b than the insulating layer 815 is. The insulating layer 815 is provided to cover the end portions of the conductive layer 110a. The connector 825 is connected to the terminal 110 through an opening provided in the substrate 803, the adhesive layer 841, the insulating layer 843, the bonding layer 121, the insulating layer 817, and the insulating layer 815.

For the conductive layer 120, for example, a material containing aluminum oxide, hafnium oxide, zirconium oxide, titanium oxide, zinc oxide, indium oxide, tin oxide, indium tin oxide, tantalum oxide, silicon oxide, manganese oxide, nickel oxide, erbium oxide, cobalt oxide, tellurium oxide, barium titanate, titanium nitride, tantalum nitride, aluminum nitride, tungsten nitride, cobalt nitride, manganese nitride, hafnium nitride, or the like can be used; specifically, a material containing any of these materials as a main component is preferable. Aluminum oxide, hafnium oxide, silicon nitride, or the like is particularly preferable because it has extremely low moisture permeability and can secure barrier properties even in the form of a thin film.

Figure 9:
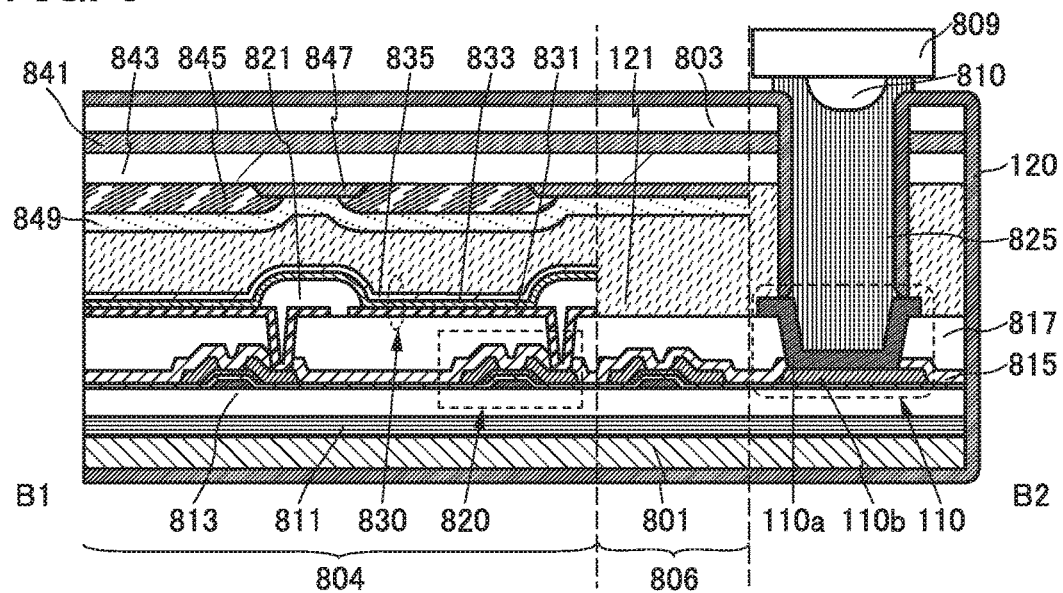
FIG. 9 illustrates an example of a light-emitting panel of Embodiment.

Furthermore, in addition to the FPC 808, an IC may be mounted by a COG method, a COF method, or the like. FIG. 9 shows a schematic cross-sectional view in which an IC 809 is electrically connected to the terminal 110.

The IC 809 includes a terminal 810. The terminal 810 is electrically connected to the terminal 110 through the connector 825.

Specific Example 2

FIG. 6B is a plan view of a light-emitting panel, and FIG. 6D is an example of a cross-sectional view taken along dashed-dotted line B3-B4 in FIG. 6B. The light-emitting panel described in Specific Example 2 is a top-emission light-emitting panel using a color filter method, which is different from that described in Specific Example 1. Portions different from those in Specific Example 1 will be described in detail here and the descriptions of portions common to those in Specific Example 1 will be omitted.

The light-emitting panel illustrated in FIG. 6D is different from the light-emitting panel illustrated in FIG. 6C in the aspects below.

The light-emitting panel illustrated in FIG. 6D includes a spacer 827 over the insulating layer 821. The spacer 827 can adjust the distance between the substrate 801 and the substrate 803.

In the light-emitting panel illustrated in FIG. 6D, the substrate 801 and the substrate 803 have different sizes. The connector 825 is positioned over the insulating layer 843 and thus does not overlap with the substrate 803. The connector 825 is connected to terminal 110 through the opening provided in the insulating layer 843 and the bonding layer 121. Since no opening needs to be provided in the substrate 803, there is no limitation on the material of the substrate 803.

The protective layer 120 is provided to cover the exposed portion of the light-emitting panel. Specifically, the protective layer 120 is provided to partially or entirely cover the exposed portions of the substrate 803, the adhesive layer 841, the insulating layer 843, the bonding layer 121, the insulating layer 817, the insulating layer 815, the insulating layer 813, the adhesive layer 811, the substrate 801, and the like.

Specific Example 3

FIG. 10A is a plan view of a light-emitting panel, and FIG. 10C is an example of a cross-sectional view taken along dashed-dotted line B5-B6 in FIG. 10A. The light-emitting panel described in Specific Example 3 is a top-emission light-emitting panel using a separate coloring method. Here, the difference from Specific Example 1 and Specific Example 2 is described in detail, and description of the same points is omitted.

The light-emitting panel shown in FIGS. 10A and 10C includes a frame-shaped bonding layer 125. The substrate 803 is provided in contact with the bonding layer 121 and the frame-shaped bonding layer 125.

The light-emitting panel shown in FIG. 10C includes the substrate 801, the bonding layer 811, the insulating layer 813, the plurality of transistors, the terminal 110 (the conductive layer 110a and the conductive layer 110b), the insulating layer 815, the insulating layer 817, the plurality of light-emitting elements 830, the insulating layer 821, the bonding layer 121, the frame-shaped bonding layer 125, the substrate 803, and the protective layer 120. The frame-shaped bonding layer 125, the protective layer 120, and the substrate 803 transmit visible light.

The frame-shaped bonding layer 125 is preferably a layer having higher gas barrier properties than the bonding layer 121. Accordingly, external moisture or oxygen can be prevented from entering the light-emitting panel. Thus, the light-emitting panel can be highly reliable.

In Specific Example 3, light emitted from the light-emitting element 830 in the light-emitting panel is extracted through the bonding layer 121. For this reason, the bonding layer 121 preferably has a higher light-transmitting property and a higher refractive index than the frame-shaped sealing layer 125. Furthermore, the volume of the bonding layer 121 is preferably less reduced by curing than that of the frame-shaped bonding layer 125.

The connector 825 is connected to the terminal 110 through an opening provided in the substrate 803 and the bonding layer 121.

The light-emitting panel in Specific Example 3 can be manufactured in the following manner: the insulating layer 813, the transistor 820, and the light-emitting element 830 are formed over a formation substrate with high heat resistance; the formation substrate is separated; and the insulating layer 813, the transistor 820, and the light-emitting element 830 are transferred to the substrate 801 and attached thereto with the adhesive layer 811. A transistor and the like can be formed over the formation substrate with high heat resistance; thus, a highly reliable transistor and a film with sufficiently low water permeability can be formed at high temperatures. Then, the transistor and the film are transferred to the substrate 801, whereby a highly reliable light-emitting panel can be manufactured. Thus, according to one embodiment of the present invention, a thin and/or light-weight and highly reliable light-emitting panel can be provided.

The protective layer 120 is provided to cover the exposed portion of the light-emitting panel. Specifically, the protective layer 120 is provided to partially or entirely cover the exposed portions of the substrate 803, the bonding layer 121, the bonding layer 125, the insulating layer 817, the insulating layer 815, the insulating layer 813, the adhesive layer 811, the substrate 801, and the like.

Specific Example 4

FIG. 10B is a plan view of a light-emitting panel, and FIG. 10D is an example of a cross-sectional view taken along dashed-dotted line B7-B8 in FIG. 10B. The light-emitting panel described in Specific Example 4 is a bottom-emission light-emitting panel using a color filter method. Here, the difference from Specific Examples 1 to 3 is described in detail, and description of the same points is omitted.

The light-emitting panel illustrated in FIG. 10D includes the substrate 801, the adhesive layer 811, the insulating layer 813, the plurality of transistors, the terminal 110 (the conductive layer 110a and the conductive layer 110b), the insulating layer 815, the coloring layer 845, an insulating layer 817a, an insulating layer 817b, a conductive layer 816, the plurality of light-emitting elements 830, the insulating layer 821, the bonding layer 121, the substrate 803, and the protective layer 120. The substrate 801, the adhesive layer 811, the insulating layer 813, the insulating layer 815, the insulating layer 817a, and the insulating layer 817b transmit visible light.

FIG. 10D shows the case where the light-emitting portion 804 includes the transistor 820 and a transistor 822. The upper electrode 835 preferably reflects visible light. The lower electrode 831 transmits visible light. The coloring layer 845 that overlaps with the light-emitting element 830 can be provided anywhere; for example, the coloring layer 845 may be provided between the insulating layers 817a and 817b or between the insulating layers 815 and 817a.

In FIG. 10D, two of the transistors included in the driver circuit portion 806 are illustrated.

In this example, the conductive layer 110b is formed using the same material and the same step(s) as those of the conductive layer 816. In FIG. 10D, the conductive layer 816 is drawn out in a region not covered with the substrate 803, and part thereof functions as the conductive layer 110b. As shown in FIG. 10D, the portion of the conductive layer 816, which is not covered with the conductive layer 110a may be covered with the protective layer 120.

The light-emitting panel in Specific Example 4 can be manufactured in the following manner: the insulating layer 813, the transistor 820, the light-emitting element 830, and the like are formed over a formation substrate with high heat resistance; the formation substrate is separated; and the insulating layer 813, the transistor 820, the light-emitting element 830, and the like are transferred to the substrate 801 and attached thereto with the adhesive layer 811. A transistor and the like can be formed over the formation substrate with high heat resistance; thus, a highly reliable transistor and a film with sufficiently low water permeability can be formed at high temperatures. Then, the transistor and the film are transferred to the substrate 801, whereby a highly reliable light-emitting panel can be manufactured. Thus, according to one embodiment of the present invention, a thin and/or lightweight and highly reliable light-emitting panel can be provided.

The protective layer 120 is provided to cover the exposed portion of the light-emitting panel. Specifically, the protective layer 120 is provided to partially or entirely cover the exposed portions of the substrate 803, the bonding layer 121, the insulating layer 817b, the insulating layer 817a, the conductive layer 816, the insulating layer 815, the insulating layer 813, the adhesive layer 811, the substrate 801, and the like.

Figure 11:
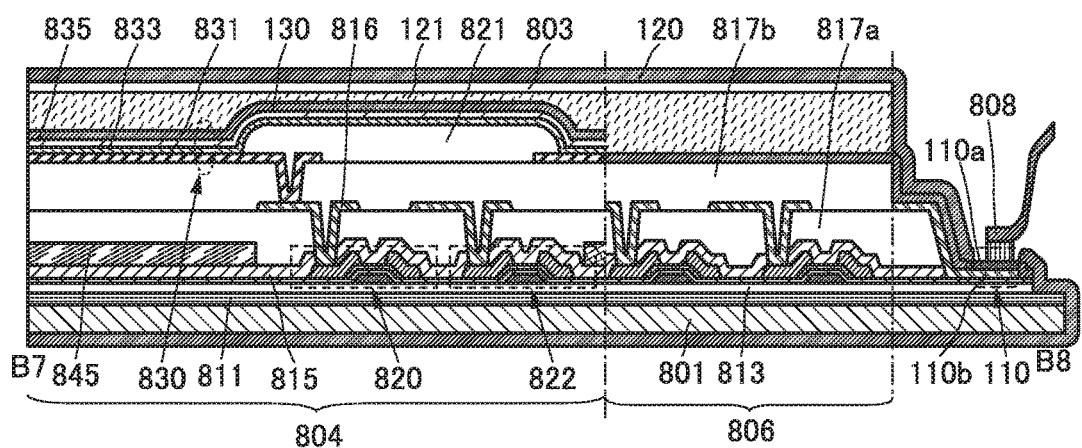
FIG. 11 illustrates an example of a light-emitting panel of Embodiment.

As shown in FIG. 11, the protective layer 130 which covers the light-emitting element 830 may be provided. The protective layer 130 has an opening in a position overlapping with the terminal 110. By the protective layer 130, impurities such as water can be prevented from diffusing into the light-emitting element 830 and the like through the bonding layer 121. As shown in FIG. 11, with the structure including both the protective layer 130 and the protective layer 120, diffusion of impurities into the light-emitting element 830 and the like can be suppressed more effectively, whereby an extremely highly reliable functional light-emitting panel can be provided.

Specific Example 5

FIG. 10E illustrates an example of a light-emitting panel that is different from those in Specific Examples 1 to 4. Here, the difference from Specific Examples 1 to 4 is described in detail, and description of the same points is omitted The light-emitting panel illustrated in FIG. 10E includes the substrate 801, the adhesive layer 811, the insulating layer 813, a conductive layer 814, a conductive layer 857a, a conductive layer 857b, the terminal 110 (the conductive layer 110a and the conductive layer 110b), the light-emitting element 830, the insulating layer 821, the bonding layer 121, and the substrate 803.

The conductive layer 857a and the conductive layer 857b are each electrically connected to the light-emitting element 830. Furthermore, part of the conductive layer 857a and part of the conductive layer 857b each function as the conductive layer 110b that is part of the terminal 110. The conductive layer 110a is provided over the conductive layer 110b, which are included in the terminal 110. The terminal 110 serves as an external connection electrode of the light-emitting panel, which can be electrically connected to an FPC or the like.

The light-emitting element 830 includes the lower electrode 831, the EL layer 833, and the upper electrode 835. An end portion of the lower electrode 831 is covered with the insulating layer 821. The light-emitting element 830 is a bottom-emission, top-emission, or dual-emission light-emitting element. An electrode, a substrate, an insulating layer, and the like on the light extraction side transmit visible light. The conductive layer 814 is electrically connected to the lower electrode 831.

The substrate through which light is extracted may have, as a light extraction structure, a hemispherical lens, a micro lens array, a film provided with an uneven surface structure, a light diffusing film, or the like. For example, the substrate with a light extraction structure can be formed by attaching the above lens or film to a resin substrate with an adhesive or the like having substantially the same refractive index as the substrate or the lens or film.

The conductive layer 814 is preferably, though not necessarily, provided because voltage drop due to the resistance of the lower electrode 831 can be inhibited. In addition, for a similar purpose, a conductive layer electrically connected to the upper electrode 835 may be provided over the insulating layer 821, the EL layer 833, the upper electrode 835, or the like.

The conductive layer 814 can be a single layer or a stacked layer formed using a material selected from copper, titanium, tantalum, tungsten, molybdenum, chromium, neodymium, scandium, nickel, and aluminum, an alloy material containing any of these materials as its main component, and the like. The thickness of the conductive layer 814 can be, for example, greater than or equal to 0.1 μm and less than or equal to 3 μm, preferably greater than or equal to 0.1 μm and less than or equal to 0.5 μm.

When a paste (e.g., silver paste) is used as a material for the conductive layer electrically connected to the upper electrode 835, metal particles forming the conductive layer aggregate; therefore, the surface of the conductive layer is rough and has many gaps. Thus, it is difficult for the EL layer 833 to completely cover the conductive layer; accordingly, the upper electrode and the conductive layer are preferably electrically connected to each other easily.

The light-emitting panel in Specific Example 5 can be manufactured in the following manner: the insulating layer 813, the light-emitting element 830, and the like are formed over a formation substrate with high heat resistance; the formation substrate is separated; and the insulating layer 813, the light-emitting element 830, and the like are transferred to the substrate 801 and attached thereto with the adhesive layer 811. A film with sufficiently low water permeability is formed at high temperatures over the formation substrate having high heat resistance and transferred to the substrate 801, whereby a highly reliable light-emitting panel can be manufactured. Thus, according to one embodiment of the present invention, a thin and/or lightweight and highly reliable light-emitting panel can be provided.

The protective layer 120 is provided to cover the exposed portion of the light-emitting panel. Specifically, the protective layer 120 is provided to partially or entirely cover the exposed portions of the substrate 803, the bonding layer 121, the insulating layer 813, the adhesive layer 811, the substrate 801, and the like. The protective layer 120 has openings overlapping with parts of the surfaces of the conductive layer 110a over the conductive layer 857a and the conductive layer 857b.

Note that although the case where the light-emitting element is used as a display element is described here, one embodiment of the present invention is not limited thereto.

For example, a display element such as a micro electro mechanical systems (MEMS) element or an electron-emissive element can be used in the display device. Examples of MEMS display elements include a MEMS shutter display element, an optical interference type MEMS display element, and the like. A carbon nanotube may be used for the electron emitter. Alternatively, electronic paper may be used. As the electronic paper, an element using a microcapsule method, an electrophoretic method, an electrowetting method, an Electronic Liquid Powder (registered trademark) method, or the like can be used.

[Examples of Materials]

Next, materials and the like that can be used for a light-emitting panel are described. Note that description of the components already described in this specification is omitted in some cases.

For each of the substrates, a material such as glass, quartz, an organic resin, a metal, or an alloy can be used. The substrate on the side from which light from the light-emitting element is extracted is formed using a material which transmits the light.

It is particularly preferable to use a flexible substrate. For example, it is possible to use glass, a metal, or an alloy that is thin enough to have flexibility, or an organic resin.

An organic resin, which has a smaller specific gravity than glass, is preferably used for the flexible substrate, in which case the light-emitting panel can be lighter in weight than that using glass.

A material with high toughness is preferably used for the substrates. In that case, a robust light-emitting panel with high impact resistance can be provided. For example, when an organic resin substrate or a metal or alloy substrate with a small thickness is used, the light-emitting panel can be lighter in weight and more robust than that using a glass substrate.

A metal material and an alloy material, which have high thermal conductivity, are preferred because they can easily conduct heat to the whole substrate and accordingly can prevent a local temperature rise in the light-emitting panel. The thickness of a substrate using a metal material or an alloy material is preferably greater than or equal to 10 µm and less than or equal to 200 µm, further preferably greater than or equal to 20 µm and less than or equal to 50 µm.

Examples of a material for the metal substrate or the alloy substrate include, but not limited to, a metal such as aluminum, copper, iron, titanium, or nickel; and an alloy containing one or more metals selected from the metals. As the alloy, for example, an aluminum alloy or stainless steel can be favorably used.

Furthermore, when a material with high thermal emissivity is used for the substrate, the surface temperature of the light-emitting panel can be prevented from rising, leading to prevention of breakage or a decrease in reliability of the light-emitting panel. For example, the substrate may have a stacked-layer structure of a metal substrate and a layer with high thermal emissivity (e.g., the layer can be formed using a metal oxide or a ceramic material).

Examples of such a material having flexibility and a light-transmitting property include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose coefficient of thermal expansion is low is preferred, and for example, a polyamide imide resin, a polyimide resin, or PET can be suitably used. A substrate in which a fibrous body is impregnated with a resin (also referred to as prepreg) or a substrate whose coefficient of thermal expansion is reduced by mixing an organic resin with an inorganic filler can also be used.

The flexible substrate may have a stacked structure in which a hard coat layer (such as a silicon nitride layer) by which a surface of a light-emitting device is protected from damage, a layer (such as an aramid resin layer) which can disperse pressure, or the like is stacked over a layer of any of the above-mentioned materials.

The flexible substrate may be formed by stacking a plurality of layers. When a glass layer is used, a barrier property against water and oxygen can be improved and thus a reliable light-emitting panel can be provided.

A flexible substrate in which a glass layer, a bonding layer, and an organic resin layer are stacked from the side closer to a light-emitting element is preferably used. The thickness of the glass layer is greater than or equal to 20 µm and less than or equal to 200 µm, preferably greater than or equal to 25 µm and less than or equal to 100 µm. With such a thickness, the glass layer can have both a high barrier property against water and oxygen and high flexibility. The thickness of the organic resin layer is greater than or equal to 10 µm and less than or equal to 200 µm, preferably greater than or equal to 20 µm and less than or equal to 50 µm. Providing such an organic resin layer, occurrence of a crack or a break in the glass layer can be suppressed and mechanical strength can be improved. With the substrate that includes such a composite material of a glass material and an organic resin, a highly reliable and flexible light-emitting panel can be provided.

As the adhesive layer or the bonding layer, various curable adhesives such as a reactive curable adhesive, a thermosetting adhesive, an anaerobic adhesive, and a photo curable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Further, the resin may include a drying agent. For example, a substance that adsorbs water by chemical adsorption, such as oxide of an alkaline earth metal (e.g., calcium oxide or barium oxide), can be used. Alternatively, a substance that adsorbs water by physical adsorption, such as zeolite or silica gel, may be used. The drying agent is preferably included because it can prevent impurities such as water from entering the functional element, thereby improving the reliability of the light-emitting panel.

In addition, it is preferable to mix a filler with a high refractive index or light-scattering member into the resin, in which case light extraction efficiency from the light-emitting element can be enhanced. For example, titanium oxide, barium oxide, zeolite, zirconium, or the like can be used.

The structure of the transistors in the light-emitting panel is not particularly limited. For example, a forward staggered transistor or an inverted staggered transistor may be used. A top-gate transistor or a bottom-gate transistor may be used. There is no particular limitation on a semiconductor material used for the transistors; for example, silicon, germanium, silicon carbide, or gallium nitride can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

Here, an oxide semiconductor is preferably used for semiconductor devices such as transistors used for pixels, driver circuits, touch sensors described later, and the like. In particular, an oxide semiconductor having a wider band gap than silicon is preferably used. A semiconductor material having a wider band gap and a lower carrier density than silicon is preferably used because off-state leakage current of the transistor can be reduced.

For example, the oxide semiconductor preferably contains at least indium (In) or zinc (Zn). More preferably, the oxide semiconductor contains an In-M-Zn-based oxide (M is a metal such as Al, Ti, Ga, Ge, Y, Zr, Sn, La, Ce, or Hf).

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which a grain boundary is not observed between adjacent crystal parts.

There is no grain boundary in such an oxide semiconductor; therefore, generation of a crack in an oxide semiconductor film which is caused by stress when a display panel is bent is prevented. Therefore, such an oxide semiconductor can be preferably used for a flexible display panel which is used in a bent state, or the like.

Moreover, the use of such an oxide semiconductor with crystallinity for the semiconductor layer makes it possible to provide a highly reliable transistor in which a change in the electrical characteristics is suppressed.

A transistor with an oxide semiconductor whose band gap is larger than the band gap of silicon can hold charges stored in a capacitor that is series-connected to the transistor for a long time, owing to the low off-state current of the transistor. When such a transistor is used for a pixel, operation of a driver circuit can be stopped while a gray scale of an image displayed in each display region is maintained. As a result, an electronic device with an extremely low power consumption can be obtained.

For stable characteristics of the transistor, a base film is preferably provided. The base film can be formed with an inorganic insulating film such as a silicon oxide film, a silicon nitride film, a silicon oxynitride film, or a silicon nitride oxide film to have a single-layer structure or a stacked-layer structure. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided if not necessary. In each of the above Structure Examples, the insulating layer 813 can serve as a base film of the transistor.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive layer. For example, a stack of an alloy of silver and magnesium and indium tin oxide is preferably used because the conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy of silver and copper is preferable because of its high heat resistance. Furthermore, when a metal film or a metal oxide film is stacked in contact with an aluminum film or an aluminum alloy film, oxidation can be prevented. Examples of a material for the metal film or the metal oxide film are titanium, titanium oxide, and the like. Alternatively, the conductive film having a property of transmitting visible light and a film containing any of the above metal materials may be stacked. For example, a stack of silver and indium tin oxide, a stack of an alloy of silver and magnesium and indium tin oxide, or the like can be used.

The electrodes may be formed separately by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. The above-described layers included in the EL layer 833 can be formed separately by any of the following methods: an evaporation method (including a vacuum evaporation method), a transfer method, a printing method, an inkjet method, a coating method, and the like.

In the case where a light-emitting element emitting white light is used as the light-emitting element 830, the EL layer 833 preferably contains two or more kinds of light-emitting substances. For example, light-emitting substances are selected so that two or more light-emitting substances emit complementary colors to obtain white light emission. Specifically, it is preferable to contain two or more light-emitting substances selected from light-emitting substances emitting light of red (R), green (G), blue (B), yellow (Y), orange (O), and the like and light-emitting substances emitting light containing two or more of spectral components of R, G, and B. The light-emitting element 830 preferably emits light with a spectrum having two or more peaks in the wavelength range of a visible light region (e.g., 350 nm to 750 nm). An emission spectrum of a material emitting light having a peak in the wavelength range of a yellow light preferably includes spectral components also in the wavelength range of a green light and a red light.

A light-emitting layer containing a light-emitting material emitting light of one color and a light-emitting layer containing a light-emitting material emitting light of another color are preferably stacked in the EL layer 833. For example, the plurality of light-emitting layers in the EL layer 833 may be stacked in contact with each other or may be stacked with a region not including any light-emitting material therebetween. For example, between a fluorescent layer and a phosphorescent layer, a region containing the same material as one in the fluorescent layer or phosphorescent layer (for example, a host material or an assist material) and no light-emitting element may be provided. This facilitates the manufacture of the light-emitting element and reduces the drive voltage.

The light-emitting element 830 may be a single element including one EL layer or a tandem element in which a plurality of EL layers are stacked with a charge generation layer therebetween.

The light-emitting element is preferably provided between a pair of insulating films with low water permeability. Thus, an impurity such as water can be prevented from entering the light-emitting element, leading to prevention of a decrease in the reliability of the light-emitting device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the moisture vapor transmission rate of the insulating film with low water permeability is lower than or equal to $1\times 10^{-5}$ [g/(m$^2$·day)], preferably lower than or equal to $1\times 10^{-6}$ [g/(m$^2$·day)], further preferably lower than or equal to $1\times 10^{-7}$ [g/(m$^2$·day)], still further preferably lower than or equal to $1\times 10^{-8}$ [g/(m$^2$·day)].

The insulating layers 813 and 843 are each preferably formed using an insulating film with low water permeability.

As the insulating layer 815, for example, an inorganic insulating film such as a silicon oxide film, a silicon oxynitride film, or an aluminum oxide film can be used. For example, as each of the insulating layers 817, 817*a*, and 817*b*, an organic material such as polyimide, acrylic, polyamide, polyimide amide, or a benzocyclobutene-based resin can be used. Alternatively, a low-dielectric constant material (a low-k material) or the like can be used. Furthermore, each of the insulating layers may be formed by stacking a plurality of insulating films.

The insulating layer 821 is formed using an organic insulating material or an inorganic insulating material. As a resin, for example, a polyimide resin, a polyamide resin, an acrylic resin, a siloxane resin, an epoxy resin, or a phenol resin can be used. It is particularly preferable that the insulating layer 821 be formed to have an inclined side wall with curvature, using a photosensitive resin material.

There is no particular limitation on the method for forming the insulating layer 821; a photolithography method, a sputtering method, an evaporation method, a droplet discharging method (e.g., an ink-jet method), a printing method (e.g., a screen printing method or an off-set printing method), or the like may be used.

The spacer 827 can be formed using an inorganic insulating material, an organic insulating material, a metal material, or the like. As the inorganic insulating material and the organic insulating material, for example, a variety of materials that can be used for the insulating layer can be used. As the metal material, titanium, aluminum, or the like can be used. When the spacer 827 containing a conductive material and the upper electrode 835 are electrically connected to each other, a potential drop due to the resistance of the upper electrode 835 can be suppressed. The spacer 827 may have either a tapered shape or an inverse tapered shape.

A conductive layer included in the light-emitting panel, which functions as an electrode or a wiring of the transistor, an auxiliary electrode of the light-emitting element, or the like, can be formed to have a single-layer structure or a stacked-layer structure using any of metal materials such as molybdenum, titanium, chromium, tantalum, tungsten, aluminum, copper, neodymium, and scandium, and an alloy material containing any of these elements, for example. Alternatively, the conductive layer may be formed using a conductive metal oxide. The conductive layer may be formed using a conductive metal oxide such as indium oxide (e.g., $In_2O_3$), tin oxide (e.g., $SnO_2$), zinc oxide (ZnO), indium tin oxide, indium zinc oxide (e.g., $In_2O_3$—ZnO), or any of these metal oxide materials containing silicon oxide.

The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer is provided between the adjacent coloring layers. The light-blocking layer blocks light emitted from an adjacent light-emitting element to prevent color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix may be formed using a resin material containing a metal material, pigment, or dye. Note that it is preferable to provide the light-blocking layer in a region other than the light-emitting portion, such as a driver circuit portion, in which case undesired leakage of guided light or the like can be suppressed.

Furthermore, an overcoat covering the coloring layer and the light-blocking layer may be provided. The overcoat can prevent an impurity and the like contained in the coloring layer from being diffused into the light-emitting element. The overcoat is formed with a material that transmits light emitted from the light-emitting element; for example, an inorganic insulating film such as a silicon nitride film or a silicon oxide film, an organic insulating film such as an acrylic film or a polyimide film can be used, and further, a stacked structure of an organic insulating film and an inorganic insulating film may be employed.

In the case where upper surfaces of the coloring layer and the light-blocking layer are coated with a material of the bonding layer, a material which has high wettability with respect to the material of the bonding layer is preferably used as the material of the overcoat. For example, an oxide conductive film such as an indium tin oxide film or a metal film such as an Ag film which is thin enough to transmit visible light is preferably used as the overcoat.

For the connector, it is possible to use a paste-like or sheet-like material which is obtained by mixing metal particles into a thermosetting resin and for which anisotropic electric conductivity is provided by thermocompression bonding. As the metal particles, particles in which two or more kinds of metals are layered, for example, nickel particles coated with gold are preferably used. Alternatively, a particulate resin whose surface is coated with a metal is preferably used.

[Example of Manufacturing Method]

Next, an example of a method for manufacturing a light-emitting panel is described with reference to FIGS. 12A to 12C and FIGS. 13A to 13C. Here, the manufacturing method is described using the light-emitting panel of Specific Example 1 (FIG. 6C) as an example.

Figure 12A:
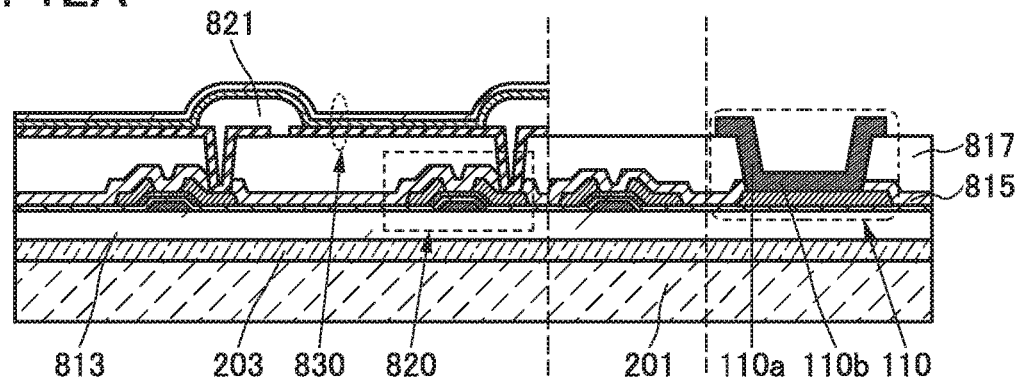
FIGS. 12A to 12C illustrate an example of a method for manufacturing a light-emitting panel of Embodiment.

First, a separation layer 203 is formed over a formation substrate 201, and the insulating layer 813 is formed over the separation layer 203. Next, the plurality of transistors, the terminal 110 (the conductive layer 110a and the conductive layer 110b), the insulating layer 815, the insulating layer 817, the plurality of light-emitting elements, and the insulating layer 821 are formed over the insulating layer 813. An opening is formed in the insulating layers 821, 817, and 815 to expose the conductive layer 110b and the conductive layer 110a is formed so as to fill the opening (FIG. 12A).

Figure 12B:
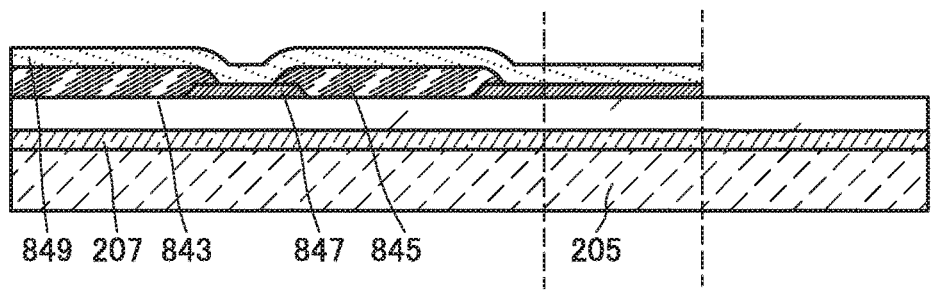

In addition, a separation layer 207 is formed over a formation substrate 205, and the insulating layer 843 is formed over the separation layer 207. Next, the light-blocking layer 847, the coloring layer 845, and the overcoat 849 are formed over the insulating layer 843 (FIG. 12B).

The formation substrate 201 and the formation substrate 205 each can be a glass substrate, a quartz substrate, a sapphire substrate, a ceramic substrate, a metal substrate, or the like.

For the glass substrate, for example, a glass material such as aluminosilicate glass, aluminoborosilicate glass, or barium borosilicate glass can be used. When the temperature of the heat treatment performed later is high, a substrate having a strain point of 730° C. or higher is preferably used as the glass substrate. Note that by containing a large amount of barium oxide (BaO), a glass substrate which is heat-resistant and more practical can be obtained. Alternatively, crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 203 and the separation layer 207 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or polycrystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. It is to be noted that a mixture of tungsten and molybdenum is an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating film formed later can be controlled.

Each of the insulating layers can be formed by a sputtering method, a plasma CVD method, a coating method, a printing method, or the like. For example, the insulating layer is formed at a temperature of higher than or equal to 250° C. and lower than or equal to 400° C. by a plasma CVD method, whereby the insulating layer can be a dense film with very low water permeability.

Figure 12C:
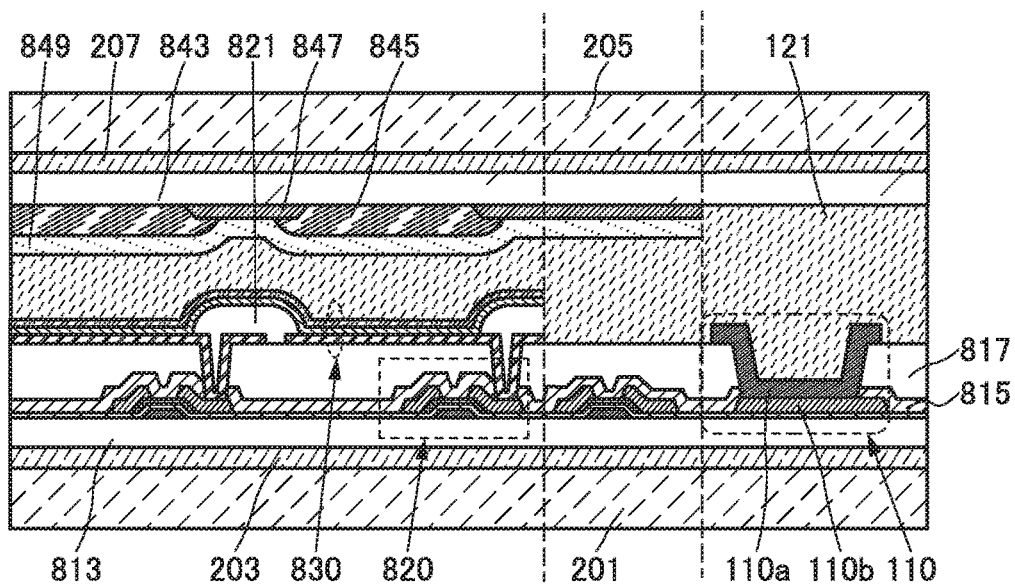

Then, a material for the bonding layer 121 is applied to a surface of the formation substrate 205 over which the coloring layer 845 and the like are formed or a surface of the formation substrate 201 over which the light-emitting element 230 and the like are formed, and the formation substrate 201 and the formation substrate 205 are attached so that these two surfaces face each other with the bonding layer 121 provided therebetween (FIG. 12C).

Next, the formation substrate 201 is separated, and the exposed insulating layer 813 and the substrate 801 are attached to each other with the adhesive layer 811. Furthermore, the formation substrate 205 is separated, and the exposed insulating layer 843 and the substrate 803 are attached to each other with the adhesive layer 841. Although the substrate 803 does not overlap with the terminal 110 in FIG. 13A, the substrate 803 may overlap with the terminal 110.

Any of a variety of methods can be used as appropriate for the separation process. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between a formation substrate having high heat resistance and a layer to be separated, the amorphous silicon film is removed by laser irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Further alternatively, a method carried out as follows may be employed: a film containing nitrogen, oxygen, hydrogen, or the like (e.g., an amorphous silicon film containing hydrogen, an alloy film containing hydrogen, or an alloy film containing oxygen) is used as the separation layer, and the separation layer is irradiated with laser to release the nitrogen, oxygen, or hydrogen contained in the separation layer as gas, thereby promoting separation between the layer to be separated and the formation substrate. Still further alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

When a plurality of the above-described separation methods are combined, the separation process can be performed easily. In other words, separation can be performed with physical force (by a machine or the like) after performing laser irradiation, etching on the separation layer with a gas, a solution, or the like, or mechanical removal with a sharp knife, scalpel or the like so that the separation layer and the layer to be separated can be easily separated from each other.

Separation of the layer to be separated from the formation substrate may be performed by soaking the interface between the separation layer and the layer to be separated in a liquid. Furthermore, the separation may be performed while a liquid such as water is being poured.

As another separation method, in the case where the separation layer is formed using tungsten, it is preferable that the separation be performed while etching the separation layer using a mixed solution of ammonium water and a hydrogen peroxide solution.

Note that the separation layer is not necessarily provided in the case where separation at an interface between the formation substrate and the layer to be separated is possible. For example, glass is used as the formation substrate, an organic resin such as polyimide, polyester, polyolefin, polyamide, polycarbonate, or acrylic is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated.

Figure 13A:
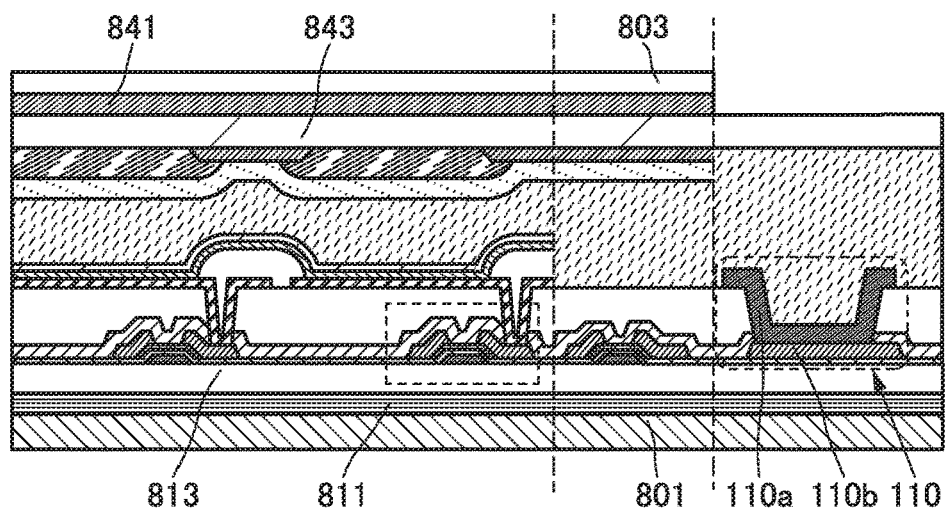
FIGS. 13A to 13C illustrate an example of a method for manufacturing a light-emitting panel of Embodiment.
Figure 13B:
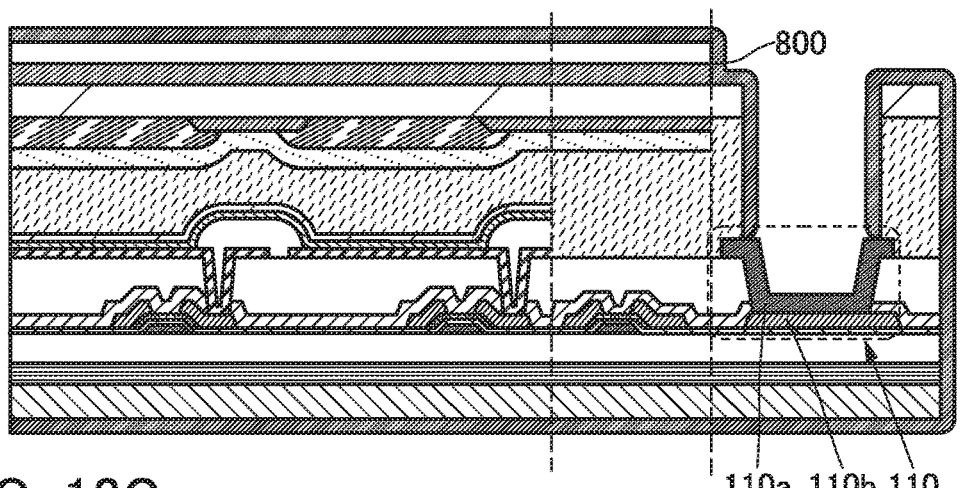
Figure 13C:
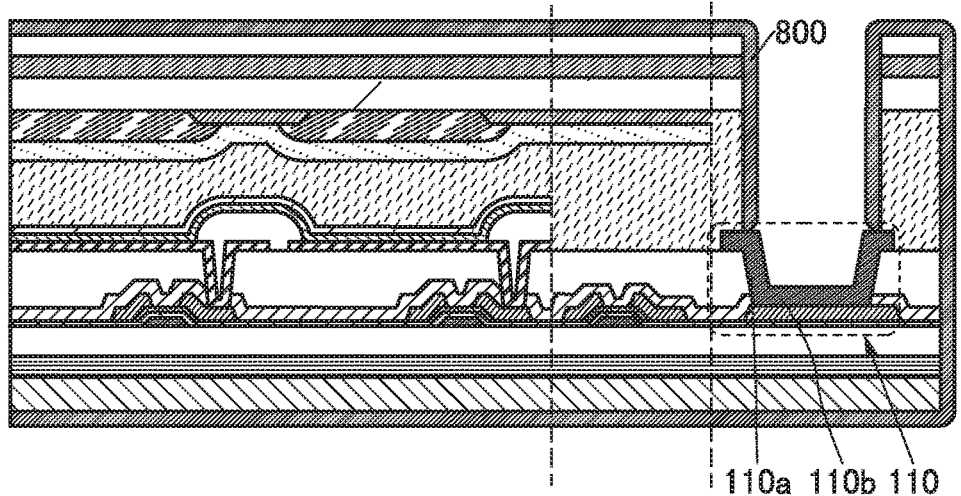

Lastly, an opening is formed in the insulating layer 843 and the bonding layer 121 to expose the terminal 110 (FIG. 13B). In the case where the substrate 803 overlaps with the terminal 110, an opening is formed also in the substrate 803 and the adhesive layer 841 so that the terminal 110 is exposed (FIG. 13C). There is no particular limitation on the method for forming the opening. For example, a laser ablation method, an etching method, an ion beam sputtering method, or the like may be used. As another method, a cut may be made in a film over the terminal 110 with a sharp knife or the like and part of the film may be separated by physical force.

Although an example in which the opening is formed after the formation of the insulating layer 843 and the bonding layer 121 is described, the insulating layer 843 and the bonding layer 121 can be prevented from being provided in advance in a portion to be the opening. Alternatively, the opening may be formed in such a manner that an adhesive tape is attached to a portion overlapping with the terminal 110 in advance and then peeled.

After that, the protective layer 120 is formed. By an ALD method, the protective layer 120 that is dense and uniform can be formed to cover the surface of the light-emitting panel. Examples of an apparatus that can be used for the film formation of the protective layer 120 are described later.

A deposition method such as a sputtering method or a CVD method, or a coating method using a liquid material, such as a spin coating method or a dipping method may be used for the protective layer 120.

The portion in which the protective layer 120 is not provided is subjected to masking treatment in advance, and the mask is removed after the formation of the protective layer 120, whereby the opening can be provided in the protective layer 120. As a material for the masking, a material that is easily removed in a later step, has heat resistance to the temperature at the deposition of the protective layer 120, and is stable to the deposition gas (or deposition liquid) is used. For example, an adhesive tape including polyimide or the like is preferably used.

Since the conductive layer 110*a* that is not easily oxidized is formed on the surface of the terminal 110, when the protective layer 120 is formed by an ALD method or the like, the portion in which the protective layer 120 is not formed is formed over the conductive layer 110*a* in a self-aligned manner without performing the above masking treatment.

In the above-described manner, the light-emitting panel can be manufactured.

At least part of this embodiment can be implemented in combination with any of the embodiments described in this specification as appropriate.

Embodiment 3

In this embodiment, structure examples of a foldable touch panel that is applicable to a display panel included in the display device of one embodiment of the present invention will be described with reference to FIGS. 14A to 14C, FIGS. 15A and 15B, FIGS. 16A to 16C, FIG. 17, and FIGS. 18A to 18C. Note that for a material of each layer, refer to Embodiment 2.

Structure Example 1

Figure 14A:
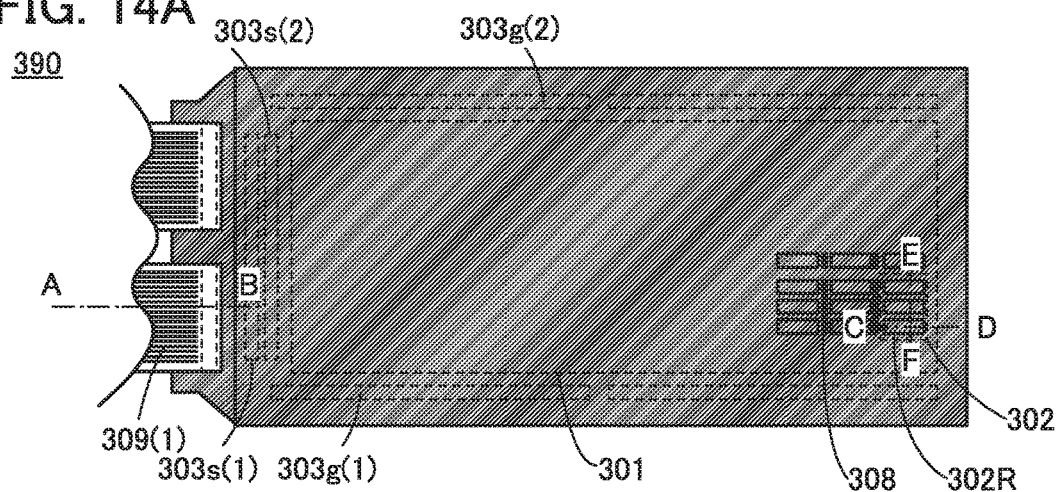
FIGS. 14A to 14C illustrate an example of a touch panel of Embodiment.
Figure 14B:
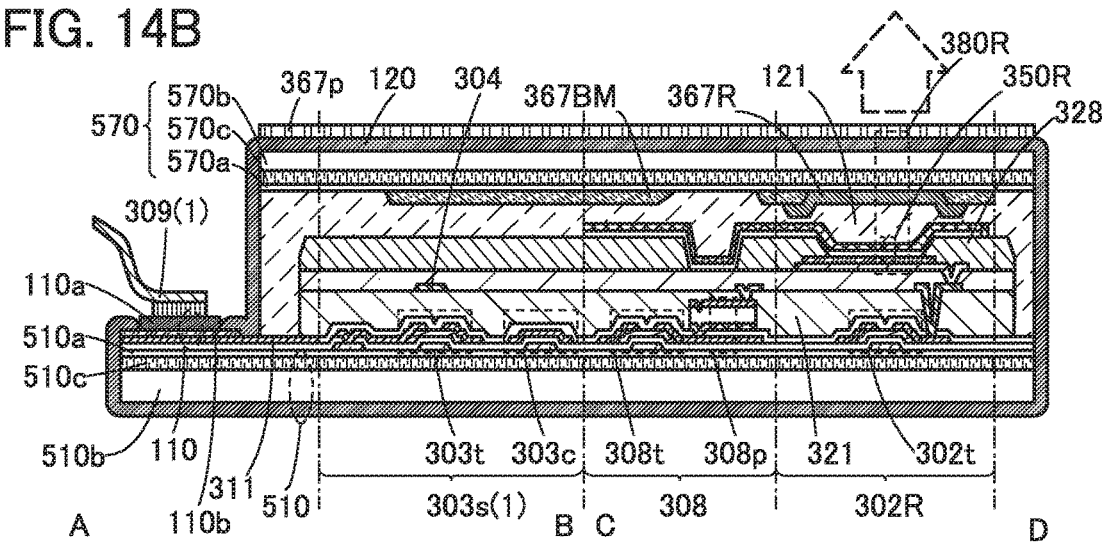
Figure 14C:
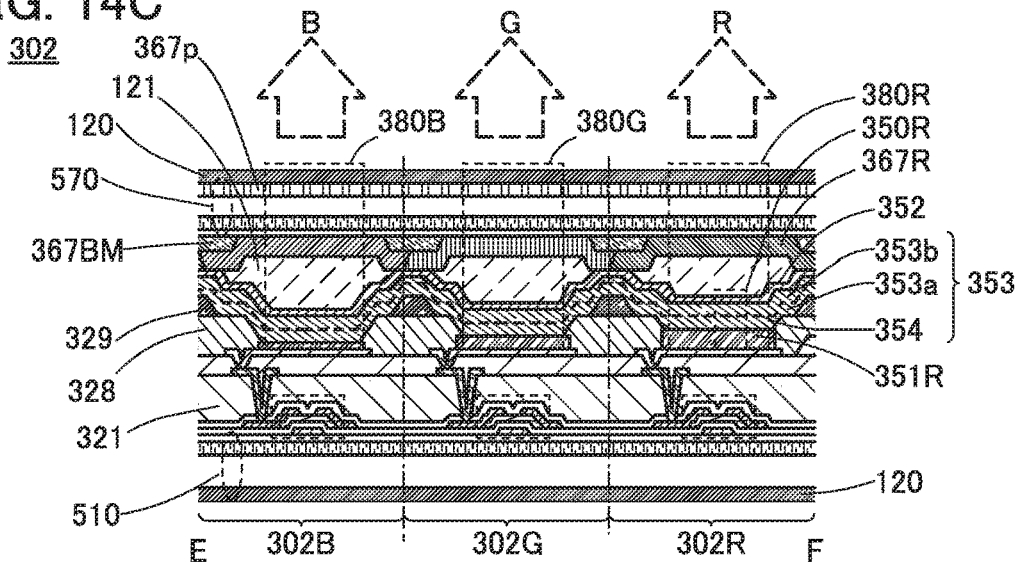

FIG. 14A is a top view of the touch panel 390. FIG. 14B is a cross-sectional view taken along dashed-dotted line A-B and dashed-dotted line C-D in FIG. 14A. FIG. 14C is a cross-sectional view taken along dashed-dotted line E-F in FIG. 14A.

As illustrated in FIG. 14A, the touch panel 390 includes a display portion 301.

The display portion 301 includes a plurality of pixels 302 and a plurality of imaging pixels 308. The imaging pixels 308 can sense a touch of a finger or the like on the display portion 301. Thus, a touch sensor can be formed using the imaging pixels 308.

Each of the pixels 302 includes a plurality of sub-pixels (e.g., a sub-pixel 302R). In addition, in the sub-pixels, light-emitting elements and pixel circuits that can supply electric power for driving the light-emitting elements are provided.

The pixel circuits are electrically connected to wirings through which selection signals are supplied and wirings through which image signals are supplied.

Furthermore, the touch panel 390 is provided with a scan line driver circuit 303g(1) that can supply selection signals to the pixels 302 and an image signal line driver circuit 303s(1) that can supply image signals to the pixels 302.

The imaging pixels 308 include photoelectric conversion elements and imaging pixel circuits that drive the photoelectric conversion elements.

The imaging pixel circuits are electrically connected to wirings through which control signals are supplied and wirings through which power supply potentials are supplied.

Examples of the control signal include a signal for selecting an imaging pixel circuit from which a recorded imaging signal is read, a signal for initializing an imaging pixel circuit, a signal for determining the time it takes for an imaging pixel circuit to sense light, and the like.

The touch panel 390 is provided with an imaging pixel driver circuit 303g(2) that can supply control signals to the imaging pixels 308 and an imaging signal line driver circuit 303s(2) that reads out imaging signals.

The touch panel 390 includes a substrate 510 and a substrate 570 facing the substrate 510 as illustrated in FIG. 14B.

Flexible materials can be favorably used for the substrate 510 and the substrate 570.

Materials with which passage of impurities is inhibited can be favorably used for the substrate 510 and the substrate 570. For example, materials with a vapor permeability of lower than or equal to $10^{-5}$ [g/m$^2$·day], preferably lower than or equal to $10^{-6}$ [g/m$^2$·day] can be favorably used.

The substrate 510 can be favorably formed using a material whose coefficient of linear expansion is substantially equal to that of the substrate 570. For example, the coefficient of linear expansion of the materials are preferably lower than or equal to $1\times10^{-3}$/K, further preferably lower than or equal to $5\times10^{-5}$/K, and still further preferably lower than or equal to $1\times10^{-5}$/K.

The substrate 510 is a stacked body including a flexible substrate 510b, an insulating layer 510a that prevents diffusion of impurities to the light-emitting elements, and an adhesive layer 510c that bonds the insulating layer 510a to the flexible substrate 510b.

The substrate 570 is a stacked body including a flexible substrate 570b, an insulating layer 570a that prevents diffusion of impurities to the light-emitting elements, and an adhesive layer 570c that bonds the insulating layer 570a to the flexible substrate 570b.

For example, a material including polyester, polyolefin, polyamide (e.g., nylon, aramid), polyimide, polycarbonate, polyurethane, an acrylic resin, an epoxy resin, or a resin including a siloxane bond can be used for the adhesive layer.

The bonding layer 121 bonds the substrate 570 to the substrate 510. The bonding layer 121 has a refractive index higher than that of air. In the case where light is extracted through the bonding layer 121, the bonding layer 121 also serves as a layer (hereinafter, also referred to as an optical bonding layer) that optically bonds two components (here, the substrates 510 and 570) between which the bonding layer 121 is sandwiched. The pixel circuits and the light-emitting elements (e.g., a first light-emitting element 350R) are provided between the substrate 510 and the substrate 570.

Each of the pixels 302 includes the sub-pixel 302R, a sub-pixel 302G, and a sub-pixel 302B (FIG. 14C). The sub-pixel 302R includes a light-emitting module 380R, the sub-pixel 302G includes a light-emitting module 380G, and the sub-pixel 302B includes a light-emitting module 380B.

For example, the sub-pixel 302R includes the first light-emitting element 350R and the pixel circuit that can supply electric power to the first light-emitting element 350R and includes a transistor 302t (FIG. 14B). Furthermore, the light-emitting module 380R includes the first light-emitting element 350R and an optical element (e.g., a coloring layer 367R).

The first light-emitting element 350R includes a first lower electrode 351R, an upper electrode 352, and an EL layer 353 between the first lower electrode 351R and the upper electrode 352 (FIG. 14C).

The EL layer 353 includes a first EL layer 353a, a second EL layer 353b, and an intermediate layer 354 between the first EL layer 353a and the second EL layer 353b.

The light-emitting module 380R includes the first coloring layer 367R on the substrate 570. The coloring layer transmits light of a particular wavelength and is, for example, a layer that selectively transmits light of red, green, or blue color. Note that a region that transmits light emitted from the light-emitting element as it is may be provided as well.

The light-emitting module 380R, for example, includes the bonding layer 121 that is in contact with the first light-emitting element 350R and the first coloring layer 367R.

The first coloring layer 367R is positioned in a region overlapping with the first light-emitting element 350R. Accordingly, part of light emitted from the first light-emitting element 350R passes through the bonding layer 121 that also serves as an optical bonding layer and through the first coloring layer 367R and is emitted to the outside of the light-emitting module 380R as indicated by arrows in FIGS. 14B and 14C.

The touch panel 390 includes a light-blocking layer 367BM on the substrate 570. The light-blocking layer 367BM is provided to surround the coloring layer (e.g., the first coloring layer 367R).

The touch panel 390 includes an anti-reflective layer 367p positioned in a region overlapping with the display portion 301. As the anti-reflective layer 367p, a circular polarizing plate can be used, for example.

The touch panel 390 includes an insulating layer 321. The insulating layer 321 covers the transistor 302t. Note that the insulating layer 321 can be used as a layer for planarizing unevenness caused by the pixel circuits. An insulating film on which a layer that can prevent diffusion of impurities to the transistor 302t and the like is stacked can be used as the insulating layer 321.

The touch panel 390 includes the light-emitting elements (e.g., the first light-emitting element 350R) over the insulating layer 321.

The touch panel 390 includes, over the insulating layer 321, a partition 328 that overlaps with an end portion of the first lower electrode 351R. In addition, a spacer 329 that controls the distance between the substrate 510 and the substrate 570 is provided on the partition 328.

The image signal line driver circuit 303s(1) includes a transistor 303t and a capacitor 303c. Note that the driver circuit and the pixel circuits can be formed in the same process over the same substrate. As illustrated in FIG. 14B, the transistor 303t may include a second gate 304 over the insulating layer 321. The second gate 304 may be electrically connected to a gate of the transistor 303t. Alternatively, different potentials may be supplied to the second gate 304 and the gate of the transistor 303t. The second gate 304 may be provided in a transistor 308t, the transistor 302t, or the like if necessary.

The imaging pixels 308 each include a photoelectric conversion element 308p and an imaging pixel circuit for sensing light received by the photoelectric conversion element 308p. The imaging pixel circuit includes the transistor 308t.

For example, a PIN photodiode can be used as the photoelectric conversion element 308p.

The touch panel 390 includes a wiring 311 through which a signal can be supplied. The wiring 311 is provided with the terminal 110. Note that an FPC 309(1) through which a signal such as an image signal or a synchronization signal can be supplied is electrically connected to the terminal 110. Note that a printed wiring board (PWB) may be attached to the FPC 309(1).

The terminal 110 has a stacked structure including the conductive layer 110b over the wiring 311 and the conductive layer 110a over the conductive layer 110b.

The protective layer 120 is provided to cover an exposed portion of the touch panel. Specifically, the protective layer 120 is provided to partially or entirely cover exposed portions of the substrate 570 (the flexible substrate 570b, the adhesive layer 570c, and the insulating layer 570a), the bonding layer 121, the substrate 510 (the flexible substrate 510b, the adhesive layer 510c, and the insulating layer 510a), and the like. The protective layer 120 has an opening overlapping with part of the surface of the terminal 110.

Transistors formed in the same process can be used as the transistor 302t, the transistor 303t, the transistor 308t, and the like. Embodiment 2 can be referred to for the structures of the transistors.

As a gate, source, and drain of a transistor, and a wiring or an electrode included in a touch panel, a single-layer structure or a stacked-layer structure using any of metals such as aluminum, titanium, chromium, nickel, copper, yttrium, zirconium, molybdenum, silver, tantalum, and tungsten, or an alloy containing any of these metals as its main component can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. Copper containing manganese is preferably used because controllability of a shape by etching is increased.

Structure Example 2

Figure 15A:
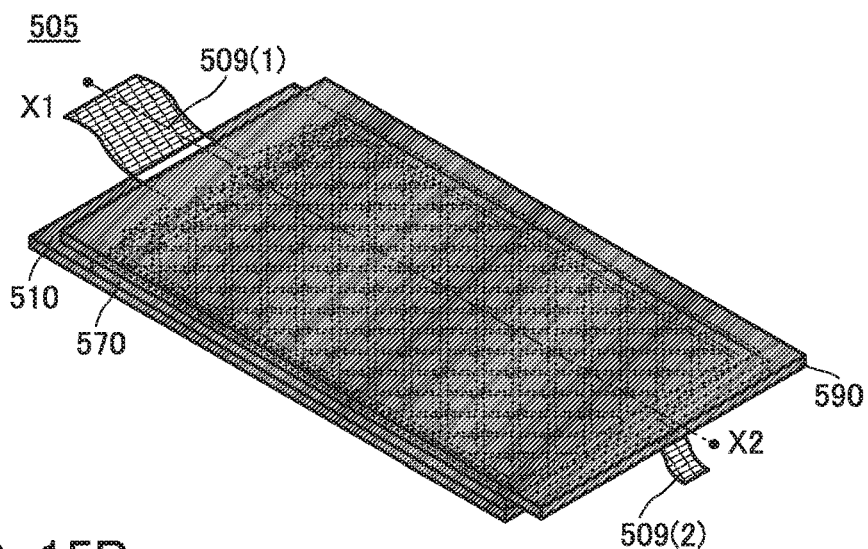
FIGS. 15A and 15B illustrate an example of a touch panel of Embodiment.
Figure 15B:
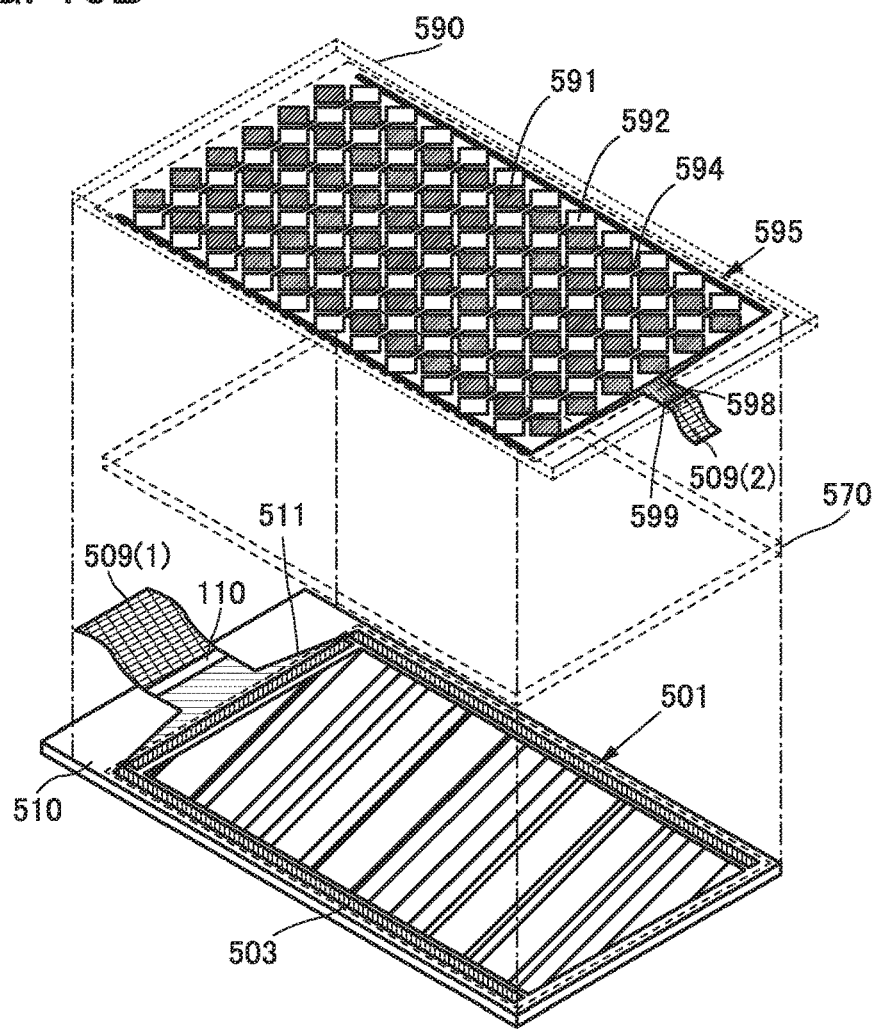
Figure 16A:
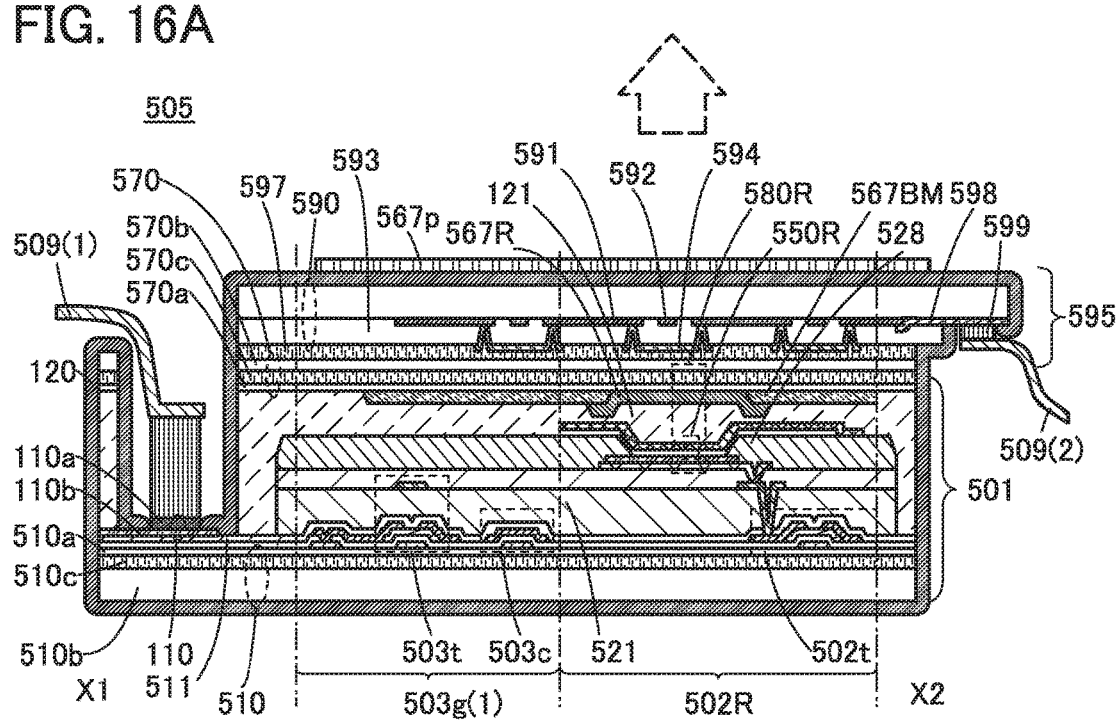
FIGS. 16A to 16C illustrate an example of a touch panel of Embodiment.
Figure 16B:
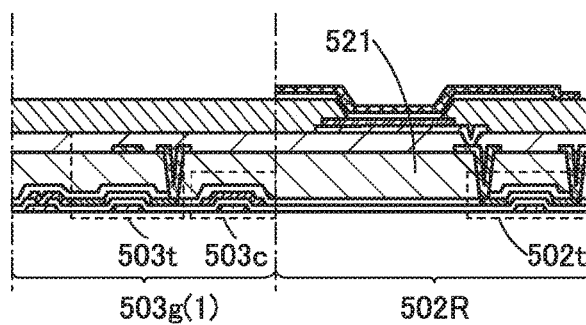
Figure 16C:
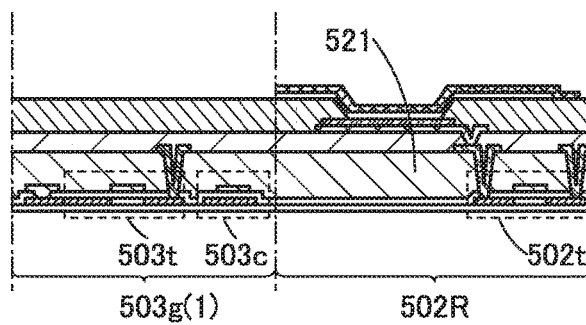

FIGS. 15A and 15B are perspective views of a touch panel 505. For simplicity, only main components are illustrated. FIGS. 16A to 16C are cross-sectional views along dashed-dotted line X1-X2 in FIG. 15A.

The touch panel 505 includes a display portion 501 and a touch sensor 595 (FIG. 15B). Furthermore, the touch panel 505 includes the substrate 510, the substrate 570, and a substrate 590. Note that the substrate 510, the substrate 570, and the substrate 590 each have flexibility.

The display portion 501 includes the substrate 510, a plurality of pixels over the substrate 510, a plurality of wirings 511 through which signals are supplied to the pixels, and a driver circuit 503. The plurality of wirings 511 is led to a peripheral portion of the substrate 510, and part of the plurality of wirings 511 forms the terminal 110. The terminal 110 is electrically connected to an FPC 509(1).

The terminal 110 has a stacked structure including the conductive layer 110b over the wirings 511 and the conductive layer 110a over the conductive layer 110b.

The substrate 590 includes the touch sensor 595 and a plurality of wirings 598 electrically connected to the touch sensor 595. The plurality of wirings 598 is led to a peripheral portion of the substrate 590, and part of the plurality of wirings 598 forms a terminal. The terminal is electrically connected to an FPC 509(2). Note that in FIG. 15B, electrodes, wirings, and the like of the touch sensor 595 provided on the back side of the substrate 590 (the side facing the substrate 510) are indicated by solid lines for clarity.

As the touch sensor 595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

An example of using a projected capacitive touch sensor is described below with reference to FIG. 15B.

Note that a variety of sensors that can sense the closeness or the contact of a sensing target such as a finger, can be used.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 15A and 15B.

The electrodes 591 each have a quadrangular shape and are arranged in a direction intersecting with the direction in which the electrodes 592 extend.

A wiring 594 electrically connects two electrodes 591 between which the electrode 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light from the touch sensor 595 can be reduced.

Note that the shapes of the electrodes 591 and the electrodes 592 are not limited to the above-mentioned shapes and can be any of a variety of shapes. For example, the plurality of electrodes 591 may be provided so that space between the electrodes 591 are reduced as much as possible, and a plurality of electrodes 592 may be provided with an insulating layer sandwiched between the electrodes 591 and the electrodes 592 and may be spaced apart from each other to form a region not overlapping with the electrodes 591. In that case, between two adjacent electrodes 592, it is preferable to provide a dummy electrode which is electrically insulated from these electrodes, whereby the area of a region having a different transmittance can be reduced.

The touch sensor 595 includes the substrate 590, the electrodes 591 and the electrodes 592 provided in a staggered arrangement on the substrate 590, an insulating layer 593 covering the electrodes 591 and the electrodes 592, and the wiring 594 that electrically connects the adjacent electrodes 591 to each other.

An adhesive layer 597 attaches the substrate 590 to the substrate 570 so that the touch sensor 595 overlaps the display portion 501.

The electrodes 591 and the electrodes 592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 591 and 592 may have a mesh shape such that mesh openings and light-emitting elements overlap with each other. In this case, a low-conductive metal or alloy, for example, can be used for the electrodes 591 and 592.

Note that, for example, a low-resistance material is preferably used as a material of conductive films such as the electrode 591 and the electrode 592, i.e., a wiring and an electrode in the touch panel. For example, silver, copper, aluminum, a carbon nanotube, graphene, or a metal halide (such as a silver halide) may be used. Alternatively, a metal nanowire including a number of conductors with an extremely small width (for example, a diameter of several nanometers) may be used. Further alternatively, a net-like metal mesh with a conductor may be used. Examples of such materials include an Ag nanowire, a Cu nanowire, an Al nanowire, an Ag mesh, a Cu mesh, and an Al mesh. In the case of using an Ag nanowire, a light transmittance of 89% or more and a sheet resistance of 40 ohm/square or more and 100 ohm/square or less can be achieved. Since such a material provides a high light transmittance, the metal nanowire, the metal mesh, a carbon nanotube, graphene, or the like may be used for an electrode of the display element, such as a pixel electrode or a common electrode.

The electrodes 591 and the electrodes 592 may be formed by depositing a light-transmitting conductive material on the substrate 590 by a sputtering method and then removing an unnecessary portion by any of various patterning techniques such as photolithography.

Examples of a material for the insulating layer 593 are a resin such as acrylic or epoxy resin, a resin having a siloxane bond, and an inorganic insulating material such as silicon oxide, silicon oxynitride, or aluminum oxide.

Furthermore, openings reaching the electrodes 591 are formed in the insulating layer 593, and the wiring 594 electrically connects the adjacent electrodes 591. A light-transmitting conductive material can be favorably used as the wiring 594 because the aperture ratio of the touch panel can be increased. Moreover, a material with higher conductivity than the conductivities of the electrodes 591 and 592 can be favorably used for the wiring 594 because electric resistance can be reduced.

One electrode 592 extends in one direction, and a plurality of electrodes 592 is provided in the form of stripes.

The wiring 594 intersects with the electrode 592.

Adjacent electrodes 591 are provided with one electrode 592 provided therebetween. The wiring 594 electrically connects the adjacent electrodes 591.

Note that the plurality of electrodes 591 is not necessarily arranged in the direction orthogonal to one electrode 592 and may be arranged to intersect with one electrode 592 at an angle of less than 90 degrees.

One wiring 598 is electrically connected to any of the electrodes 591 and 592. Part of the wiring 598 serves as a terminal. For the wiring 598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 593 and the wiring 594 may be provided to protect the touch sensor 595.

Furthermore, a connection layer 599 electrically connects the wiring 598 to the FPC 509(2).

As the connection layer 599, any of various anisotropic conductive films (ACF), anisotropic conductive pastes (ACP), or the like can be used.

The adhesive layer 597 has a light-transmitting property. For example, a thermosetting resin or an ultraviolet curable resin can be used; specifically, a resin such as an acrylic resin, a urethane resin, an epoxy resin, or a resin having a siloxane bond can be used.

The display portion 501 includes a plurality of pixels arranged in a matrix. Each of the pixels includes a display element and a pixel circuit for driving the display element.

In this embodiment, an example of using an organic EL element that emits white light as a display element will be described; however, the display element is not limited to such an element.

For example, organic EL elements that emit light of different colors may be included in sub-pixels so that the light of different colors can be emitted from the respective sub-pixels.

Structures which are similar to those of the substrate 510, the substrate 570, and the bonding layer 121 in Structure Example 1 can be applied to the substrate 510, the substrate 570, and the bonding layer 121 in Structure Example 2.

A pixel includes a sub-pixel 502R, and the sub-pixel 502R includes a light-emitting module 580R.

The sub-pixel 502R includes a first light-emitting element 550R and a pixel circuit including a transistor 502t that can supply electric power to the first light-emitting element 550R. Furthermore, the light-emitting module 580R includes the first light-emitting element 550R and an optical element (e.g., a coloring layer 567R).

The light-emitting element 550R includes a lower electrode, an upper electrode, and an EL layer between the lower electrode and the upper electrode.

The light-emitting module 580R includes the first coloring layer 567R on the light extraction side.

In the case where the bonding layer 121 is provided on the light extraction side, the bonding layer 121 is in contact with the first light-emitting element 550R and the first coloring layer 567R.

The first coloring layer 567R is positioned in a region overlapping with the first light-emitting element 550R. Accordingly, part of light emitted from the light-emitting element 550R passes through the first coloring layer 567R and is emitted to the outside of the light-emitting module 580R as indicated by an arrow in FIG. 16A.

The display portion 501 includes a light-blocking layer 567BM on the light extraction side. The light-blocking layer 567BM is provided to surround the coloring layer (e.g., the first coloring layer 567R).

The display portion 501 includes an anti-reflective layer 567p positioned in a region overlapping with pixels. As the anti-reflective layer 567p, a circular polarizing plate can be used, for example.

The display portion 501 includes an insulating film 521. The insulating film 521 covers the transistor 502t. Note that the insulating film 521 can be used as a layer for planarizing unevenness due to the pixel circuit. A stacked film including a layer that can prevent diffusion of impurities can be used as the insulating film 521. This can prevent the reliability of the transistor 502t or the like from being lowered by diffusion of impurities.

The display portion 501 includes the light-emitting elements (e.g., the first light-emitting element 550R) over the insulating film 521.

The display portion 501 includes, over the insulating film 521, a partition wall 528 that overlaps with an end portion of the first lower electrode. In addition, a spacer that controls the distance between the substrate 510 and the substrate 570 is provided on the partition wall 528.

A scan line driver circuit 503g(1) includes a transistor 503t and a capacitor 503c. Note that the driver circuit can be formed in the same process and over the same substrate as those of the pixel circuits.

The display portion 501 includes the wirings 511 through which signals can be supplied. The wirings 511 are provided with the terminal 110. Note that the FPC 509(1) through which a signal such as an image signal or a synchronization signal can be supplied is electrically connected to the terminal 110.

Note that a printed wiring board (PWB) may be attached to the FPC 509(1).

The display portion 501 includes wirings such as scan lines, signal lines, and power supply lines. Any of the various conductive films described above can be used as the wirings.

The protective layer 120 is provided to cover an exposed portion of the touch panel. Specifically, the protective layer 120 is provided to partially or entirely cover exposed portions of the substrate 590, the adhesive layer 597, the substrate 570 (the flexible substrate 570b, the adhesive layer 570c, and the insulating layer 570a), the bonding layer 121, the terminal 110, the substrate 510 (the flexible substrate 510b, the adhesive layer 510c, and the insulating layer 510a), and the like. The protective layer 120 has an opening overlapping with part of the surface of the conductive layer 110a of the terminal 110.

Any of various kinds of transistors can be used in the display portion 501. A structure in the case of using bottom-gate transistors in the display portion 501 is illustrated in FIGS. 16A and 16B.

For example, a semiconductor layer containing an oxide semiconductor, amorphous silicon, or the like can be used in the transistor 502t and the transistor 503t illustrated in FIG. 16A.

For example, a semiconductor layer containing polycrystalline silicon that is obtained by crystallization process such as laser annealing can be used in the transistor 502t and the transistor 503t illustrated in FIG. 16B.

A structure in the case of using top-gate transistors in the display portion 501 is illustrated in FIG. 16C.

For example, a semiconductor layer including polycrystalline silicon, a single crystal silicon film that is transferred from a single crystal silicon substrate, or the like can be used in the transistor 502t and the transistor 503t illustrated in FIG. 16C.

Figure 17:
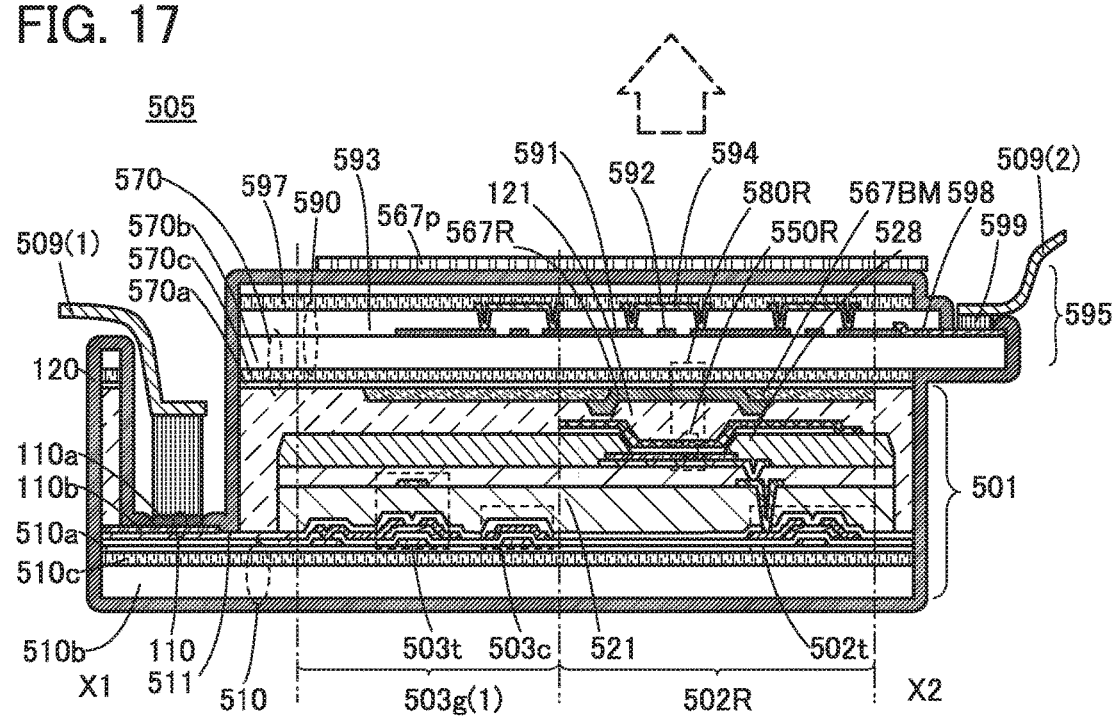
FIG. 17 illustrates an example of a touch panel of Embodiment.

Note that the structure in which a FPC 509(2) is connected to the substrate 510 side of the substrate 590 is illustrated here; however, the FPC 509(2) may be connected to the opposite side of the substrate 590 as shown in FIG. 17. In this manner, a structure in which both of the FPC 509(1) and the FPC 509(2) are connected to one surface side of the touch panel 505 can be obtained.

Structural Example 3

Figure 18A:
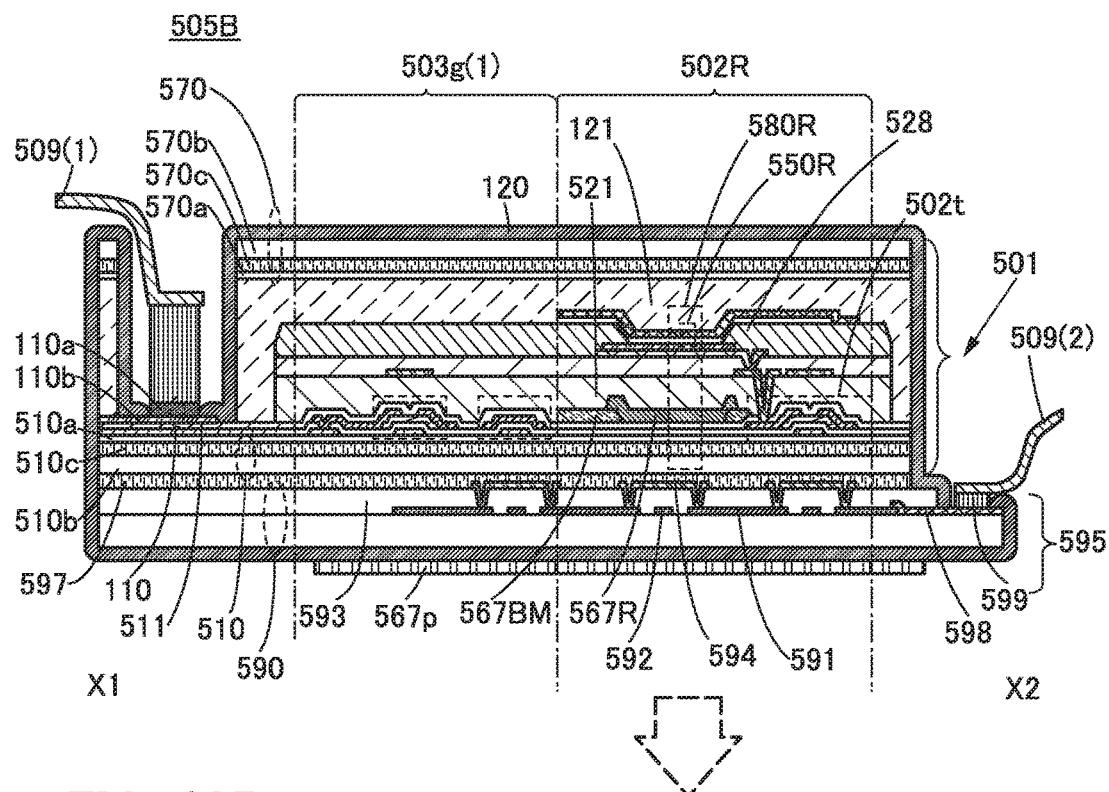
FIGS. 18A to 18C illustrate an example of a touch panel of Embodiment.
Figure 18B:
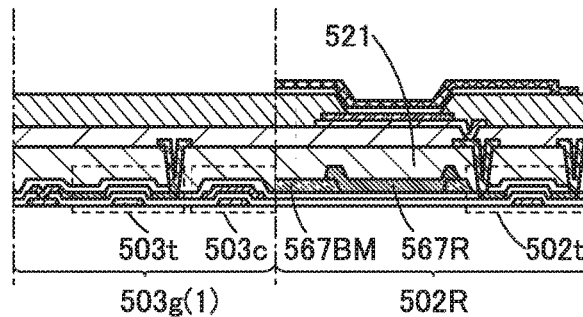
Figure 18C:
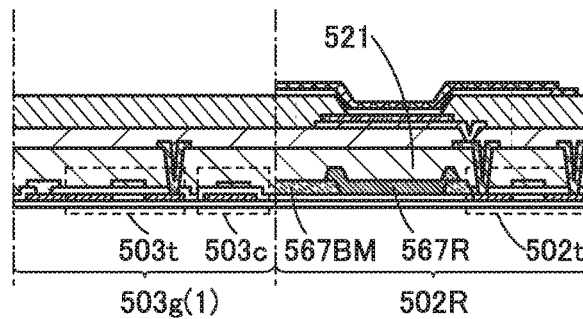

FIGS. 18A to 18C are cross-sectional views of a touch panel 505B. The touch panel 505B described in this embodiment is different from the touch panel 505 described in Structural Example 2 in that the display portion 501 displays received image data to the side where the transistors are provided and that the touch sensor is provided on the substrate 510 side of the display portion. Different structures will be described in detail below, and the above description is referred to for the other similar structures.

The first coloring layer 567R is positioned in a region overlapping with the first light-emitting element 550R. The light-emitting element 550R illustrated in FIG. 18A emits light to the side where the transistor 502t is provided. Accordingly, part of light emitted from the light-emitting element 550R passes through the first coloring layer 567R and is emitted to the outside of the light-emitting module 580R as indicated by an arrow in FIG. 18A.

The display portion 501 includes a light-blocking layer 567BM on the light extraction side. The light-blocking layer 567BM is provided to surround the coloring layer (e.g., the first coloring layer 567R).

The touch sensor 595 is provided on the substrate 510 side of the display portion 501 (see FIG. 18A).

The adhesive layer 597 is provided between the substrate 510 and the substrate 590 and attaches the touch sensor 595 to the display portion 501.

The protective layer 120 is provided to cover an exposed portion of the touch panel. Specifically, the protective layer 120 is provided to partially or entirely cover exposed portions of the substrate 570 (the flexible substrate 570b, the adhesive layer 570c, and the insulating layer 570a), the bonding layer 121, the substrate 510 (the flexible substrate 510b, the adhesive layer 510c, and the insulating layer 510a), the substrate 590, the adhesive layer 597, the terminal 110, the wiring 598, and the like. The protective layer 120 has an opening overlapping with part of the surfaces of the terminal 110, the wiring 598, and the like.

Note that the wiring 598 may be formed using the above-described conductive material that is not easily oxidized. Alternatively, the above-described conductive material that is not easily oxidized may be used for a portion that functions as a terminal of the wiring 598. Alternatively, a stacked layer including the above-described conductive material that is not easily oxidized may be used for a portion that functions as a terminal of the wiring 598.

Any of various kinds of transistors can be used in the display portion 501. FIGS. 18A and 18B illustrates a structure in the case of using bottom-gate transistors in the display portion 501.

For example, a semiconductor layer containing an oxide semiconductor, amorphous silicon, or the like can be used in the transistor 502t and the transistor 503t illustrated in FIG. 18A.

For example, a semiconductor layer containing polycrystalline silicon or the like can be used in the transistor 502t and the transistor 503t illustrated in FIG. 18B.

A structure in the case of using top-gate transistors in the display portion 501 is illustrated in FIG. 18C.

For example, a semiconductor layer containing polycrystalline silicon, a transferred single crystal silicon film, or the like can be used in the transistor 502t and the transistor 503t illustrated in FIG. 18C.

At least part of this embodiment can be implemented in combination with any of the embodiments described in this specification as appropriate.

Embodiment 4

[Structure Example of Deposition Apparatus]

An apparatus with which a thin film for forming a functional panel, a display panel, a light-emitting panel, a sensor panel, or a touch panel of one embodiment of the present invention can be deposited is described below. The apparatus described below can be preferably used for the deposition of particularly the protective layer 120 and the like.

[Structure Example of Deposition Apparatus ALD]

Figure 19:
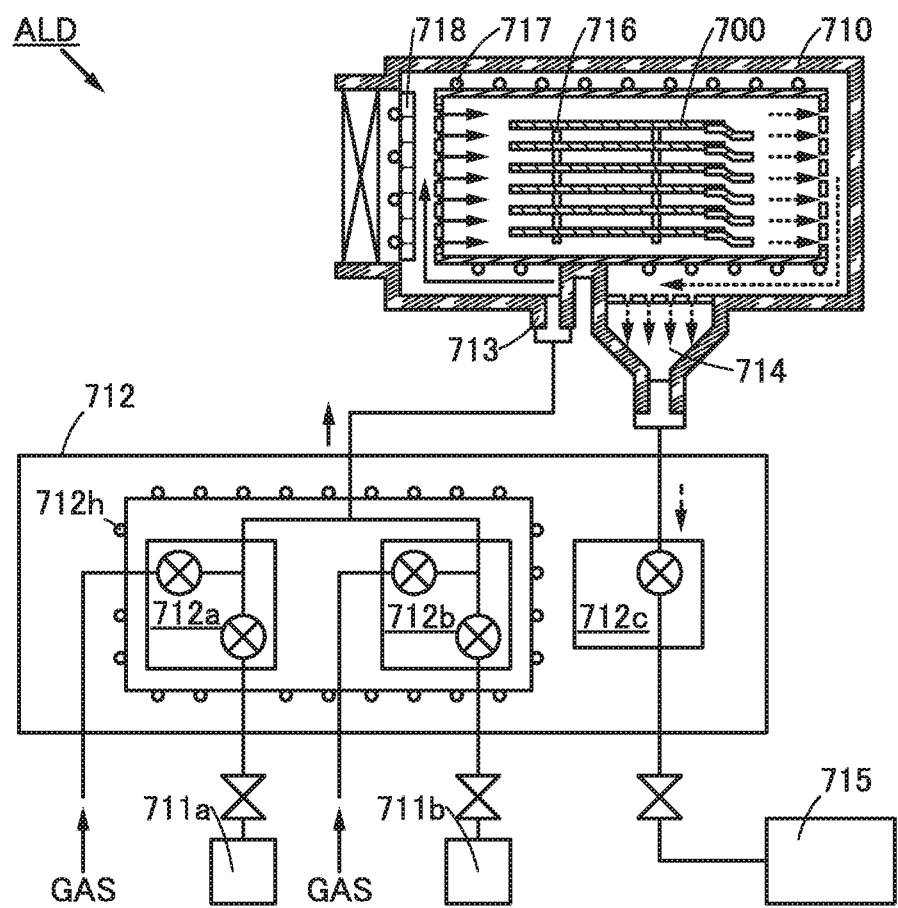
FIG. 19 illustrates a structure of a deposition apparatus of Embodiment.

FIG. 19 illustrates a deposition apparatus ALD.

The deposition apparatus ALD described in this embodiment includes a deposition chamber 710 and a control portion 712 connected to the deposition chamber 710 (see FIG. 19).

The control portion 712 includes a control unit (not shown) that supplies control signals and flow rate controllers 712a, 712b, and 712c to which the control signals are supplied. For example, high-speed valves can be used as the flow rate controllers. Specifically, flow rates can be precisely controlled by using ALD valves or the like. Furthermore, the control portion 712 includes a heating mechanism 712h which controls the temperature in the flow rate controllers and pipes.

The flow rate controller 712a is supplied with a control signal, a first source material, and an inert gas, and has a function of supplying the first source material or the inert gas in accordance with the control signal.

The flow rate controller 712b is supplied with a control signal, a second source material, and an inert gas and has a function of supplying the second source material or the inert gas in accordance with the control signal.

The flow rate controller 712c is supplied with a control signal, and has a function of connecting to an evacuation unit 715 in accordance with the control signal.

<<Source Material Supply Portion>>

A source material supply portion 711a has a function of supplying the first source material and is connected to the flow rate controller 712a.

A source material supply portion 711b has a function of supplying the second source material and is connected to the flow rate controller 712b.

A vaporizer, a heating unit, or the like can be used as each of the source material supply portions. Thus, a gaseous source material can be generated from a solid or liquid source material.

Note that the number of the source material supply portions is not limited to two and may be three or more.

<<Source Material>>

Any of a variety of substances can be used as the first source material.

For example, a volatile organometallic compound, a volatile metal alkoxide, or the like can be used as the first source material.

Any of a variety of substances that react with the first source material can be used as the second source material. For example, a substance that contributes to an oxidation reaction, a substance that contributes to a reduction reaction, a substance that contributes to an addition reaction, a substance that contributes to a decomposition reaction, a substance that contributes to a hydrolysis reaction, or the like can be used as the second source material.

Alternatively, a radical or the like can be used. For example, plasma obtained by supplying a source material to a plasma source, or the like can be used. Specifically, an oxygen radical, a nitrogen radical, or the like can be used.

Note that the second source material used in combination with the first source material is preferably a source material that reacts with the first source material at a temperature close to room temperature. For example, a source material which reacts with the first source material at a temperature higher than or equal to room temperature and lower than or equal to 200° C., preferably higher than or equal to 50° C. and lower than or equal to 150° C., is preferable.

<<Evacuation Unit>>

The evacuation unit 715 has an evacuating function and is connected to the flow rate controller 712c. Note that a trap for capturing a source material to be evacuated may be provided between an outlet port 714 and the flow rate controller 712c. At that time, an evacuated gas is preferably removed by using a removal unit.

<<Control Portion>>

The control unit supplies the control signals for controlling the flow rate controllers, control signals for controlling the heating mechanism, or the like. For example, in a first step, the first source material is supplied to a surface of a process member 700. Then, in a second step, the second source material which reacts with the first source material is supplied. Accordingly, a reaction product of the first source material and the second source material can be deposited onto a surface of the process member 700.

The amount of the reaction product to be deposited onto the surface of the process member 700 can be controlled by repetition of the first step and the second step.

The amount of the first source material to be supplied to the process member 700 is limited to the maximum possible amount of adsorption on the surface of the process member 700. For example, conditions are selected so that a monomolecular layer of the first source material is formed on the surface of the process member 700, and the formed monomolecular layer of the first source material is reacted with the second source material, whereby a significantly uniform layer containing the reaction product of the first source material and the second source material can be formed.

As a result, a variety of materials can be deposited on the surface of the process member 700 even when the surface has a complicated structure. For example, a film with a thickness of greater than or equal to 3 nm and less than or equal to 200 nm can be formed on the process member 700.

For example, in the case where a small hole called a pinhole, a crack called a microcrack, or the like is formed in the surface of the process member 700, the pinhole or the microcrack can be filled by depositing material into the pinhole or the microcrack.

When the deposition apparatus ALD is used, a film to be deposited can have extremely high step coverage. Even in the case where the surface of the process member 700 has unevenness, a film with a uniform quality can be formed on the uneven surface.

The remainder of the first source material and the second source material are evacuated from the deposition chamber 710 with the use of the evacuation unit 715. For example, the evacuation may be performed while an inert gas such as argon or nitrogen is introduced.

<<Deposition Chamber>>

The deposition chamber 710 includes an inlet port 713 from which the first source material, the second source material, and the inert gas are supplied, and the outlet port 714 from which the first material, the second material, and the inert gas are evacuated.

The deposition chamber 710 includes a support portion 716 which has a function of supporting one or a plurality of process members 700, a heating mechanism 717 which has a function of heating the one or plurality of process members, and a door 718 which has a function of opening or closing to load and unload the one or plurality of process members 700.

For example, a resistive heater, an infrared lamp, or the like can be used as the heating mechanism 717.

The heating mechanism 717 has a function of heating up, for example, to 80° C. or higher, 100° C. or higher, or 150° C. or higher.

The heating mechanism 717 heats the one or plurality of process members 700 to a temperature higher than or equal to room temperature and lower than or equal to 200° C., preferably higher than or equal to 50° C. and lower than or equal to 150° C.

The deposition chamber 710 also includes a pressure regulator and a pressure detector.

<<Support Portion>>

The support portion 716 supports the one or plurality of process members 700. Thus, an insulating film, for example, can be formed over the one or the plurality of process members 700 in each treatment.

For the process member 700, in addition to a substrate, a functional panel, a display device, a light-emitting panel, a sensor panel, a touch panel, a display device, an input device, or the functional panel, the display panel, the light-emitting panel, the sensor panel, the touch panel, or the like to which a module such as an FPC is connected can be used.

[Example of Film]

Films which can be formed using the deposition apparatus ALD described in this embodiment will be described.

For example, a film containing an oxide, a nitride, a fluoride, a sulfide, a ternary compound, a metal, or a polymer can be formed.

For example, a material containing aluminum oxide, hafnium oxide, aluminum silicate, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like can be deposited.

For example, a material containing aluminum nitride, hafnium nitride, silicon nitride, tantalum nitride, titanium nitride, niobium nitride, molybdenum nitride, zirconium nitride, gallium nitride, or the like can be deposited.

For example, a material containing copper, platinum, ruthenium, tungsten, iridium, palladium, iron, cobalt, nickel, or the like can be deposited.

For example, a material containing zinc sulfide, strontium sulfide, calcium sulfide, lead sulfide, calcium fluoride, strontium fluoride, zinc fluoride, or the like can be deposited.

For example, a material that includes a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like can be deposited.

<<Film Containing Aluminum Oxide>>

For example, a gas obtained by vaporizing a source material containing an aluminum precursor compound can be used as the first source material. Specifically, trimethylaluminum (TMA, or $Al(CH_3)_3$ (chemical formula)), tris(dimethylamide)aluminum, triisobutylaluminum, and aluminum tris(2,2,6,6-tetramethyl-3,5-heptanedionate), or the like can be used.

Water vapor (chemical formula: $H_2O$) can be used as the second source material.

With the use of the deposition apparatus ALD, a film containing aluminum oxide can be formed from the first source material and the second source material <<Film Containing Hafnium Oxide>>

For example, a gas obtained by vaporizing a source material containing a hafnium precursor compound can be used as the first source material. Specifically, a source material containing hafnium amide such as tetrakis(dimethylamide)hafnium (TDMAH; chemical formula: $Hf[N(CH_3)_2]_4$) or tetrakis(ethylmethylamide)hafnium can be used.

Ozone can be used as the second source material.

With the use of the deposition apparatus ALD, a film containing hafnium oxide can be formed from the first source material and the second source material.

<<Film Containing Tungsten>>

For example, a $WF_6$ gas can be used as the first source material.

A $B_2H_6$ gas, an $SiH_4$ gas, or the like can be used as the second source material.

With the use of the deposition apparatus ALD, a film containing tungsten can be formed from the first source material and second source material.

At least part of this embodiment can be implemented in combination with any of the embodiments described in this specification as appropriate.

Embodiment 5

In this embodiment, electronic devices and lighting devices of one embodiment of the present invention will be described with reference to drawings.

Electronic devices and lighting devices can be manufactured by using the functional panel, the display panel, the light-emitting panel, the sensor panel, the touch panel, the input device, the display device, or the input/output device of one embodiment of the present invention. Highly reliable electronic devices and lighting devices with curved surfaces can be manufactured by using the input device, the display device, or the input/output device of one embodiment of the present invention. In addition, flexible and highly reliable electronic devices and lighting devices can be manufactured by using the input device, the display device, or the input/output device of one embodiment of the present invention. Furthermore, electronic devices and lighting devices including touch sensors with improved detection sensitivity can be manufactured by using the input device or the input/output device of one embodiment of the present invention.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

The electronic device or the lighting device of one embodiment of the present invention has flexibility and therefore can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by contactless power transmission.

As examples of the secondary battery, a lithium ion secondary battery such as a lithium polymer battery (lithium ion polymer battery) using a gel electrolyte, a lithium ion battery, a nickel-hydride battery, a nickel-cadmium battery, an organic radical battery, a lead-acid battery, an air secondary battery, a nickel-zinc battery, and a silver-zinc battery can be given.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

FIGS. 20A, 20B, 20C1, 20C2, 20D, and 20E illustrate examples of electronic devices including a display portion 7000 with a curved surface. The display surface of the display portion 7000 is bent, and images can be displayed on the bent display surface. The display portion 7000 may be flexible.

The display portion 7000 can be formed using the functional panel, the display panel, the light-emitting panel, the sensor panel, the touch panel, the display device, the input/output device, or the like of one embodiment of the present invention. One embodiment of the present invention makes it possible to provide a highly reliable electronic device having a curved display portion.

FIG. 20A illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 20A includes a touch sensor in the display portion 7000. Moreover, operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; for example, switching from a mail creation screen to a main menu screen can be performed.

FIG. 20B illustrates an example of a television set. In a television set 7200, the display portion 7000 is incorporated into a housing 7201. Here, the housing 7201 is supported by a stand 7203.

The television set 7200 illustrated in FIG. 20B can be operated with an operation switch of the housing 7201 or a separate remote controller 7211. The display portion 7000 may include a touch sensor. The display portion 7000 can be operated by touching the display portion with a finger or the like. The remote controller 7211 may be provided with a display portion for displaying data output from the remote controller 7211. With operation keys or a touch panel of the remote controller 7211, channels and volume can be controlled and images displayed on the display portion 7000 can be controlled.

The television set 7200 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

FIGS. 20C1, 20C2, 20D, and 20E illustrate examples of a portable information terminal. Each of the portable information terminals includes a housing 7301 and the display portion 7000. Each of the portable information terminals may also include an operation button, an external connection port, a speaker, a microphone, an antenna, a battery, or the like. The display portion 7000 is provided with a touch sensor. An operation of the portable information terminal can be performed by touching the display portion 7000 with a finger, a stylus, or the like.

FIG. 20C1 is a perspective view of a portable information terminal 7300. FIG. 20C2 is a top view of the portable information terminal 7300. FIG. 20D is a perspective view of a portable information terminal 7310. FIG. 20E is a perspective view of a portable information terminal 7320.

Each of the portable information terminals illustrated in this embodiment functions as, for example, one or more of a telephone set, a notebook, and an information browsing system. Specifically, the portable information terminals each can be used as a smartphone. Each of the portable information terminals illustrated in this embodiment is capable of executing a variety of applications such as mobile phone calls, e-mailing, reading and editing texts, music reproduction, Internet communication, and a computer game, for example.

The portable information terminals 7300, 7310, and 7320 can display characters and image information on its plurality of surfaces. For example, as illustrated in FIGS. 20C1 and 20D, three operation buttons 7302 can be displayed on one surface, and information 7303 indicated by a rectangle can be displayed on another surface. FIGS. 20C1 and 20C2 illustrate an example in which information is displayed at the top of the portable information terminal. FIG. 20D illustrates an example in which information is displayed on the side of the portable information terminal. Information may be displayed on three or more surfaces of the portable information terminal. FIG. 20E illustrates an example where information 7304, information 7305, and information 7306 are displayed on different surfaces.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information.

For example, a user of the portable information terminal 7300 can see the display (here, the information 7303) with the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

FIGS. 20F to 20H each illustrate an example of a lighting device having a curved light-emitting portion.

The light-emitting portion included in each of the lighting devices illustrated in FIGS. 20F to 20H can be manufactured using the functional panel, the display panel, the light-emitting panel, the sensor panel, the touch panel, the display device, the input/output device, or the like of one embodiment of the present invention. According to one embodiment of the present invention, a highly reliable lighting device having a curved light-emitting portion can be provided.

A lighting device 7400 illustrated in FIG. 20F includes a light-emitting portion 7402 with a wave-shaped light-emitting surface and thus is a good-design lighting device.

A light-emitting portion 7412 included in a lighting device 7410 illustrated in FIG. 20G has two convex-curved light-emitting portions symmetrically placed. Thus, all directions can be illuminated with the lighting device 7410 as a center.

A lighting device 7420 illustrated in FIG. 20H includes a concave-curved light-emitting portion 7422. This is suitable for illuminating a specific range because light emitted from the concave-curved light-emitting portion 7422 is collected to the front of the lighting device 7420. In addition, with this structure, a shadow is less likely to be produced.

The light-emitting portion included in each of the lighting devices 7400, 7410 and 7420 may be flexible. The light-emitting portion may be fixed on a plastic member, a movable frame, or the like so that a light-emitting surface of the light-emitting portion can be bent freely depending on the intended use.

The lighting devices 7400, 7410, and 7420 each include a stage 7401 provided with an operation switch 7403 and the light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular region can be brightly illuminated, or the light-emitting surface is curved to have a convex shape, whereby a whole room can be brightly illuminated.

FIGS. 21A1, 21A2, 21B, 21C, 21D, 21E, 21F, 21G, 21H, and 21I each illustrate an example of a portable information terminal including a display portion 7001 having flexibility.

The display portion 7001 is manufactured using the functional panel, the display panel, the light-emitting panel, the sensor panel, the touch panel, the display device, the input/output device, or the like of one embodiment of the present invention. For example, a display device, or an input/output device that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like. One embodiment of the present invention makes it possible to provide a highly reliable electronic device including a display portion having flexibility.

FIGS. 21A1 and 21A2 are a perspective view and a side view illustrating an example of the portable information terminal, respectively. A portable information terminal 7500 includes a housing 7501, the display portion 7001, a display portion tab 7502, operation buttons 7503, and the like.

The portable information terminal 7500 includes a rolled flexible display portion 7001 in the housing 7501.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal or power can be directly supplied from the outside with a wiring.

By pressing the operation buttons 7503, power ON/OFF, switching of displayed videos, and the like can be performed. Although FIGS. 21A1, 21A2, and 21B illustrate an example where the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 21B illustrates the portable information terminal 7500 in a state where the display portion 7001 is pulled out with the display portion tab 7502. Videos can be displayed on the display portion 7001 in this state. In addition, the portable information terminal 7500 may perform different displays in the state where part of the display portion 7001 is rolled as shown in FIG. 21A1 and in the state where the display portion 7001 is pulled out with the display portion tab 7502 as shown in FIG. 21B. For example, in the state shown in FIG. 21A1, the rolled portion of the display portion 7001 is put in a non-display state, which results in a reduction in power consumption of the portable information terminal 7500.

A reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 21C to 21E illustrate an example of a foldable portable information terminal. FIG. 21C illustrates a portable information terminal 7600 that is opened. FIG. 21D illustrates the portable information terminal 7600 that is being opened or being folded. FIG. 21E illustrates the portable information terminal 7600 that is folded. The portable information terminal 7600 is highly portable when folded, and is highly browsable when opened because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 21F and 21G illustrate an example of a foldable portable information terminal. FIG. 21F illustrates a portable information terminal 7650 that is folded so that the display portion 7001 is on the inside. FIG. 21G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

FIG. 21H illustrates an example of a flexible portable information terminal. A portable information terminal 7700 includes a housing 7701 and the display portion 7001. The portable information terminal 7700 may include buttons 7703a and 7703b which serve as input means, speakers 7704a and 7704b which serve as sound output means, an external connection port 7705, a microphone 7706, or the like. A flexible battery 7709 can be included in the portable information terminal 7700. The battery 7709 may be arranged to overlap with the display portion 7001, for example.

The housing 7701, the display portion 7001, the battery 7709 are flexible. Thus, it is easy to curve the portable information terminal 7700 into a desired shape or to twist the portable information terminal 7700. For example, the portable information terminal 7700 can be folded such that the display portion 7001 faces inward or outward. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 can be used conveniently in various situations because the portable information terminal 7700 is lightweight. For example, the portable information terminal 7700 can be used in the state where the upper portion of the housing 7701 is suspended by a clip or the like, or in the state where the housing 7701 is fixed to a wall by magnets or the like.

FIG. 21I illustrates an example of a wrist-watch-type portable information terminal. The portable information terminal 7800 includes a band 7801, the display portion 7001, an input-output terminal 7802, operation buttons 7803, and the like. The band 7801 has a function of a housing. A flexible battery 7805 can be included in the portable information terminal 7800. The battery 7805 may overlap with the display portion 7001 and the band 7801, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

The portable information terminal 7800 may include the input-output terminal 7802. In the case where the input-output terminal 7802 is included in the portable information terminal 7800, data can be directly transmitted to and received from another information terminal via a connector. Charging through the input-output terminal 7802 is also possible. Note that charging of the portable information terminal described as an example in this embodiment can be performed by contactless power transmission without using the input-output terminal.

Figure 22A:
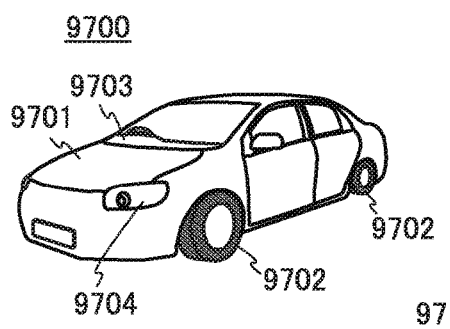
FIGS. 22A to 22E illustrate examples of an electronic device of Embodiment.
Figure 22B:
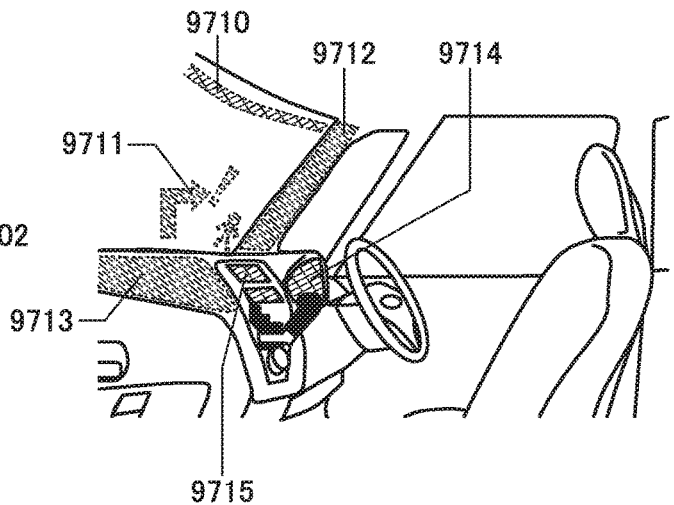

FIG. 22A is an external view of an automobile 9700. FIG. 22B illustrates a driver's seat of the automobile 9700. The automobile 9700 includes a car body 9701, wheels 9702, a dashboard 9703, lights 9704, and the like. The display device or input/output device of one embodiment of the present invention can be used in a display portion or the like of the automobile 9700. For example, the functional panel, the display panel, the light-emitting panel, the sensor panel, the touch panel, the display device, or the input/output device of one embodiment of the present invention can be used in display portions 9710 to 9715 illustrated in FIG. 22B.

The display portion 9710 and the display portion 9711 are display devices or input/output devices provided in an automobile windshield. The display device or input/output device of one embodiment of the present invention can be a see-through display device or input/output device, through which the opposite side can be seen, by using a light-transmitting conductive material for its electrodes. Such a see-through display device or input/output device does not hinder driver's vision during the driving of the automobile 9700. Therefore, the display device or input/output device of one embodiment of the present invention can be provided in the windshield of the automobile 9700. Note that in the case where a transistor or the like for driving the display device or input/output device is provided in the display device or input/output device, a transistor having light-transmitting properties, such as an organic transistor using an organic semiconductor material or a transistor using an oxide semiconductor, is preferably used.

The display portion 9712 is a display device or input/output device provided on a pillar portion. For example, an image taken by an imaging unit provided in the car body is displayed on the display portion 9712, whereby the view hindered by the pillar portion can be compensated. The display portion 9713 is a display device or an input device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see makes it possible for the driver to confirm safety easily and comfortably.

Figure 22C:
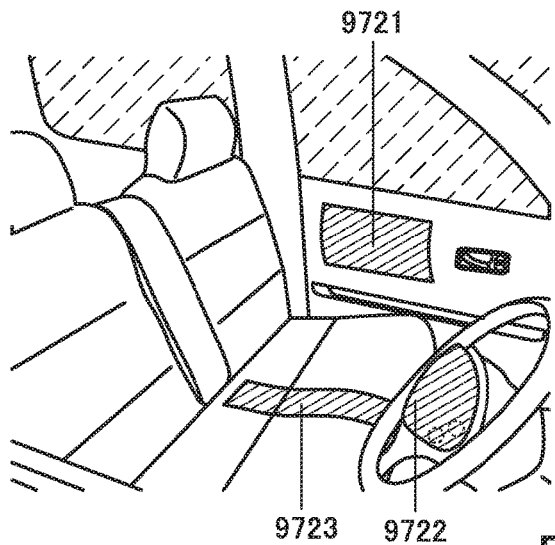

FIG. 22C illustrates the inside of a car in which a bench seat is used as a driver seat and a front passenger seat. A display portion 9721 is a display device or input/output device provided in a door portion. For example, the display portion 9721 can compensate for the view hindered by the door portion by showing an image taken by an imaging unit provided on the car body. A display portion 9722 is a display device or input/output device provided in a steering wheel. A display portion 9723 is a display device or input/output device provided in the middle of a seating face of the bench seat. Note that the display device or input/output device can be used as a seat heater by providing the display device or input/output device on the seating face or backrest and by using heat generated by the display device or input/output device as a heat source.

The display portion 9714, the display portion 9715, and the display portion 9722 can provide a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

The display portions each including the functional panel, the display panel, the light-emitting panel, the sensor panel, the touch panel, the display device, or the input/output device of one embodiment of the present invention can be flat, in which case the functional panel, the display panel, the light-emitting panel, the sensor panel, the touch panel, the display device, or input/output device of one embodiment of the present invention does not necessarily have a curved surface or flexibility.

Figure 22D:
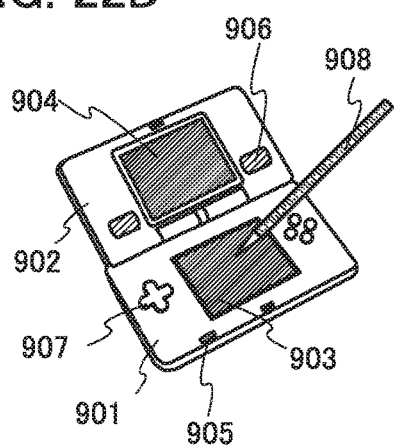

FIG. 22D illustrates a portable game machine including a housing 901, a housing 902, a display portion 903, a display portion 904, a microphone 905, a speaker 906, an operation button 907, a stylus 908, and the like.

The portable game machine illustrated in FIG. 22D includes two display portions 903 and 904. Note that the number of display portions of an electronic device of one embodiment of the present invention is not limited to two and can be one or three or more as long as at least one display portion includes the functional panel, the display panel, the light-emitting panel, the sensor panel, the touch panel, the display device, or the input/output device of one embodiment of the present invention.

Figure 22E:
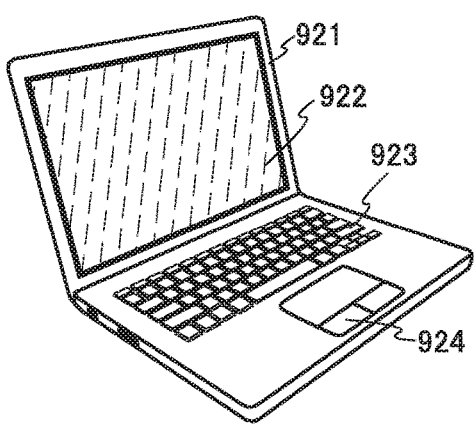

FIG. 22E illustrates a laptop personal computer, which includes a housing 921, a display portion 922, a keyboard 923, a pointing device 924, and the like.

The functional panel, the display panel, the light-emitting panel, the sensor panel, the touch panel, the display device, or the input/output device of one embodiment of the present invention can be used in the display portion 922.

Figure 23A:
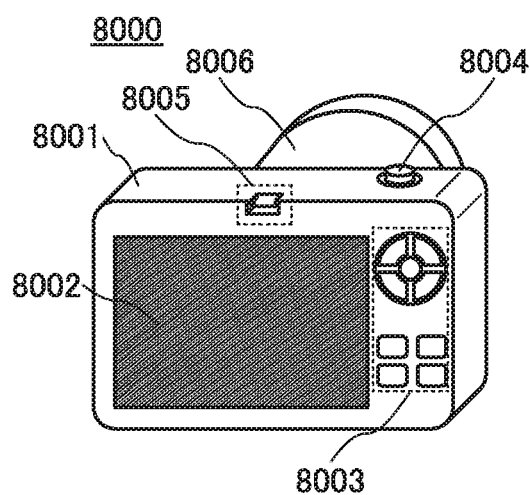
FIGS. 23A to 23C illustrate examples of an electronic device of Embodiment.

FIG. 23A is an external view of a camera 8000. The camera 8000 includes a housing 8001, a display portion 8002, an operation button 8003, a shutter button 8004, and a connection portion 8005, and the like. A lens 8006 can be put on the camera 8000.

The connection portion 8005 includes an electrode to connect with a finder 8100, which is described below, a stroboscope, or the like.

Although the lens 8006 of the camera 8000 here is detachable from the housing 8001 for replacement, the lens 8006 may be included in the housing.

Images can be taken by touching the shutter button 8004. In addition, images can be taken by touching the display portion 8002 which serves as a touch panel.

The functional panel, the display panel, the light-emitting panel, the sensor panel, the touch panel, the display device, or the input/output device of one embodiment of the present invention can be used in the display portion 8002.

Figure 23B:
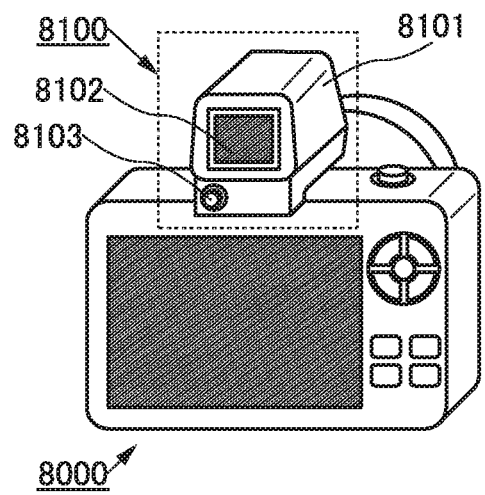

FIG. 23B shows the camera 8000 with the finder 8100 connected.

The finder 8100 includes a housing 8101, a display portion 8102, and a button 8103.

The housing 8101 includes a connection portion for the connection portion 8005 of the camera 8000, and the finder 8100 can be connected to the camera 8000. The connection portion includes an electrode, and an image or the like received from the camera 8000 through the electrode can be displayed on the display portion 8102.

The button 8103 has a function of a power button, and the display portion 8102 can be turned on and off with the button 8103.

The functional panel, the display panel, the light-emitting panel, the sensor panel, the touch panel, the display device, or the input/output device of one embodiment of the present invention can be used in the display portion 8102.

Although the camera 8000 and the finder 8100 are separate and detachable electronic devices in FIGS. 23A and 23B, the housing 8001 of the camera 8000 may include a finder having the display device or input/output device of one embodiment of the present invention.

Figure 23C:
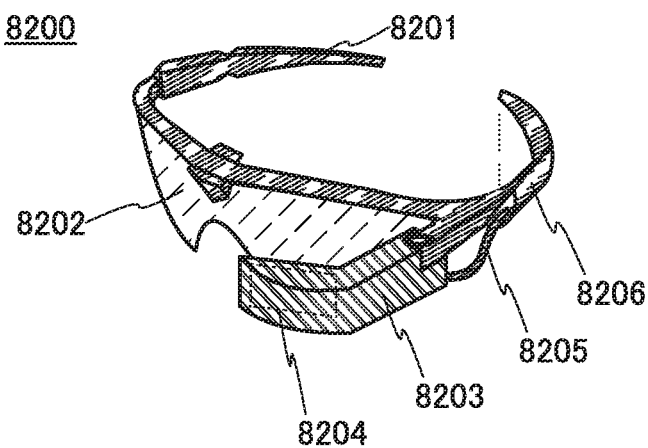

FIG. 23C illustrates an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. In addition, the movement of the eyeball and the eyelid of a user can be captured by a camera in the main body 8203 and then coordinates of the points the user looks at can be calculated using the captured data to utilize the eye of the user as an input means.

The mounting portion 8201 may include a plurality of electrodes to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The functional panel, the display panel, the light-emitting panel, the sensor panel, the touch panel, the display device, or the input/output device of one embodiment of the present invention can be used in the display portion 8204.

At least part of this embodiment can be implemented in combination with any of the embodiments described in this specification as appropriate.

This application is based on Japanese Patent Application serial no. 2014-265107 filed with Japan Patent Office on Dec. 26, 2014, the entire contents of which are hereby incorporated by reference.

What is claimed is:
1. A functional panel comprising:
a first substrate;
a bonding layer;
a functional element;
a protective layer; and
a terminal,
wherein the bonding layer is positioned over the first substrate,
wherein the functional element is surrounded by the first substrate and the bonding layer,
wherein the terminal is electrically connected to the functional element,
wherein the protective layer is provided to be in contact with a side surface of the first substrate and an exposed surface of the bonding layer, and
wherein a part of a surface of the terminal is exposed without being covered with the protective layer.
2. The functional panel according to claim 1, wherein the part of the surface of the terminal includes a material having a lower ionization tendency than hydrogen.

3. The functional panel according to claim 2, wherein the material is palladium, iridium, gold, or platinum.

4. The functional panel according to claim 1, wherein the protective layer includes at least one of aluminum oxide, hafnium oxide, zirconium oxide, titanium oxide, zinc oxide, indium oxide, tin oxide, indium tin oxide, tantalum oxide, silicon oxide, manganese oxide, nickel oxide, erbium oxide, cobalt oxide, tellurium oxide, barium titanate, titanium nitride, tantalum nitride, aluminum nitride, tungsten nitride, cobalt nitride, manganese nitride, and hafnium nitride.

5. The functional panel according to claim 1,
wherein the terminal has a stacked structure of a first layer and a second layer over the first layer,
wherein a part of a surface of the second layer is exposed,
wherein the second layer includes a material having a lower ionization tendency than a material included in the first layer.

6. The functional panel according to claim 5, wherein the second layer includes palladium, iridium, gold, or platinum.

7. The functional panel according to claim 1, wherein the first substrate has flexibility.

8. The functional panel according to claim 1, further comprising an FPC,
wherein the FPC is electrically connected to the terminal.

9. A display panel, comprising the functional panel according to claim 1,
wherein the functional element includes a display element.

10. A display panel, comprising the functional panel according to claim 1,
wherein the functional element includes a display element and a transistor.

11. A sensor panel, comprising the functional panel according to claim 1,
wherein the functional element includes a sensor element.

12. A light-emitting panel comprising a functional panel, the functional panel comprising:
a first substrate;
a bonding layer;
a functional element;
a protective layer; and
a terminal,
wherein the bonding layer is positioned over the first substrate,
wherein the functional element is surrounded by the first substrate and the bonding layer,
wherein the functional element includes a light-emitting element,
wherein the terminal is electrically connected to the functional element,
wherein the protective layer is provided to be in contact with a side surface of the first substrate and an exposed surface of the bonding layer, and
wherein a part of a surface of the terminal is exposed without being covered with the protective layer.

13. The light-emitting panel according to claim 12, wherein the part of the surface of the terminal includes a material having a lower ionization tendency than hydrogen.

14. The light-emitting panel according to claim 13, wherein the material is palladium, iridium, gold, or platinum.

15. The light-emitting panel according to claim 12, wherein the protective layer includes at least one of aluminum oxide, hafnium oxide, zirconium oxide, titanium oxide, zinc oxide, indium oxide, tin oxide, indium tin oxide, tantalum oxide, silicon oxide, manganese oxide, nickel oxide, erbium oxide, cobalt oxide, tellurium oxide, barium titanate, titanium nitride, tantalum nitride, aluminum nitride, tungsten nitride, cobalt nitride, manganese nitride, and hafnium nitride.

16. The light-emitting panel according to claim 12,
wherein the terminal has a stacked structure of a first layer and a second layer over the first layer,
wherein a part of a surface of the second layer is exposed,
wherein the second layer includes a material having a lower ionization tendency than a material included in the first layer.

17. The light-emitting panel according to claim 16, wherein the second layer includes palladium, iridium, gold, or platinum.

18. The light-emitting panel according to claim 12, wherein the first substrate has flexibility.

19. The light-emitting panel according to claim 12, further comprising an FPC wherein the FPC is electrically connected to the terminal.

20. A display panel, comprising the light-emitting panel according to claim 12,
wherein the functional element includes a display element.

21. A display panel, comprising the light-emitting panel according to claim 12,
wherein the functional element includes a display element and a transistor.

22. A sensor panel, comprising the light-emitting panel according to claim 12,
wherein the functional element includes a sensor element.

* * * * *